(12) United States Patent
Takahashi et al.

(10) Patent No.: US 12,016,236 B2
(45) Date of Patent: Jun. 18, 2024

(54) DISPLAY MODULE AND ELECTRONIC DEVICE

(71) Applicant: SEMICONDUCTOR ENERGY LABORATORY CO., LTD., Atsugi (JP)

(72) Inventors: Kei Takahashi, Kanagawa (JP); Hidetomo Kobayashi, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 253 days.

(21) Appl. No.: 17/439,880

(22) PCT Filed: Sep. 23, 2020

(86) PCT No.: PCT/IB2020/058859
§ 371 (c)(1),
(2) Date: Sep. 16, 2021

(87) PCT Pub. No.: WO2021/064518
PCT Pub. Date: Apr. 8, 2021

(65) Prior Publication Data
US 2022/0352265 A1    Nov. 3, 2022

(30) Foreign Application Priority Data

Oct. 4, 2019   (JP) ................................ 2019-183999

(51) Int. Cl.
*H01L 23/00*     (2006.01)
*G06F 1/16*      (2006.01)
(Continued)

(52) U.S. Cl.
CPC ........... *H10K 59/60* (2023.02); *G06F 1/1652* (2013.01); *G06F 1/1684* (2013.01);
(Continued)

(58) Field of Classification Search
CPC ..... H10K 59/60; H10K 59/351; G06F 1/1652
See application file for complete search history.

(56) References Cited

U.S. PATENT DOCUMENTS 7,639,290 B2   12/2009   Higuchi et al.
8,130,125 B2   3/2012    Hoshino
(Continued)

FOREIGN PATENT DOCUMENTS

CN   001816114 A   8/2006
EP     2902891 A   8/2015
(Continued)

OTHER PUBLICATIONS

International Search Report (Application No. PCT/IB2020/058859) dated Dec. 8, 2020.
(Continued)

*Primary Examiner* — Anthony Ho
(74) *Attorney, Agent, or Firm* — Fish & Richardson P.C.

(57) ABSTRACT

Common noise is reduced from light-receiving data. A display module includes a display apparatus and a reading circuit. Each of a first pixel and a second pixel adjacent to each other in the display apparatus includes a light-receiving element and a light-emitting element. The reading circuit includes a differential input circuit. Common noise generated when display data is supplied to a light-emitting element, for example, may affect a first light-receiving signal output by the first pixel and a second light-receiving signal output by the second pixel. A first current is generated using the first light-receiving signal and a ramp signal, and a second current is generated using the second light-receiving signal and a first potential. The differential input circuit is controlled so that the first current and the second current have the same current value, whereby common noise can be removed from the first light-receiving signal.

11 Claims, 20 Drawing Sheets

(51) Int. Cl.
  *H10K 59/35* (2023.01)
  *H10K 59/60* (2023.01)
  *H10K 77/10* (2023.01)
  *G06V 40/13* (2022.01)

(52) U.S. Cl.
  CPC ......... *H10K 59/351* (2023.02); *H10K 77/111* (2023.02); *G06V 40/1318* (2022.01)

(56) References Cited

U.S. PATENT DOCUMENTS

| | | |
|---|---|---|
| 8,902,192 B2 | 12/2014 | Miyamoto et al. |
| 8,942,937 B2 | 1/2015 | Miyamoto et al. |
| 8,976,154 B2 | 3/2015 | Miyamoto et al. |
| 9,006,635 B2 | 4/2015 | Kurokawa et al. |
| 9,013,448 B2 | 4/2015 | Miyamoto et al. |
| 9,030,441 B2 | 5/2015 | Yumoto et al. |
| 9,055,245 B2 | 6/2015 | Kozuma |
| 9,058,085 B2 | 6/2015 | Miyamoto et al. |
| 9,146,632 B2 | 9/2015 | Miyamoto |
| 9,152,286 B2 | 10/2015 | Yumoto et al. |
| 9,354,757 B2 | 5/2016 | Miyamoto et al. |
| 9,454,271 B2 | 9/2016 | Miyamoto et al. |
| 9,465,492 B2 | 10/2016 | Miyamoto et al. |
| 9,501,451 B2 | 11/2016 | Miyamoto |
| 9,563,323 B1 | 2/2017 | Miyamoto |
| 9,830,026 B2 | 11/2017 | Miyamoto et al. |
| 9,898,136 B2 | 2/2018 | Miyamoto et al. |
| 9,946,405 B2 | 4/2018 | Irri et al. |
| 9,953,562 B2 | 4/2018 | Yamashita et al. |
| 9,966,398 B2 | 5/2018 | Nakamura et al. |
| 10,296,157 B2 | 5/2019 | Takahashi et al. |
| 2006/0170795 A1 | 8/2006 | Higuchi et al. |
| 2010/0315540 A1 | 12/2010 | Hoshino |
| 2014/0132541 A1 | 5/2014 | Miyamoto et al. |
| 2014/0218645 A1 | 8/2014 | Miyamoto |
| 2017/0289475 A1 | 10/2017 | Ha et al. |
| 2018/0076256 A1 | 3/2018 | Jiang et al. |
| 2021/0151486 A1 | 5/2021 | Kobayashi et al. |

FOREIGN PATENT DOCUMENTS

| | | |
|---|---|---|
| EP | 2902892 A | 8/2015 |
| EP | 3012724 A | 4/2016 |
| JP | 2006-217245 A | 8/2006 |
| JP | 2010-288218 A | 12/2010 |
| JP | 2011-154154 A | 8/2011 |
| JP | 2011-203659 A | 10/2011 |
| JP | 2013-073985 A | 4/2013 |
| JP | 2014-519063 | 8/2014 |
| KR | 2006-0090151 A | 8/2006 |
| WO | WO-2012/063520 | 5/2012 |
| WO | WO-2012/090537 | 7/2012 |
| WO | WO-2012/176637 | 12/2012 |
| WO | WO-2012/176638 | 12/2012 |
| WO | WO-2012/176639 | 12/2012 |
| WO | WO-2012/176857 | 12/2012 |
| WO | WO-2013/001888 | 1/2013 |
| WO | WO-2013/001889 | 1/2013 |
| WO | WO-2013/001920 | 1/2013 |
| WO | WO-2013/001921 | 1/2013 |
| WO | WO-2013/001954 | 1/2013 |
| WO | WO-2013/001996 | 1/2013 |
| WO | WO-2013/035370 | 3/2013 |
| WO | WO-2013/073438 | 5/2013 |
| WO | WO-2013/103022 | 7/2013 |

OTHER PUBLICATIONS

Written Opinion (Application No. PCT/IB2020/058859) dated Dec. 8, 2020.

Hamaguchi.M et al., "A 240Hz-Reporting-Rate 143×81 Mutual-Capacitance Touch-Sensing Analog Front-End IC With 37dB SNR for 1mm-Diameter Stylus", ISSCC 2014 (Digest of Technical Papers. IEEE International Solid-State Circuits Conference), Feb. 11, 2014, pp. 214-216.

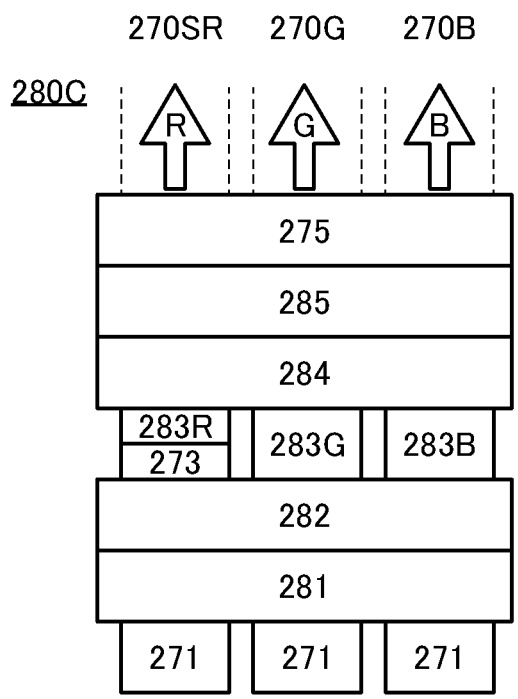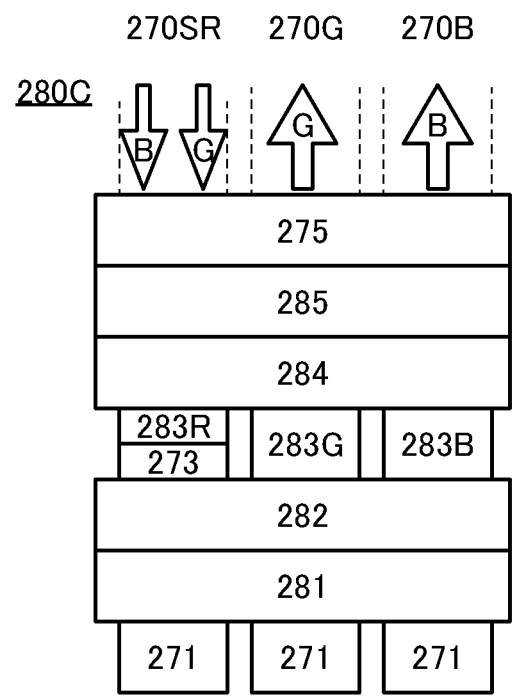

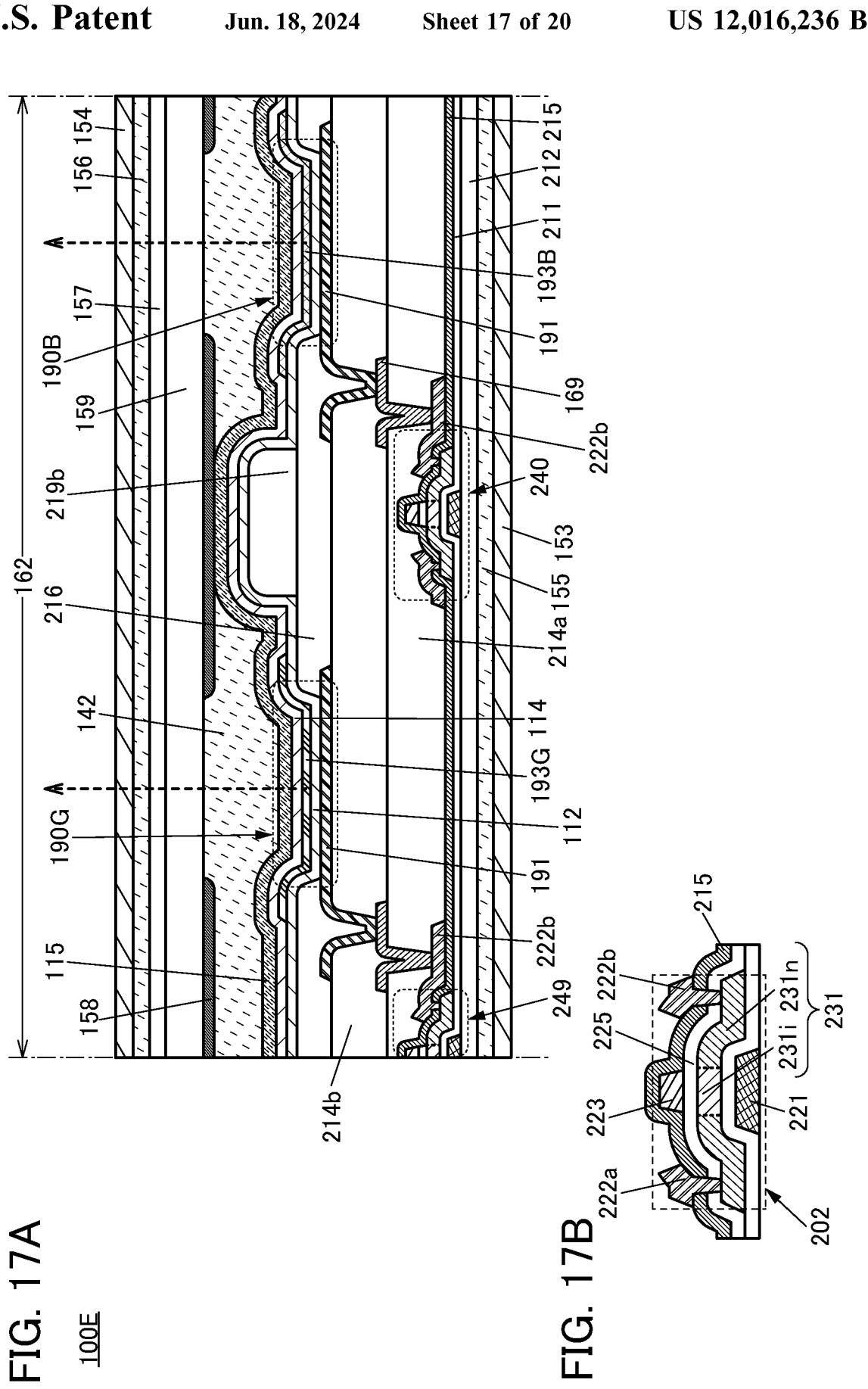

DISPLAY MODULE AND ELECTRONIC DEVICE

CROSS REFERENCE TO RELATED APPLICATIONS

This application is a U.S. National Phase Application under 35 U.S.C. § 371 of International Application PCT/IB2020/058859, filed on Sep. 23, 2020, which is incorporated by reference and claims the benefit of a foreign priority application filed in Japan on Oct. 4, 2019, as Application No. 2019-183999.

TECHNICAL FIELD

One embodiment of the present invention relates to a display module. One embodiment of the present invention relates to a display apparatus including a light-receiving device (also referred to as a light-receiving element) and a light-emitting device (also referred to as a light-emitting element). Another embodiment of the present invention relates to a display apparatus including a light-emitting and light-receiving device (also referred to as a light-emitting and light-receiving element) and a light-emitting device. Another embodiment of the present invention relates to a reading circuit that reads a light-receiving signal from a light-receiving device or a light-emitting and light-receiving device. Another embodiment of the present invention relates to a noise removal circuit that reduces common noise from a light-receiving signal and extracts light-receiving data.

Note that one embodiment of the present invention is not limited to the above technical field. Examples of the technical field of one embodiment of the present invention include a semiconductor device, a display apparatus, a light-emitting apparatus, a power storage device, a memory device, an electronic device, a lighting device, an input device (e.g., a touch sensor), an input/output device (e.g., a touch panel), a driving method thereof, and a manufacturing method thereof.

BACKGROUND ART

In recent years, application of display apparatuses to a variety of uses has been discussed. Examples of uses for a large display apparatus include digital signage, a PID (Public Information Display), and a television device for home use (also referred to as a TV or a television receiver). In addition, a smartphone and a tablet terminal including a touch panel are being developed as portable information terminals.

For example, in order to limit the use of a portable information terminal and the like, fingerprint authentication, face authentication, or the like using an individual feature is used. A variety of methods have been proposed for fingerprint authentication. An example of the methods is an optical authentication method in which an object is irradiated with light from a light source and reflected light thereof is detected by a light-receiving element to recognize the object. Patent Document 1 discloses a counter circuit that quantizes a signal detected by a light-receiving element.

REFERENCE

Patent Document

[Patent Document 1] Japanese Published Patent Application No. 2010-288218

SUMMARY OF THE INVENTION

Problems to be Solved by the Invention

An object of one embodiment of the present invention is to provide a reading circuit that reads a light-receiving signal from a display apparatus having a light-receiving function. An object of one embodiment of the present invention is to provide a noise removal circuit that reduces common noise from a light-receiving signal. An object of one embodiment of the present invention is to provide a novel display module.

Note that the description of these objects does not preclude the existence of other objects. One embodiment of the present invention does not need to achieve all the objects. Other objects can be derived from the description of the specification, the drawings, and the claims.

Means for Solving the Problems

One embodiment of the present invention is a display module including a display apparatus and a reading circuit. The display apparatus includes a first pixel and a second pixel adjacent to each other, and each of the first pixel and the second pixel includes a light-receiving element. The reading circuit includes a differential input circuit. A ramp signal and a first potential are supplied to the reading circuit. The differential input circuit is controlled so that a first current and a second current have the same current value. The first current is generated using a first light-receiving signal and the ramp signal, and the second current is generated using a second light-receiving signal and the first potential.

One embodiment of the present invention is a display module including a display apparatus and a reading circuit. The display apparatus includes a first pixel and a second pixel adjacent to each other. The first pixel includes a first subpixel and a second subpixel, and the second pixel includes a third subpixel and a fourth subpixel. Each of the first subpixel and the third subpixel includes a light-receiving element, and each of the second subpixel and the fourth subpixel includes a light-emitting element. The reading circuit includes a differential input circuit. A ramp signal and a first potential are supplied to the reading circuit. The differential input circuit is controlled so that a first current and a second current have the same value. The first current is generated using a first light-receiving signal and the ramp signal, and the second current is generated using a second light-receiving signal and the first potential.

The differential input circuit is controlled so that the first current is the same as the second current, whereby common noise can be removed from the first light-receiving signal.

In the above structure, the light-emitting element preferably includes a first pixel electrode, a first active layer, and a common electrode, and the first active layer preferably includes a first organic compound. The light-receiving element preferably includes a second pixel electrode, a second active layer, and the common electrode, and the second active layer preferably includes a second organic compound.

In the above structure, the display apparatus preferably includes a transistor, and the transistor preferably includes a metal oxide in a semiconductor layer. The transistor preferably includes a back gate.

In the above structure, the display apparatus preferably has flexibility.

One embodiment of the present invention is an electronic device including the above-described display module and at least one of an antenna, a battery, a housing, a camera, a speaker, a microphone, and an operation button.

Effect of the Invention

One embodiment of the present invention can provide a reading circuit that reads a light-receiving signal from a display apparatus having a light-receiving function. One embodiment of the present invention can provide a noise removal circuit that reduces common noise from a light-receiving signal. One embodiment of the present invention can provide a novel display module.

Note that the description of these effects does not preclude the existence of other effects. One embodiment of the present invention does not need to have all these effects. Other effects can be derived from the description of the specification, the drawings, and the claims.

BRIEF DESCRIPTION OF THE DRAWINGS

FIG. 11A and FIG. 11B are cross-sectional views showing an example of a display apparatus.

FIG. 17A is a cross-sectional view showing an example of a display apparatus. FIG. 17B is a cross-sectional view showing an example of a transistor.

MODE FOR CARRYING OUT THE INVENTION

Figure 1:
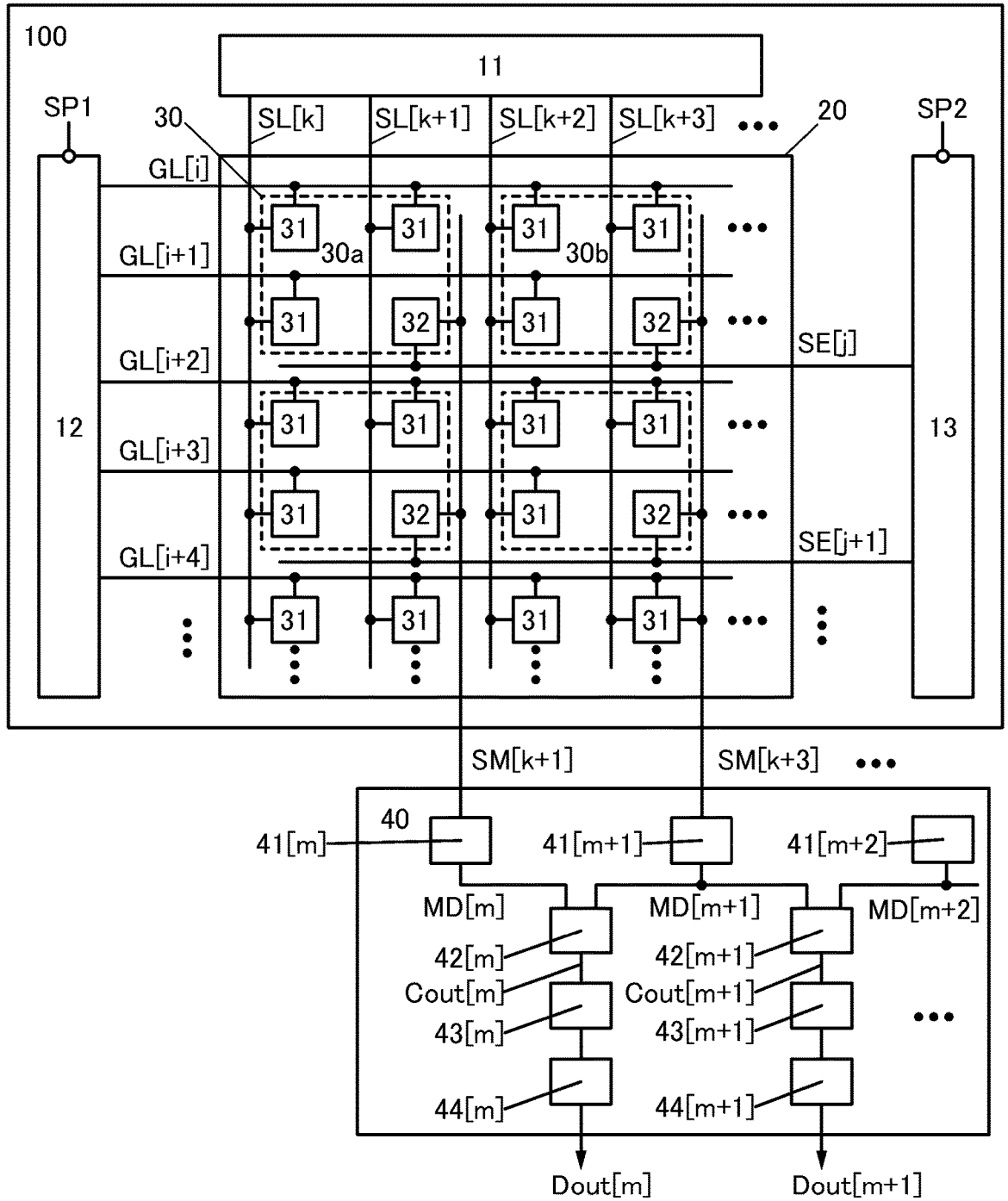
FIG. 1 is a block diagram illustrating an example of a display module.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments.

Note that in structures of the invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

In addition, the position, size, range, or the like of each structure shown in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be changed into the term "conductive film". As another example, the term "insulating film" can be changed into the term "insulating layer".

Embodiment 1

In this embodiment, a display module of one embodiment of the present invention is described.

The display module of one embodiment of the present invention includes a display apparatus and a reading circuit. The display apparatus includes a pixel region, a first gate driver, a second gate driver, and a source driver. The pixel region includes a plurality of pixels. Note that in this embodiment, description is made using a first pixel and a second pixel which are adjacent to each other along the same wiring, for simplicity of description.

The first pixel includes a first subpixel and a second subpixel, and the second pixel includes a third subpixel and a fourth subpixel. The first subpixel and the third subpixel each include a light-receiving element, and the second subpixel and the fourth subpixel each include a light-emitting element.

The light-emitting element and the light-receiving element of one embodiment of the present invention preferably include a common electrode. For example, it is preferable that the light-emitting element include a first pixel electrode, a first active layer, and a common electrode, and the first active layer contain a first organic compound. It is preferable that the light-receiving element include a second pixel electrode, a second active layer, and the common electrode, and the second active layer contain a second organic compound. In this case, the first active layer functions as a light-emitting layer, and the second active layer functions as a photoelectric conversion layer. In the display apparatus of one embodiment of the present invention, the light-emitting element and the light-receiving element can be manufactured through the same process. Note that the light-emitting element does not necessarily share the common electrode with the light-receiving element.

Here, common noise in the display apparatus is described. Common noise is an electrical noise that overlaps with a first light-receiving signal output from the first subpixel and a second light-receiving signal output from the third subpixel (hereinafter collectively referred to as a "light-receiving signal" in some cases). The common noise is generated by a signal supplied to a signal line, a scan line, or the like connected to the second subpixel and the fourth subpixel, a current flowing through a cathode electrode or the like commonly connected to display elements, or the like when an image signal is supplied to the light-emitting elements included in the second subpixel and the fourth subpixel. Accordingly, the light-receiving signal is most likely to be affected by the common noise in a period during which the image signal is supplied to the light-emitting elements.

The reading circuit includes a CDS (Correlated Double Sampling) circuit, a noise removal circuit, a counter circuit, a latch circuit, and the like. The noise removal circuit includes a differential input circuit.

As an example, the case where the CDS circuit reads a light-receiving signal from the first subpixel is described. The CDS circuit can read a detection signal including an offset component from the first subpixel. Furthermore, the offset component can be extracted by reading an initialization signal from the first subpixel. By extraction of a difference between the detection signal and the initialization signal, the offset component is canceled, and thus the first light-receiving signal can be extracted. However, at this time, the common noise is included in the first light-receiving signal without being removed.

Note that the offset component refers to a component due to a variation in transistors used in a pixel and the like, parasitic capacitance included in a wiring, or the like. The detection signal refers to a signal that changes in accordance with the amount of light received by the light-receiving element that functions as a photoelectric conversion element. The initialization signal refers to a signal that supplies a reset signal to a pixel and does not change in accordance with the amount of light received by the light-receiving element.

The noise removal circuit has a function of removing the common noise from the light-receiving signal. The noise removal circuit includes a comparison circuit, and the comparison circuit includes a differential input circuit. The differential input circuit preferably includes two or more inputs. Note that the use of the comparison circuit and the counter circuit can form a single slope A/D converter circuit. A ramp signal and a first potential are preferably supplied to the noise removal circuit. As an example, the noise removal circuit uses the first light-receiving signal generated from the first subpixel and the second light-receiving signal generated from the third subpixel. A first current is generated using the first light-receiving signal and the ramp signal, and a second current is generated using the second light-receiving signal and the first potential. The differential input circuit is controlled so that the first current is the same as the second current, whereby the common noise can be removed from the first light-receiving signal. Here, the ramp signal is a signal whose level of voltage changes over time.

Next, the display module described in one embodiment of the present invention is described with reference to FIG. 1 to FIG. 7. FIG. 1 is a block diagram illustrating an example of the display module.

A display module 10 includes a display apparatus 100 and a reading circuit 40. The display apparatus 100 includes a pixel region 20, a source driver 11, a gate driver 12, a gate driver 13, a plurality of wirings SL, a plurality of wirings GL, a plurality of wirings SE, and a plurality of wirings SM. The pixel region 20 includes a plurality of pixels 30. Note that in this embodiment, for simplicity of description, description is made using a pixel 30a and a pixel 30b adjacent to each other in some cases.

The pixel 30 includes a plurality of subpixels 31 and one or more subpixels 32. The subpixel 31 includes a light-emitting element, and the subpixel 32 includes a light-receiving element. Note that the plurality of subpixels 31 preferably exhibit light with different chromaticity. For example, one pixel 30 preferably includes a subpixel 31R that exhibits red light, a subpixel 31G that exhibits green light, a subpixel 31B that exhibits blue light, and the like. In the case where the subpixel 32 includes a plurality of light-receiving elements, the light-receiving elements preferably receive light having different peak wavelengths. For example, in the case where the subpixel 32 includes two light-receiving elements, one of them can receive light having a peak wavelength of visible light, and the other can receive infrared light. Note that the pixel 30 is described in detail in FIG. 2 and Embodiment 2.

The source driver 11 can supply image data (an image signal) to the subpixel 31. The gate driver 12 can output a scan signal for selecting the subpixel 31 to the wiring GL. The gate driver 13 can output a scan signal for selecting the subpixel 32 to the wiring SE. The scan signal output to the wiring GL is generated from a signal SP1 supplied to the gate driver 12. The scan signal output to the wiring SE is generated from a signal SP2 supplied to the gate driver 13.

The reading circuit 40 includes a plurality of CDS circuits 41, a plurality of noise removal circuits 42, a plurality of counter circuits 43, and a plurality of latch circuits 44. Note that part of the reading circuit 40 may be included in the display apparatus 100. For example, when the CDS circuit 41 is included in the display apparatus 100, parasitic capacitance generated in the wiring SM connected to the CDS circuit 41 can be reduced. The noise removal circuit 42 includes the differential input circuit. Note that the ramp signal and the first potential are preferably supplied to the noise removal circuit 42.

Next, an electrical connection in the reading circuit 40 is described. As an example, a CDS circuit 41[$m$] is electrically connected to the subpixel 32 included in the pixel 30a through a wiring SM[$k$+1]. A CDS circuit 41[$m$+1] is electrically connected to the subpixel 32 included in the pixel 30b through a wiring SM[$k$+3]. A noise removal circuit 42[$m$] is electrically connected to the CDS circuit 41[$m$] through a wiring MD[$m$] and electrically connected to the CDS circuit 41[$m$+1] through a wiring MD[$m$+1]. The noise removal circuit 42[$m$] is electrically connected to a counter circuit 43[$m$]. The counter circuit 43[$m$] is electrically connected to a latch circuit 44[$m$]. Note that i, j, k, and m are each a positive integer.

The subpixel 32 included in the pixel 30a and the subpixel 32 included in the pixel 30b are selected by a selection signal supplied to the wiring SEW. Thus, the selection signal is supplied to the wiring SEW, whereby the CDS circuit 41[$m$] and the CDS circuit 41[$m$+1] are supplied with light-receiving signals from the subpixels 32 included in the pixel 30a and the pixel 30b.

As an example, the CDS circuit 41[$m$] can remove an offset component due to a variation in elements included in the subpixel 32 included in the pixel 30a, parasitic capacitance included in the wiring SM[$k$+1], or the like. In the case where the CDS circuit 41[$m$] reads the light-receiving signal from the subpixel 32, the CDS circuit 41[$m$] can read a detection signal including an offset component from the subpixel 32. Furthermore, when an initialization signal is read from the subpixel 32, the offset component can be extracted. A difference between the detection signal and the initialization signal is extracted, whereby the offset component can be canceled, and the light-receiving signal can be extracted. Note that the detection signal and the initialization signal include common noise; therefore, the light-receiving signal includes common noise.

The noise removal circuit 42 has a function of removing common noise from the light-receiving signal. The noise removal circuit 42 includes a comparison circuit, and the comparison circuit includes a differential input circuit. Note that the ramp signal and the first potential are supplied to the noise removal circuit 42. As an example, the noise removal circuit 42 uses the first light-receiving signal supplied from the CDS circuit 41[*m*] and the second light-receiving signal supplied from the CDS circuit 41[*m*+1]. In the comparison circuit, the first current is generated using the first light-receiving signal and the ramp signal, and the second current is generated using the second light-receiving signal and the first potential. The differential input circuit is controlled so that the first current and the second current have the same current value, whereby the common noise can be removed from the first light-receiving signal.

The first light-receiving signal from which the common noise is removed is supplied to the counter circuit 43 as a signal Cout. The signal Cout is quantized by the counter circuit 43 and converted into data Dout. The data Dout can be treated easily in a processor (not illustrated), a control circuit (not illustrated), a video processing device (not illustrated), or the like. Note that in one embodiment of the present invention, the details of the counter circuit 43 and the latch circuit 44 are omitted.

[Pixel]

The pixel included in the display apparatus of one embodiment of the present invention is described. The display apparatus includes a plurality of pixels arranged in a matrix. One pixel includes a plurality of subpixels. One subpixel includes one light-emitting element, one light-emitting and light-receiving element, or one light-receiving element.

The plurality of pixels each include one or more of a subpixel including a light-emitting element, a subpixel including a light-receiving element, and a subpixel including a light-emitting and light-receiving element.

For example, the pixel includes a plurality of (e.g., three or four) subpixels each including a light-emitting element and one subpixel including a light-receiving element.

Note that the light-receiving element may be provided in all the pixels or may be provided in some of the pixels. In addition, one pixel may include a plurality of light-receiving elements. One light-receiving element may be provided across a plurality of pixels. The resolution of the light-receiving element may be different from the resolution of the light-emitting element.

In the case where the pixel includes three subpixels each including a light-emitting element, as the three subpixels, subpixels of three colors of RGB, subpixels of three colors of yellow (Y), cyan (C), and magenta (M), and the like can be given. In the case where the pixel includes four subpixels each including a light-emitting element, as the four subpixels, subpixels of four colors of R, G, B, and white (W), subpixels of four colors of R, G, B, and Y, and the like can be given.

Figure 2A:
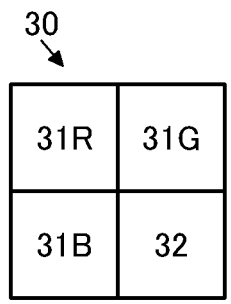
FIG. 2A to FIG. 2D are top views showing examples of a pixel.
Figure 2B:
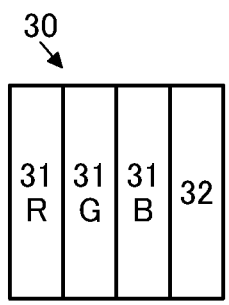
Figure 2C:
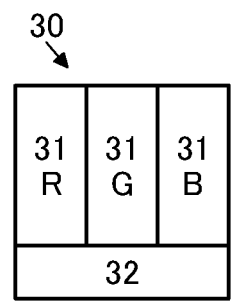

FIG. 2A to FIG. 2C each show an example in which the pixel 30 includes a subpixel 31R, a subpixel 31G, and a subpixel 31B each including a light-emitting element, and one subpixel 32 including a light-receiving element. Note that the arrangement of subpixels shown in this embodiment is not limited to the illustrated order. For example, the positions of the subpixel 31B and the subpixel 31G may be reversed.

Each of the pixels 30 shown in FIG. 2A to FIG. 2C includes the subpixel 32 having a light-receiving function, the subpixel 31R that exhibits red light, the subpixel 31G that exhibits green light, and the subpixel 31B that exhibits blue light.

Matrix arrangement is applied to the pixel shown in FIG. 2A, and stripe arrangement is applied to the pixel shown in FIG. 2B. FIG. 2C shows an example in which the subpixel 31R that exhibits red light, the subpixel 31G that exhibits green light, and the subpixel 31B that exhibits blue light are arranged laterally in one row and the subpixel 32 having a light-receiving function is arranged thereunder. In other words, in FIG. 2C, the subpixel 31R, the subpixel 31G, and the subpixel 31B are arranged in the same row, which is different from the row in which the subpixel 32 is provided.

Figure 2D:
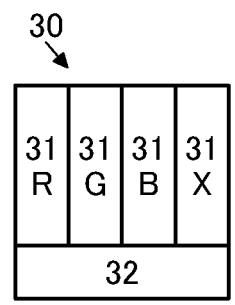

The pixel shown in FIG. 2D includes a subpixel 31X that exhibits light of a color other than RGB, in addition to the components of the pixel shown in FIG. 2C. The light of a color other than RGB can be white (W) light, yellow (Y) light, cyan (C) light, magenta (M) light, infrared light (IR), or the like. In the case where the subpixel 31X exhibits infrared light, the subpixel 32 having a light-receiving function preferably has a function of detecting infrared light. The subpixel 32 having a light-receiving function may have a function of detecting both visible light and infrared light. The wavelength of light detected by the light-receiving element can be determined depending on the application of a sensor.

Alternatively, for example, the pixel includes a subpixel 31W including a light-emitting element that exhibits white light and the plurality of subpixels 32 including light-receiving elements that receive light in different wavelength regions.

Alternatively, for example, the pixel includes a plurality of subpixels each including a light-emitting element and one subpixel including a light-emitting and light-receiving element.

The display apparatus including the light-emitting and light-receiving element has no need to change the pixel arrangement when incorporating a light-receiving function into pixels; thus, a display portion can be provided with one or both of an image capturing function and a sensing function without reductions in aperture ratio and resolution.

Note that the light-emitting and light-receiving element may be provided in all the pixels or may be provided in some of the pixels. In addition, one pixel may include a plurality of light-emitting and light-receiving elements.

[Example of Pixel Circuit]

The display apparatus of one embodiment of the present invention includes, in the display portion, first pixel circuits each including a light-receiving element and second pixel circuits each including a light-emitting element. The first pixel circuits and the second pixel circuits are each arranged in a matrix. The first pixel circuit corresponds to the subpixel 32 in FIG. 1, and the second pixel circuit corresponds to the subpixel 31 in FIG. 1.

Figure 2E:
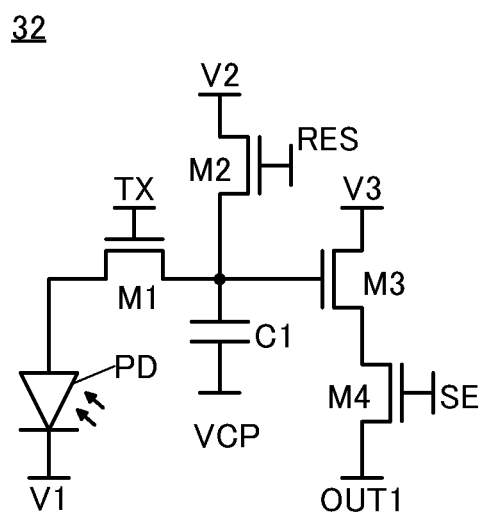
FIG. 2E and FIG. 2F are circuit diagrams showing examples of a pixel circuit.
Figure 2F:
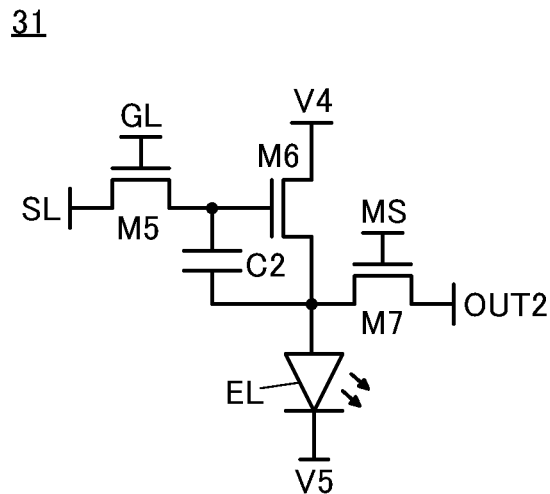

FIG. 2E shows an example of the first pixel circuit including a light-receiving element. FIG. 2F shows an example of the second pixel circuit including a light-emitting element.

The first pixel circuit shown in FIG. 2E includes a light-receiving element PD, a transistor M1, a transistor M2, a transistor M3, a transistor M4, and a capacitor C1. Here, an example in which a photodiode is used as the light-receiving element PD is shown.

A cathode of the light-receiving element PD is electrically connected to a wiring V1, and an anode thereof is electrically connected to one of a source and a drain of the transistor M1. A gate of the transistor M1 is electrically connected to a wiring TX, and the other of the source and the drain is electrically connected to one electrode of the capacitor C1, one of a source and a drain of the transistor M2, and a gate of the transistor M3. A gate of the transistor M2 is electrically connected to a wiring RES, and the other of the source and the drain thereof is electrically connected to a wiring V2. One of a source and a drain of the transistor M3 is electrically connected to a wiring V3, and the other of the source and the drain thereof is electrically connected to one of a source and a drain of the transistor M4. A gate of the transistor M4 is electrically connected to a wiring SE, and the other of the source and the drain thereof is electrically connected to a wiring OUT1. The other electrode of the capacitor C1 is electrically connected to a wiring VCP. Alternatively, the other electrode of the capacitor C1 may be electrically connected to the wiring V3.

A constant potential is supplied to the wiring V1, the wiring V2, and the wiring V3. When the light-receiving element PD is driven with a reverse bias, a potential lower than the potential of the wiring V1 is supplied to the wiring V2. The transistor M2 is controlled by a signal supplied to the wiring RES and has a function of resetting the potential of a node connected to the gate of the transistor M3 to a potential supplied to the wiring V2. The transistor M1 is controlled by a signal supplied to the wiring TX and has a function of controlling the timing at which the potential of the node changes, in accordance with a current flowing through the light-receiving element PD. The transistor M3 functions as an amplifier transistor for performing output in response to the potential of the node. The transistor M4 is controlled by a signal supplied to the wiring SE and functions as a selection transistor for reading an output corresponding to the potential of the node by an external circuit connected to the wiring OUT1.

The second pixel circuit shown in FIG. 2F includes a light-emitting element EL, a transistor M5, a transistor M6, a transistor M7, and a capacitor C2. Here, an example in which a light-emitting diode is used as the light-emitting element EL is shown. In particular, an organic EL element is preferably used as the light-emitting element EL.

A gate of the transistor M5 is electrically connected to the wiring GL, one of a source and a drain thereof is electrically connected to the wiring SL, and the other of the source and the drain is electrically connected to one electrode of the capacitor C2 and a gate of the transistor M6. One of a source and a drain of the transistor M6 is electrically connected to a wiring V4, and the other thereof is electrically connected to an anode of the light-emitting element EL and one of a source and a drain of the transistor M7. A gate of the transistor M7 is electrically connected to a wiring MS, and the other of the source and the drain thereof is electrically connected to a wiring OUT2. A cathode of the light-emitting element EL is electrically connected to a wiring V5. The other electrode of the capacitor C2 is electrically connected to the other of the source and the drain of the transistor M6.

A constant potential is supplied to the wiring V4 and the wiring V5. In the light-emitting element EL, the anode side can have a high potential and the cathode side can have a lower potential than the anode side. The transistor M5 is controlled by a signal supplied to the wiring GL and functions as a selection transistor for controlling a selection state of the second pixel circuit. The transistor M6 functions as a driving transistor that controls a current flowing through the light-emitting element EL, in accordance with a potential supplied to the gate. When the transistor M5 is in a conduction state, a potential supplied to the wiring SL is supplied to the gate of the transistor M6, and the emission luminance of the light-emitting element EL can be controlled in accordance with the potential. The transistor M7 is controlled by a signal supplied to the wiring MS and has a function of outputting a potential between the transistor M6 and the light-emitting element EL to the outside through the wiring OUT2.

The wiring V1, to which the cathode of the light-receiving element PD is electrically connected, and the wiring V5, to which the cathode of the light-emitting element EL is electrically connected, can be provided in the same layer and have the same level of potential.

In the display apparatus of one embodiment of the present invention, it is preferable to use transistors including a metal oxide (also referred to as an oxide semiconductor) in their semiconductor layers where channels are formed (such transistors are also referred to as OS transistors below) as all the transistors included in the first pixel circuit and the second pixel circuit. An OS transistor has an extremely low off-state current and enables charge stored in a capacitor that is series-connected to the transistor to be retained for a long time. Furthermore, power consumption of the display apparatus can be reduced with an OS transistor.

Alternatively, in the display apparatus of one embodiment of the present invention, it is preferable to use transistors including silicon in their semiconductor layers where channels are formed (such transistors are also referred to as Si transistors below) as all the transistors included in the first pixel circuit and the second pixel circuit. As silicon, single crystal silicon, polycrystalline silicon, amorphous silicon, and the like can be given. It is particularly preferable to use transistors including low-temperature polysilicon (LTPS) (hereinafter also referred to as LTPS transistors) in their semiconductor layers. An LTPS transistor has high field-effect mobility and can operate at high speed.

With the use of Si transistors such as LTPS transistors, a variety of circuits formed using a CMOS circuit and a display portion can be easily formed on the same substrate. Thus, external circuits mounted on the display apparatus can be simplified, and costs of parts and mounting costs can be reduced.

In the display apparatus of one embodiment of the present invention, two kinds of transistors are preferably used in the first pixel circuit. Specifically, the first pixel circuit preferably includes an OS transistor and an LTPS transistor. Changing the material of the semiconductor layer depending on the desired function of the transistor can increase the quality of the first pixel circuit and the accuracy of sensing and image capturing. In that case, in the second pixel circuit, one or both of an OS transistor and an LTPS transistor may be used.

Furthermore, even when two kinds of transistors (e.g., OS transistors and LTPS transistors) are used in the pixels, using the LTPS transistors facilitates formation of a variety of circuits formed using a CMOS circuit and a display portion on the same substrate. Thus, external circuits mounted on the display apparatus can be simplified, and costs of parts and mounting costs can be reduced.

A transistor using a metal oxide having a wider band gap and a lower carrier density than silicon can achieve an extremely low off-state current. Thus, such a low off-state current enables retention of charges accumulated in a capacitor that is connected in series with the transistor for a long time. Therefore, it is particularly preferable to use OS transistors as the transistor M1, the transistor M2, and the transistor M5 each of which is connected in series with the capacitor C1 or the capacitor C2.

An Si transistor is preferably used as the transistor M3. This enables high-speed reading operation of imaging data.

Note that the display apparatus which includes, in the display portion, the first pixel circuits each including a light-receiving element and the second pixel circuits each including a light-emitting element can be driven in any of an image display mode, an image capture mode, and a mode of simultaneously performing image display and image capturing. In the image display mode, a full-color image can be displayed using the light-emitting element, for example. In the image capture mode, an image for image capturing (e.g., a green monochromatic image or a blue monochromatic image) can be displayed using the light-emitting element and image capturing can be performed using the light-receiving element, for example. Fingerprint identification can be performed in the image capture mode, for example. In the mode of simultaneously performing image display and image capturing, an image for image capturing can be displayed using the light-emitting element and image capturing can be performed using the light-receiving element in some pixels, and a full-color image can be displayed using the light-emitting element in the other pixels, for example.

Note that although n-channel transistors are shown as the transistors in FIG. 2E and FIG. 2F, p-channel transistors can also be used. The transistors are not limited to single-gate transistors and may further include a back gate.

One or more layers including one or both of the transistor and the capacitor are preferably provided to overlap with the light-receiving element PD or the light-emitting element EL. Thus, the effective area of each pixel circuit can be reduced, and a high-definition display portion can be achieved.

Figure 3:
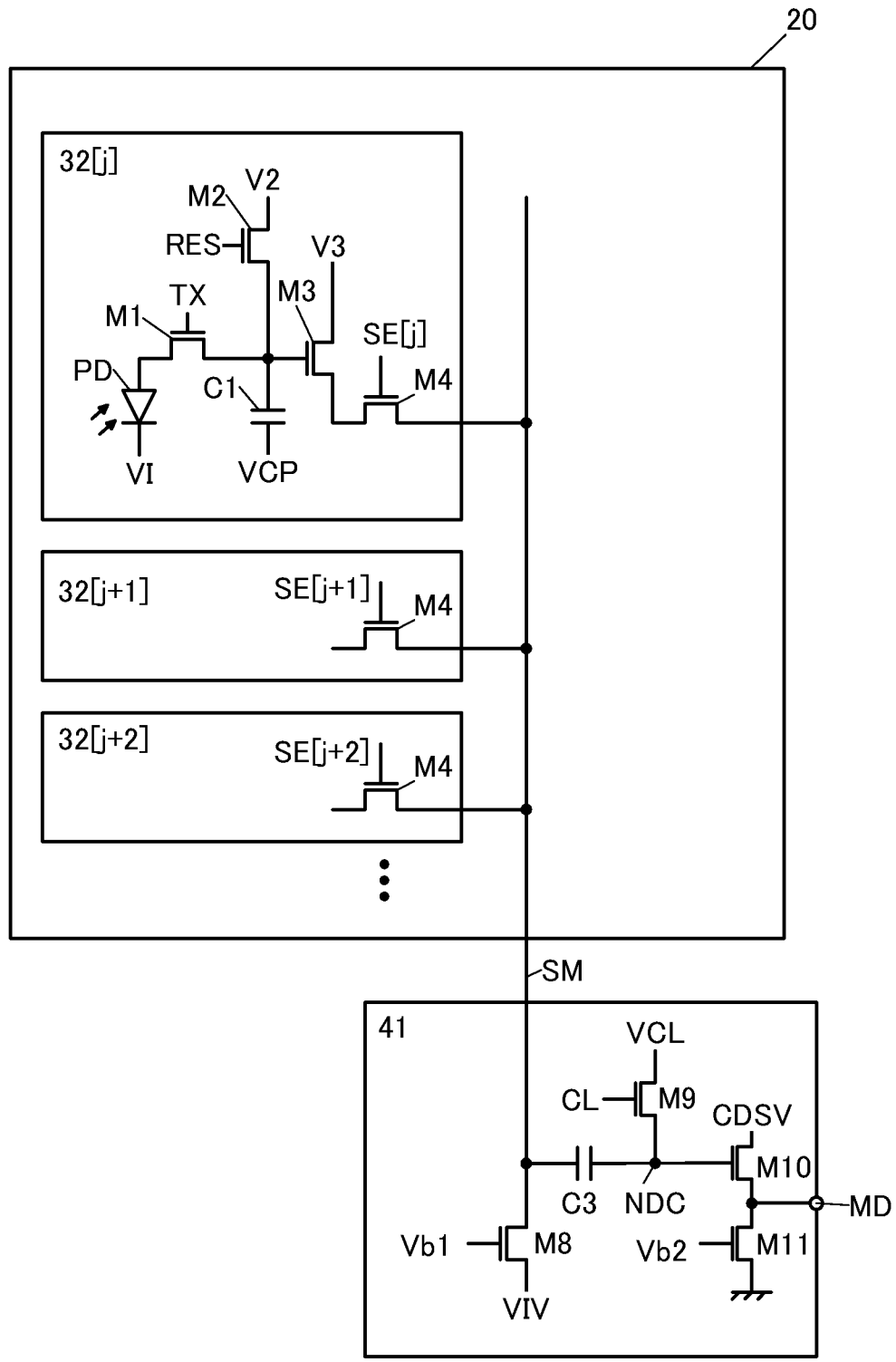
FIG. 3 is a block diagram illustrating an example of a display module.

FIG. 3 is a circuit diagram illustrating the CDS circuit 41. The CDS circuit 41 is electrically connected to a subpixel 32[$j$], a subpixel 32[$j$+1], a subpixel 32[$j$+2], and the like through the wiring SM. The CDS circuit 41 includes a transistor M8 to a transistor M11 and a capacitor C3. The above (e.g., FIG. 2E) can be referred to for the description of the subpixel 32, and thus, the description is omitted.

The other of the source and the drain of the transistor M4 included in the subpixel 32 is electrically connected to one of a source and a drain of the transistor M8 through the wiring SM and one electrode of the capacitor C3. The other of the source and the drain of the transistor M8 is electrically connected to a wiring VIV. A gate of the transistor M8 is electrically connected to a wiring Vb1. The other electrode of the capacitor C3 is electrically connected to one of a source and a drain of the transistor M9 and a gate of the transistor M10. The other of the source and the drain of the transistor M9 is electrically connected to a wiring VCL. A gate of the transistor M9 is electrically connected to a wiring CL. One of a source and a drain of the transistor M10 is electrically connected to a wiring CDSV. The other of the source and the drain of the transistor M10 is electrically connected to one of a source and a drain of the transistor M11 and the wiring MD. A gate of the transistor M11 is electrically connected to a wiring Vb2. The other of the source and the drain of the transistor M11 is electrically connected to a GND wiring.

A first bias potential supplied to the wiring Vb1 is supplied to the gate of the transistor M8, and a second bias potential supplied to the wiring Vb2 is supplied to the gate of the transistor M11. The transistor M9 can initialize a node NDC formed by the capacitor C3 and the gate of the transistor M9 with a second initialization potential supplied to the wiring VCL.

Next, operation of reading a light-receiving signal from the subpixel 32[$j$] by the CDS circuit 41 is described as an example. First, a method in which the subpixel 32[$j$] outputs a light-receiving signal is described.

A case where the subpixel 32[$j$] outputs an initialization signal of the subpixel 32[$j$] is described. The transistor M1 is brought into an off state by supply of a signal to the wiring TX. Next, the transistor M2 is brought into an on state by supply of a signal to the wiring RES. A first initialization potential of the subpixel 32[$j$] is supplied to the one electrode of the capacitor C1 and the gate of the transistor M3 through the wiring V2. Next, the transistor M4 is brought into an on state by supply of a signal to the wiring SEW. Accordingly, the transistor M3 can output a current corresponding to the first initialization potential supplied to the gate of the transistor M3, to the CDS circuit 41 through the transistor M4 and the wiring SM.

Next, a case where the subpixel 32[$j$] outputs a signal received by the light-receiving element PD as a detection signal is described. Note that a detection signal output by the subpixel 32[$j$] includes an offset signal. The transistor M1 is brought into an on state by supply of a signal to the wiring TX. The level of a potential of the one electrode of the capacitor C1 changes in accordance with the amount of light received by the light-receiving element PD.

Next, the transistor M4 is brought into an on state by supply of a signal to the wiring SEW. Accordingly, the transistor M3 can output, as a detection signal, a current corresponding to the amount of light received by the light-receiving element PD and supplied to the gate of the transistor M3, to the CDS circuit 41 through the transistor M4 and the wiring SM.

Note that in the case where the transistor M1 to the transistor M4 are n-channel transistors, the transistors are brought into an on state when being supplied with a signal "H". In the case where the transistor M1 to the transistor M4 are p-channel transistors, the transistors are brought into an on state when being supplied with a signal "L".

The CDS circuit 41 forms a first source follower circuit using the transistor M3 included in the subpixel 32[$j$] and the transistor M8 and forms a second source follower circuit using the transistor M10 and the transistor M11. The first source follower circuit supplies, to the capacitor C3, a potential supplied to the gate of the transistor M3, and the second source follower circuit supplies, to the wiring MD, a potential supplied to the gate of the transistor M10. The first source follower circuit is electrically connected to the second source follower circuit through the capacitor C3.

As an example, the transistor M1 is brought into an on state and the transistor M2 is brought into an off state, whereby the subpixel 32[$j$] can output a detection signal. Moreover, the transistor M9 is brought into an on state, whereby the node NDC is supplied with the second initialization potential supplied from the wiring VCL through the transistor M9. Accordingly, a detection signal using the second initialization potential as a reference is retained in the capacitor C3.

Next, the transistor M9 transitions to an off state. When the transistor M9 transitions to an off state, the node NDC is brought into a floating state. After that, the transistor M1 transitions to an off state, and the transistor M2 transitions to an on state. A potential of the gate of the transistor M3 is initialized by the first initialization potential, and the subpixel 32[$j$] supplies an initialization signal to the CDS circuit 41.

Thus, the amount of change from the detection signal to the initialization signal is extracted in the node NDC as a difference. The amount of change is output to the wiring MD through the second source follower circuit. The amount of change is a difference between the detection signal and the initialization signal and thus corresponds to a light-receiving signal from which an offset component included in the subpixel 32[j] is removed.

Accordingly, the CDS circuit 41 can obtain a light-receiving signal by extracting the amount of change from the detection signal to the initialization signal as a difference. Note that the detection signal and the initialization signal include common noise, and thus the light-receiving signal includes common noise. The common noise can be removed by the noise removal circuit 42.

Figure 4A:
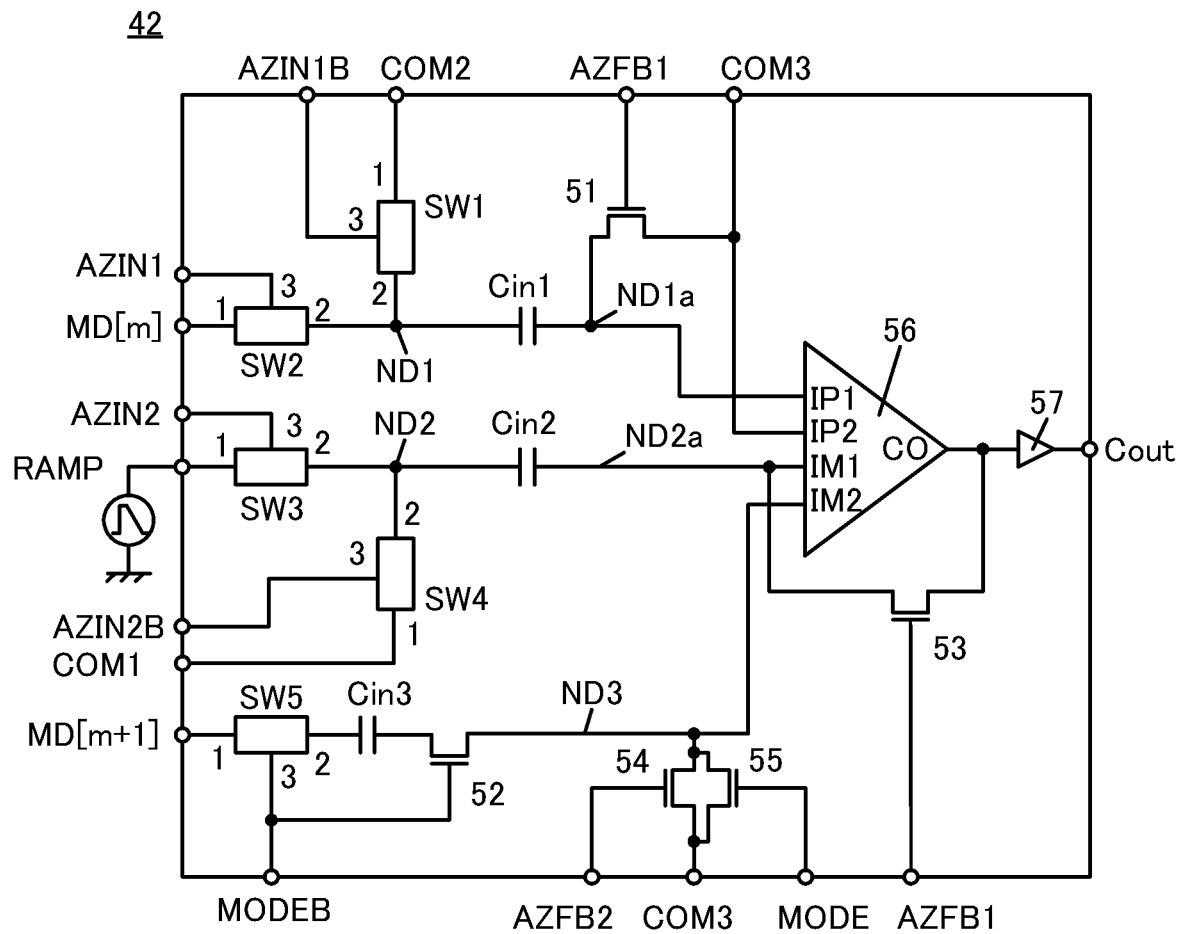
FIG. 4A to FIG. 4C are circuit diagrams illustrating examples of a noise removal circuit.

FIG. 4A is a circuit diagram illustrating an example of the noise removal circuit 42. The noise removal circuit 42 has a function of removing common noise from a light-receiving signal including the common noise. The noise removal circuit 42 includes a switch SW1 to a switch SW5, a capacitor Cin1 to a capacitor Cin3, a transistor 51 to a transistor 55, a comparison circuit 56, and a buffer circuit 57. The comparison circuit 56 includes an input terminal IP1, an input terminal IP2, an input terminal IM1, an input terminal IM2, and an output terminal CO.

Figure 4B:
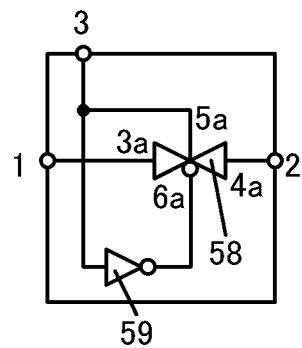
Figure 4C:
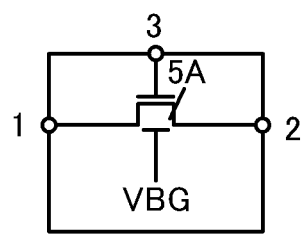

First, examples of switches that can be used as the switch SW1 to the switch SW5 are shown in FIG. 4B and FIG. 4C.

The switch shown in FIG. 4B includes an input/output terminal 1, an input/output terminal 2, an input terminal 3, an analog switch 58, and an inverter circuit 59. The analog switch 58 includes an input/output terminal 3a, an input/output terminal 4a, a control terminal 5a, and a control terminal 6a. The input/output terminal 1 is electrically connected to the input/output terminal 3a. The input/output terminal 2 is electrically connected to the input/output terminal 4a. The input terminal 3 is electrically connected to the control terminal 5a and an input terminal of the inverter circuit 59. An output terminal of the inverter circuit 59 is electrically connected to the control terminal 6a.

The switch shown in FIG. 4C functions as a transfer switch. The switch includes the input/output terminal 1, the input/output terminal 2, the input terminal 3, and an OS transistor 5A. The input/output terminal 1 is electrically connected to one of a source and a drain of the OS transistor 5A. The input/output terminal 2 is electrically connected to the other of the source and the drain of the OS transistor 5A. The input terminal 3 is electrically connected to a gate of the OS transistor 5A. The back gate of the OS transistor 5A is electrically connected to a wiring VBG. Note that the back gate may be electrically connected to the gate. The use of the OS transistor can reduce an off-state current flowing between the input/output terminal 1 and the input/output terminal 2.

Here, the noise removal circuit 42 in FIG. 4A is described again. The noise removal circuit 42[m] shown in FIG. 1 is described below. Accordingly, the CDS circuit 41[m] is electrically connected to the input/output terminal 1 of the switch SW2 through the wiring MD[m]. The CDS circuit 41[m+1] is electrically connected to the input/output terminal 1 of the switch SW5 through the wiring MD[m+1].

The input/output terminal 2 of the switch SW2 is electrically connected to the input/output terminal 2 of the switch SW1 and one electrode of the capacitor Cin1. The input/output terminal 1 of the switch SW1 is electrically connected to a wiring COM2. The input/output terminal 1 of the switch SW3 is electrically connected to a wiring RAMP. The input/output terminal 2 of the switch SW3 is electrically connected to the input/output terminal 2 of the switch SW4 and one electrode of the capacitor Cin2. The input/output terminal 1 of the switch SW4 is electrically connected to a wiring COM1. The input/output terminal 2 of the switch SW5 is electrically connected to one electrode of the capacitor Cin3.

The input terminal 3 of the switch SW1 is electrically connected to a wiring AZIN1B. The input terminal 3 of the switch SW2 is electrically connected to a wiring AZIN1. The input terminal 3 of the switch SW3 is electrically connected to a wiring AZIN2. The input terminal 3 of the switch SW4 is electrically connected to a wiring AZIN2B. The input terminal 3 of the switch SW5 is electrically connected to a wiring MODEB.

The other electrode of the capacitor Cin1 is electrically connected to the input terminal IP1 of the comparison circuit 56 and one of a source and a drain of the transistor 51. The other of the source and the drain of the transistor 51 is electrically connected to the input terminal IP2 of the comparison circuit 56 and a wiring COM3. The other electrode of the capacitor Cin2 is electrically connected to the input terminal IM1 of the comparison circuit 56 and one of a source and a drain of the transistor 53. The other electrode of the capacitor Cin3 is electrically connected to one of a source and a drain of the transistor 52. The other of the source and the drain of the transistor 52 is electrically connected to the input terminal IM2 of the comparison circuit 56, one of a source and a drain of the transistor 54, and one of a source and a drain of the transistor 55. The wiring COM3 is electrically connected to the other of the source and the drain of the transistor 54 and the other of the source and the drain of the transistor 55. The other of the source and the drain of the transistor 53 is electrically connected to the output terminal CO of the comparison circuit 56 and an input terminal of the buffer circuit 57. An output terminal of the buffer circuit 57 is electrically connected to a wiring from which the signal Cout is output.

A gate of the transistor 51 is electrically connected to a wiring AZFB1. The gate of the transistor 52 is electrically connected to the wiring MODEB. A gate of the transistor 53 is electrically connected to the wiring AZFB1. A gate of the transistor 54 is electrically connected to a wiring AZFB2. A gate of the transistor 55 is electrically connected to a wiring MODE.

The node ND1 is formed by connection of the input/output terminal 2 of the switch SW1, the input/output terminal 2 of the switch SW2, and the one electrode of the capacitor Cin1. The node ND1a is formed by connection of the other electrode of the capacitor Cin1, the one of the source and the drain of the transistor 51, and the input terminal IP1 of the comparison circuit 56. The node ND2 is formed by connection of the input/output terminal 2 of the switch SW3, the input/output terminal 2 of the switch SW4, and the one electrode of the capacitor Cin2. The node ND2a is formed by connection of the other electrode of the capacitor Cin2, the one of the source and the drain of the transistor 53, and the input terminal IM1 of the comparison circuit 56. The node ND3 is formed by connection of the other of the source and the drain of the transistor 52, the one of the source and the drain of the transistor 54, the one of the source and the drain of the transistor 55, and the input terminal IM2 of the comparison circuit 56.

Note that a signal supplied to the wiring AZIN1B is an inversion signal of a signal supplied to the wiring AZIN1. A signal supplied to the wiring AZIN2B is an inversion signal of a signal supplied to the wiring AZIN2. A signal supplied to the wiring MODEB is an inversion signal of a signal supplied to the wiring MODE. A signal supplied to the wiring RAMP is a signal whose potential changes from a high potential to a low potential in a specified period. Note that the signal supplied to the wiring RAMP may be changed in a step-like manner or in an analog manner.

Figure 5:
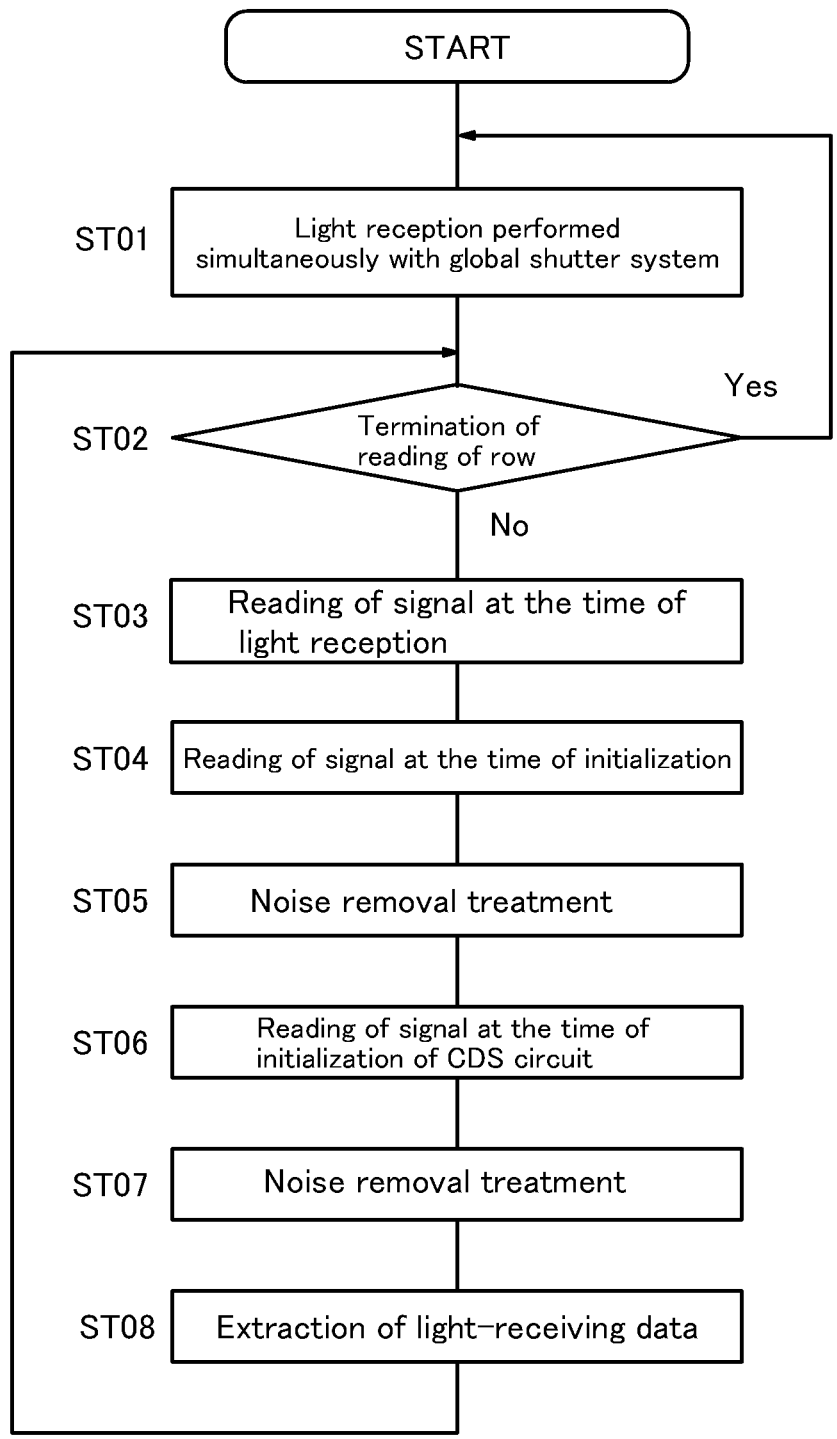
FIG. 5 is a flow chart showing an example of operation of a display module.

Next, the entire operation of the display module is described with reference to FIG. 5. FIG. 5 is a flow chart showing an example of operation of the display module. The flow chart shown in FIG. 5 includes Step ST01 to Step ST08.

Step ST01 is a step in which light reception (image capturing) is performed using the plurality of subpixels 32 included in the display apparatus with a global shutter system. Note that OS transistors can be used as the transistor M1 and the transistor M2 included in the subpixel 32. The use of an OS transistor with a low off-state current can reduce deterioration of a light-receiving signal during a period in which light is received simultaneously by the display module and the light-receiving signal is read by the display module.

Step ST02 is a step of checking whether there is light-receiving data read by the reading circuit 40. In the case where the reading circuit 40 determines that there is no light-receiving data to be read (there is no row to be read, i.e., reading of a row was terminated), the process proceeds to Step ST01 and light-receiving data is obtained again with a global shutter system. In the case where the reading circuit 40 determines that there is data to be read, the process proceeds to Step ST03 and reading is performed.

Step ST03 is a step of performing reading of a signal at the time of light reception (a detection signal). The use of the CDS circuit can remove a variation among transistors used in a pixel and the like and an offset component due to parasitic capacitance included in a wiring or the like. Note that common noise included in the detection signal is not removed.

Step ST04 is a step in which the CDS circuit 41 reads a signal at the time of initialization (initialization signal) row by row. The CDS circuit 41 stores the detection signal at the time of the light reception and then reads the initialization signal to detect the amount of change, and the amount of change is output to the wiring MD as a light-receiving signal.

Step ST05 is a step of performing noise removal treatment. The noise removal circuit 42 can remove common noise included in the light-receiving signal. The light-receiving signal from which the common noise is removed is quantized using the counter circuit 43 and converted into first light-receiving data.

Step ST06 is a step of reading a signal in a period during which the second initialization potential is supplied to the CDS circuit 41 through the transistor M9. An offset component included in the CDS circuit 41 is output to the wiring MD as a CDS offset signal.

Step ST07 is a step of performing noise removal treatment of the CDS offset signal. The CDS offset signal is quantized using the counter circuit 43 and converted into CDS offset data.

Step ST08 is a step in which a difference between the first light-receiving data and the CDS offset data is detected to extract light-receiving data. The process proceeds to Step ST02 after Step ST08, and whether there is light-receiving data to be read by the reading circuit 40 is checked.

Figure 6:
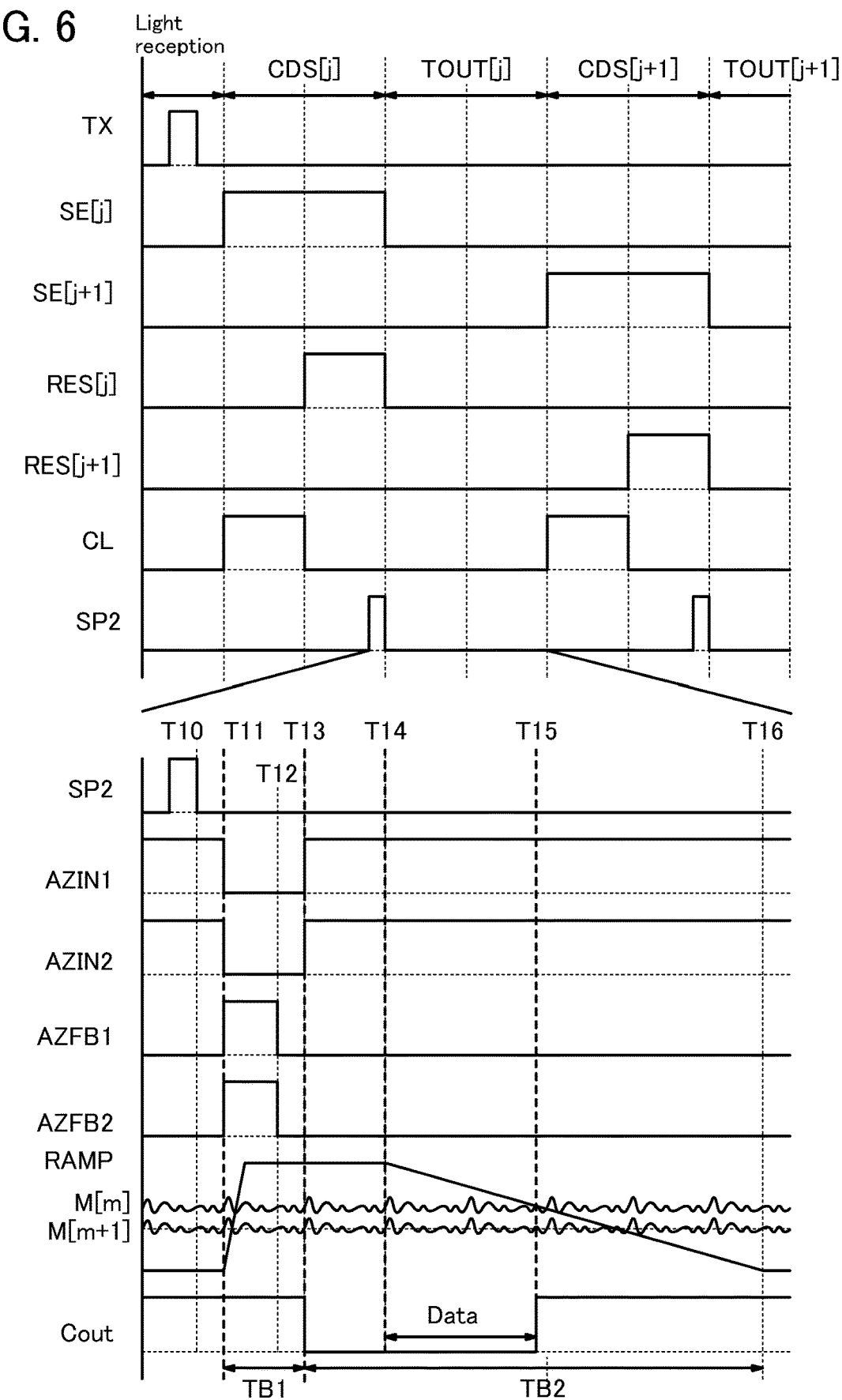
FIG. 6 is a timing chart showing an example of operation of a reading circuit.

FIG. 6 is a timing chart showing an example of operation of the reading circuit 40.

FIG. 6 shows a period in which the reading circuit 40 reads a light-receiving single from the subpixels 32 in the j-th row and in the j+1-th row included in the display apparatus. First, in the light-receiving period, the plurality of subpixels 32 included in the display apparatus simultaneously receive light with a global shutter system. At this time, the signal "H" is supplied to the wiring TX, and the signal "L" is supplied to the wiring SE, the wiring RES, the wiring CL, and a wiring supplied with the signal SP2. Note that in FIG. 6, operation of reading the light-receiving signal in the j-th row is described.

Next, the reading circuit 40 reads the light-receiving signal in the j-th row from the subpixels 32. A period in which the plurality of CDS circuits 41 read a light-receiving signal is a period CDS[j]. Furthermore, a period in which the noise removal circuit 42 removes common noise and performs quantization is a period TOUT[j]. Note that for explanation, description is made using the CDS circuit 41[m], for example.

First, the period CDS[j] is described. Note that for explanation of the period CDS[j], description is made with reference to the CDS circuit 41[m] shown in FIG. 3.

In the period CDS[j], first, the signal "H" is supplied to the wiring SEW, whereby the subpixel 32 supplies the detection signal to the CDS circuit 41[m]. Note that it is preferable that in this period, the signal "H" be supplied to the wiring CL and the node NDC be initialized (fixed) with the second initialization potential. Accordingly, the detection signal is retained in the capacitor C3 included in the CDS circuit 41[m]. Note that after the detection signal is retained in the capacitor C3, the signal "L" is supplied to the wiring CL, whereby the node NDC is brought into a floating state.

Next, the signal "H" is supplied to a wiring RES[j], whereby the subpixel 32 is initialized with the first initialization potential. A light-receiving signal (an initialization signal) in a state where the subpixel 32 is initialized is supplied to the CDS circuit 41[m]. At this time, the node NDC is in a floating state, and thus a difference between the detection signal and the initialization signal is output to the wiring MD as a light-receiving signal. Note that selection signals supplied to the wiring SEW and the wiring RES[j] are preferably generated by the signal SP2. Alternatively, the selection signals supplied to the wiring SEW and the wiring RES[j] may generate the signal SP2. Note that the signal SP2 is used as a signal that controls the operation timing of the noise removal circuit 42.

Next, the period TOUT[j] is described. Note that for explanation of the period TOUT[j], the noise removal circuit 42[m] shown in FIG. 4 is referred to.

The period TOUT includes Period TB1 and Period TB2. Here, Time T10 shows the time when the signal SP2 is changed to "L". Period TB1 preferably starts from Time T11 after Time T10. Note that Time T11 may be the same time as Time T10.

Period TB1 starts from Time T11. Period TB1 is a period in which the noise removal circuit 42[m] is initialized. The wiring AZIN1 and the wiring AZIN2 are changed to "L", whereby the switch SW2 and the switch SW3 are brought into an off state. At the same time, the wiring AZIN1B and the wiring AZIN2B are changed to "H", whereby the switch SW1 and the switch SW4 are brought into an on state. Thus, a potential VCOM2 supplied to the wiring COM2 is supplied to the node ND1 through the switch SW1. A potential VCOM1 supplied to the wiring COM1 is supplied to the node ND2 through the switch SW4.

At Time T11, the wiring AZFB1 and the wiring AZFB2 are changed to "H", whereby the transistor 51, the transistor 53, and the transistor 54 are brought into an on state. Thus, a potential VCOM3 supplied to the wiring COM3 is supplied to the node ND1a through the transistor 51. The potential VCOM3 supplied to the wiring COM3 is supplied to the node ND3 through the transistor 54. A potential output by the output terminal CO of the comparison circuit 56 is supplied to the node ND2a through the transistor 53. Note that the signal "L" is supplied to the wiring MODE, and the signal "H" is supplied to the wiring MODEB. Thus, the switch SW5 and the transistor 52 are in an on state.

By provision of Period TB1, the potential VCOM3 is supplied to the input terminal IP1, the input terminal IP2, and the input terminal IM2 of the comparison circuit 56, and an output potential of the output terminal CO is supplied to the input terminal IM1. Thus, when the potentials supplied to the input terminals of the comparison circuit 56 are fixed, it can be said that the comparison circuit 56 is in an initialization state.

At Time T12, the wiring AZFB1 and the wiring AZFB2 are changed to "L". Furthermore, at Time T13, the wiring AZIN1 and the wiring AZIN2 are changed to "H". That is, after the initialization of the comparison circuit 56, the node ND1 is connected to the wiring MD[m] through the switch SW2, and the node ND2 is connected to the wiring RAMP through the switch SW3.

Through the above procedure, a change in the signal of the wiring MD[m] can be supplied to the input terminal IP1 through the capacitor Cin1, and a change in the signal of the wiring MD[m+1] can be supplied to the input terminal IM2 through the capacitor Cin3. The first light-receiving signal supplied through the wiring MD[m] includes common noise like the second light-receiving signal supplied through the adjacent wiring MD[m+1].

Period TB2 is a period in which the comparison circuit 56 removes common noise. Here, as shown in FIG. 6, a ramp signal supplied to the wiring RAMP is a comparison signal that has a constant amount of change, which has a maximum value at Time T11 and a minimum value at Time T16 using Time T14 as start time. Note that without being limited to this, a signal supplied to the wiring RAMP may be a signal changed in a step-like manner or may be a signal changed in an analog manner. Note that the ramp signal is preferably a signal with the periods from Time T11 to Time T14 managed. Note that the periods from Time T13 to Time T14 can be provided as necessary.

The comparison circuit 56 generates a first resultant current using a potential supplied to the input terminal IP1 and a potential supplied to the input terminal IM1 and generates a second resultant current using a potential supplied to the input terminal IP2 and a potential supplied to the input terminal IM2. In the comparison circuit 56, the amount of the first resultant current is controlled to be the same as the amount of the second resultant current.

As an example, the amount of the first resultant current generated by supply of the first light-receiving signal to the input terminal IP1 is controlled to be the same as the amount of the second resultant current generated by supply of the second light-receiving signal to the input terminal IM2. Accordingly, common noise included in the first light-receiving signal is canceled out because the common noise includes the same noise component as common noise included in the second light-receiving signal. Thus, the first light-receiving signal supplied through the wiring MD[m] and including the common noise is removed using the common noise included in the adjacent wiring MD[m+1].

The first light-receiving signal from which the common noise is removed is supplied to the counter circuit 43[m] as the signal Cout through the buffer circuit 57. As shown in FIG. 6, the signal Cout output from the noise removal circuit 42 becomes a signal inverted between Time T14 to Time T16. Here, the time when the signal Cout is inverted is T15.

Note that the signal Cout is a binary signal, and thus the counter circuit 43[m] can quantize the period of the signal Cout easily. Accordingly, a single slope A/D converter circuit can be formed using the noise removal circuit 42 and the counter circuit 43. The signal Cout is converted into data Dout by being quantized by the counter circuit 43[m]. The data Dout can be handled easily in a processor, a control circuit, a video processing device, or the like. Note that in the case where the signal Cout is output as an analog value, a flash A/D converter circuit or the like may be used.

Figure 7:
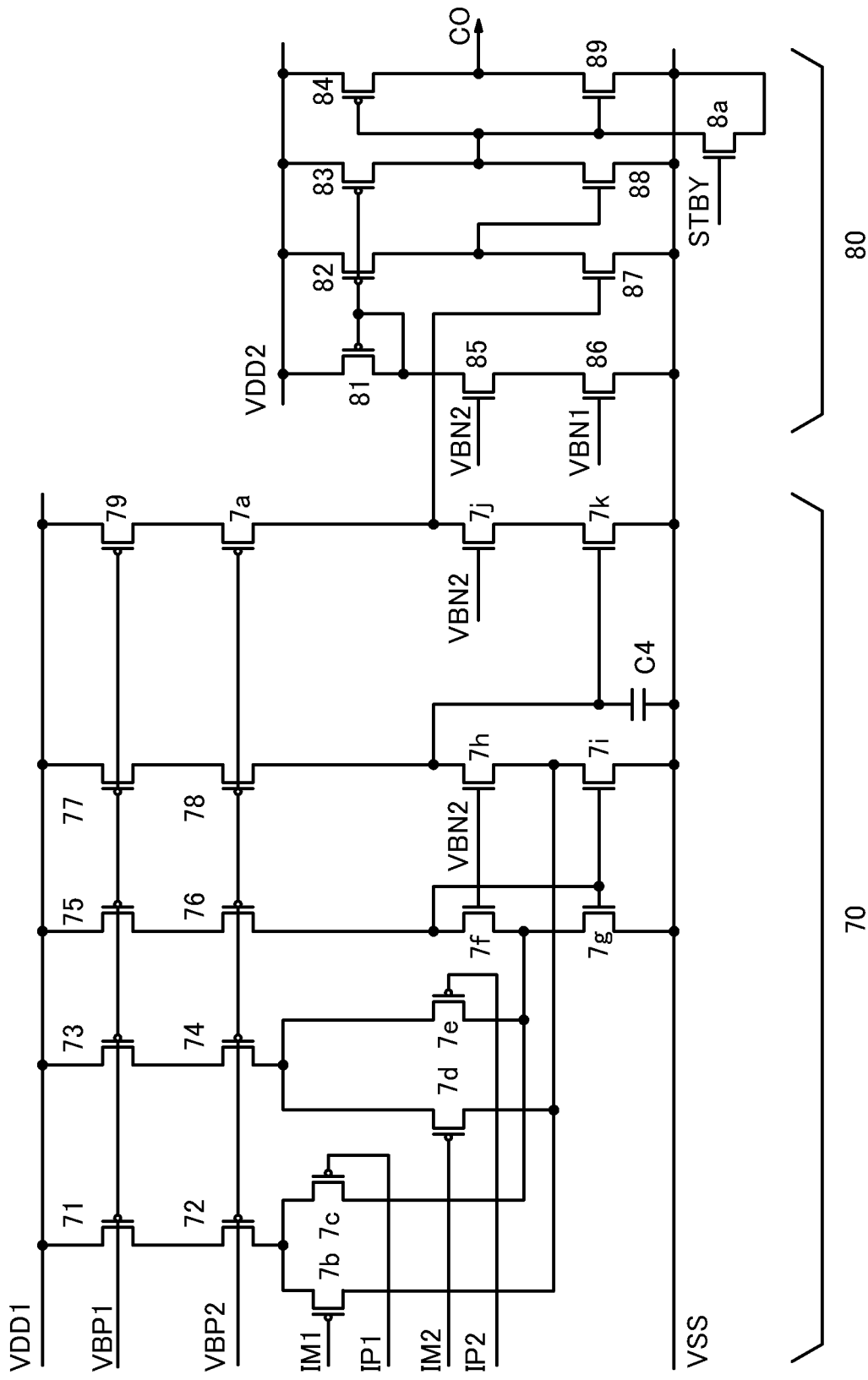
FIG. 7 is a circuit diagram illustrating a comparison circuit.

FIG. 7 shows an example of a circuit diagram illustrating the comparison circuit 56 in detail. The comparison circuit 56 includes an amplifier circuit 70 and a level shifter circuit 80. The amplifier circuit 70 includes a transistor 71 to a transistor 7k, a capacitor C4, the input terminal IP1, the input terminal IP2, the input terminal IM1, and the input terminal IM2. P-channel transistors are preferably used as the transistor 71 to the transistor 7e, and n-channel transistors are preferably used as the transistor 7f to the transistor 7k.

The level shifter circuit 80 includes a transistor 81 to a transistor 8a and the output terminal CO.

The amplifier circuit 70 includes a wiring VDD1, a wiring VBP1, and a wiring VBP2. The level shifter circuit 80 includes a wiring VDD2, a wiring STBY, and a wiring VBN1. The amplifier circuit 70 and the level shifter circuit 80 share a wiring VSS and a wiring VBN2.

The wiring VDD1 is electrically connected to sources or drains of the transistor 71, the transistor 73, the transistor 75, the transistor 77, and the transistor 79. The wiring VDD2 is electrically connected to sources or drains of the transistor 81 to the transistor 84. The wiring VSS is electrically connected to sources or drains of the transistor 7g, the transistor 7i, the transistor 7k, and the transistor 86 to the transistor 89.

The wiring VBP1 is electrically connected to gates of the transistor 71, the transistor 73, the transistor 75, the transistor 77, and the transistor 79. The wiring VBP2 is electrically connected to gates of the transistor 72, the transistor 74, the transistor 76, the transistor 78, and the transistor 7a. The wiring VBN2 is electrically connected to gates of the transistor 7f, the transistor 7h, the transistor 7j, and the transistor 85.

The input terminal IM1 is electrically connected to a gate of the transistor 7b. The input terminal IP1 is electrically connected to a gate of the transistor 7c. The input terminal IM2 is electrically connected to a gate of the transistor 7d. The input terminal IP2 is electrically connected to a gate of the transistor 7e.

The other of the source and the drain of the transistor 71 is electrically connected to one of a source and a drain of the transistor 72. The other of the source and the drain of the transistor 72 is electrically connected to sources or drains of the transistor 7b and the transistor 7c.

The other of the source and the drain of the transistor 73 is electrically connected to one of a source and a drain of the transistor 74. The other of the source and the drain of the transistor 74 is electrically connected to sources or drains of the transistor 7d and the transistor 7e.

The other of the source and the drain of the transistor 75 is electrically connected to one of a source and a drain of the transistor 76. The other of the source and the drain of the transistor 76 is electrically connected to one of a source and a drain of the transistor 7f and gates of the transistor 7g and the transistor 7i. The other of the source and the drain of the transistor 7f is electrically connected to the other of the source and the drain of the transistor 7g and the others of the sources and the drains of the transistor 7c and the transistor 7e.

The other of the source and the drain of the transistor 77 is electrically connected to one of a source and a drain of the transistor 78. The other of the source and the drain of the transistor 78 is electrically connected to one of a source and a drain of the transistor 7h, a gate of the transistor 7k, and one electrode of the capacitor C4. The other of the source and the drain of the transistor 7h is electrically connected to the other of the source and the drain of the transistor 7i and the others of the sources and the drains of the transistor 7b and the transistor 7d. The other electrode of the capacitor C4 is electrically connected to the wiring VSS.

The other of the source and the drain of the transistor 79 is electrically connected to one of a source and a drain of the transistor 7a. The other of the source and the drain of the transistor 7a is electrically connected to one of a source and a drain of the transistor 7j and a gate of the transistor 87. The other of the source and the drain of the transistor 7j is electrically connected to the other of the source and the drain of the transistor 7k.

The other of the source and the drain of the transistor 81 is electrically connected to one of a source and a drain of the transistor 85 and gates of the transistor 81 to the transistor 83. The other of the source and the drain of the transistor 85 is electrically connected to the other of the source and the drain of the transistor 86. The wiring VBN1 is electrically connected to a gate of the transistor 86.

The other of the source and the drain of the transistor 82 is electrically connected to the other of the source and the drain of the transistor 87 and a gate of the transistor 88.

The other of the source and the drain of the transistor 83 is electrically connected to the other of the source and the drain of the transistor 88, one of a source and a drain of the transistor 8a, and gates of the transistor 84 and the transistor 89.

The other of the source and the drain of the transistor 84 is electrically connected to the other of the source and the drain of the transistor 89 and the output terminal CO. The other of the source and the drain of the transistor 8a is electrically connected to the wiring VSS. The wiring STBY is electrically connected to a gate of the transistor 8a.

The amount of current flowing through the transistor 7c by a potential supplied to the input terminal IP1 and the amount of current flowing through the transistor 7b by a potential supplied to the input terminal IM1 are determined by the transistor 71 and the transistor 72. In other words, the amount of the first resultant current flowing through the transistor 71 and the transistor 72 becomes equal to the amount of current obtained by adding, to the current flowing through the transistor 7c by the potential supplied to the input terminal IP1, the current flowing through the transistor 7b by the potential supplied to the input terminal IM1.

Similarly, the second resultant current flowing through the transistor 73 and the transistor 74 becomes equal to the amount of current obtained by adding, to a current flowing through the transistor 7e by a potential supplied to the input terminal IP2, a current flowing through the transistor 7d by a potential supplied to the input terminal IM2.

Note that the same potential is supplied to the gates of the transistor 71 and the transistor 73, and the same potential is supplied to the gates of the transistor 72 and the transistor 74. Thus, the transistor 71 and the transistor 73 have a relation of differential input, and the transistor 72 and the transistor 74 have a relation of differential input. Accordingly, the first resultant current has the same current value as the second resultant current. Here, the channel length and the channel width of the transistor 71 are preferably the same as the channel length and the channel width of the transistor 73. Moreover, the channel length and the channel width of the transistor 72 are preferably the same as the channel length and the channel width of the transistor 74.

As an example, in the case where the first light-receiving signal supplied to the input terminal IP1 is increased by the influence of common noise, the amount of current flowing through the transistor 7c is increased. Furthermore, in the case where the second light-receiving signal supplied to the input terminal IM2 is increased by the influence of common noise, the amount of current flowing through the transistor 7d is increased. Note that the potential VCOM3 is supplied to the input terminal IP2, and the ramp signal is supplied to the input terminal IM1. The potential VCOM3 and the ramp signal do not include the common noise.

The influence of the common noise is canceled out because the amount of the first resultant current is the same as the amount of the second resultant current. Accordingly, the total current flowing through the transistor 7c and the transistor 7e can be the first light-receiving signal. Moreover, the total current flowing through the transistor 7b and the transistor 7d can be the comparison signal using the ramp signal. Accordingly, the amplifier circuit 70 can function as a comparison circuit.

Note that the level shifter circuit 80 can convert an output voltage of the amplifier circuit 70 into the amplitude of a potential supplied to the wiring VDD2.

Accordingly, the first light-receiving signal including common noise, which is supplied through the wiring MD[$m$], can be removed using the common noise also included in the adjacent wiring MD[$m+1$].

As described above, according to one embodiment of the present invention, a reading circuit that reads a light-receiving signal from a display apparatus having a display function and a light-receiving function can be provided. According to one embodiment of the present invention, a noise removal circuit that reduces common noise due to a display function can be provided. Accordingly, the display module can detect a touch or the like using the light-receiving function of the display apparatus. The display module can be used as a proximity sensor that detects reflected light using a light-emitting function of the display function. In the case of operating as a proximity sensor, the display module can have a function of authenticating a fingerprint, a palm, or the like.

This embodiment can be combined with the other embodiments as appropriate. In this specification, in the case where a plurality of structure examples are shown in one embodiment, the structure examples can be combined as appropriate.

Embodiment 2

In this embodiment, display apparatuses of one embodiment of the present invention are described with reference to FIG. 8 to FIG. 17.

The display apparatus of this embodiment can be favorably used in the display portion of the device described in Embodiment 1.

The display portion of the display apparatus of one embodiment of the present invention has a function of displaying an image with the use of a light-emitting element. Furthermore, the display portion also has one or both of an image capturing function and a sensing function.

The display apparatus of one embodiment of the present invention includes a light-receiving element and a light-emitting element. Alternatively, the display apparatus of one embodiment of the present invention includes a light-emitting and light-receiving element (also referred to as a light-emitting and light-receiving device) and a light-emitting element.

First, the display apparatus including a light-receiving element and a light-emitting element is described.

The display apparatus of one embodiment of the present invention includes a light-receiving element and a light-emitting element in a display portion. In the display apparatus of one embodiment of the present invention, the light-emitting elements are arranged in a matrix in the display portion, and an image can be displayed on the display portion. Furthermore, the light-receiving elements are arranged in a matrix in the display portion, and the display portion has one or both of an image capturing function and a sensing function. The display portion can be used as an image sensor or a touch sensor. That is, by detecting light with the display portion, an image can be captured and the approach or contact of an object (e.g., a finger or a stylus) can be detected. Furthermore, in the display apparatus of one embodiment of the present invention, the light-emitting elements can be used as a light source of the sensor. Accordingly, a light-receiving portion and a light source do not need to be provided separately from the display apparatus; hence, the number of components of an electronic device can be reduced.

In the display apparatus of one embodiment of the present invention, when an object reflects (or scatters) light emitted by the light-emitting element included in the display portion, the light-receiving element can detect the reflected light (or the scattered light); thus, image capturing and touch operation (touch or approach) detection are possible even in a dark place.

The display apparatus of one embodiment of the present invention has a function of displaying an image with the use of a light-emitting element. That is, the light-emitting element functions as a display element (also referred to as a display device).

As the light-emitting element, an EL element (also referred to as an EL device) such as an OLED (Organic Light Emitting Diode) or a QLED (Quantum-dot Light Emitting Diode) is preferably used. As a light-emitting substance contained in the EL element, a substance emitting fluorescence (a fluorescent material), a substance emitting phosphorescence (a phosphorescent material), an inorganic compound (such as a quantum dot material), a substance exhibiting thermally activated delayed fluorescence (a thermally activated delayed fluorescence (TADF) material), or the like can be given. Alternatively, an LED (a light-emitting diode) such as a micro-LED can be used as the light-emitting element.

The display apparatus of one embodiment of the present invention has a function of detecting light with the use of a light-receiving element.

When the light-receiving element is used as an image sensor, the display apparatus can capture an image using the light-receiving element. For example, the display apparatus of this embodiment can be used as a scanner.

For example, data on biological information of a fingerprint, a palm print, or the like can be obtained with the use of the image sensor. That is, a biological authentication sensor can be incorporated in the display apparatus. When the display apparatus incorporates a biological authentication sensor, the number of components of an electronic device can be reduced as compared to the case where a biological authentication sensor is provided separately from the display apparatus; thus, the size and weight of the electronic device can be reduced.

When the light-receiving element is used as the touch sensor, the display apparatus can detect the approach or contact of an object with the use of the light-receiving element.

As the light-receiving element, a pn photodiode or a pin photodiode can be used, for example. The light-receiving element functions as a photoelectric conversion element that detects light entering the light-receiving element and generates charge. The amount of charge generated from the light-receiving element depends on the amount of light entering the light-receiving element.

It is particularly preferable to use an organic photodiode including a layer containing an organic compound as the light-receiving element. An organic photodiode, which is easily made thin, lightweight, and large in area and has a high degree of freedom for shape and design, can be used in a variety of display apparatuses.

In one embodiment of the present invention, organic EL elements are used as the light-emitting elements, and organic photodiodes are used as the light-receiving elements. The organic EL elements and the organic photodiodes can be formed over one substrate. Thus, the organic photodiodes can be incorporated in the display apparatus including the organic EL elements.

If all the layers of the organic EL elements and the organic photodiodes are formed separately, the number of deposition steps becomes extremely large. Since a large number of layers of the organic photodiodes can have structures in common with the organic EL elements, concurrently depositing the layers that can have a common structure can inhibit an increase in the number of deposition steps.

For example, one of a pair of electrodes (a common electrode) can be a layer shared by the light-receiving element and the light-emitting element. For example, at least one of a hole-injection layer, a hole-transport layer, an electron-transport layer, and an electron-injection layer is preferably a layer shared by the light-receiving element and the light-emitting element. As another example, the light-receiving element and the light-emitting element can have the same structure except that the light-receiving element includes an active layer and the light-emitting element includes a light-emitting layer. In other words, the light-receiving element can be manufactured by only replacing the light-emitting layer of the light-emitting element with an active layer. When the light-receiving element and the light-emitting element include common layers in such a manner, the number of deposition steps and the number of masks can be reduced, thereby reducing the number of manufacturing steps and the manufacturing cost of the display apparatus. Furthermore, the display apparatus including the light-receiving element can be manufactured using an existing manufacturing apparatus and an existing manufacturing method for the display apparatus.

Note that a layer shared by the light-receiving element and the light-emitting element may have functions different in the light-receiving element and the light-emitting element. In this specification, the name of a component is based on its function in the light-emitting element. For example, a hole-injection layer functions as a hole-injection layer in the light-emitting element and functions as a hole-transport layer in the light-receiving element. Similarly, an electron-injection layer functions as an electron-injection layer in the light-emitting element and functions as an electron-transport layer in the light-receiving element. Note that a layer shared by the light-receiving element and the light-emitting element may have the same functions in the light-emitting element and the light-receiving element. The hole-transport layer functions as a hole-transport layer in both of the light-emitting element and the light-receiving element, and the electron-transport layer functions as an electron-transport layer in both of the light-emitting element and the light-receiving element.

Next, a display apparatus including a light-emitting and light-receiving element and a light-emitting element is described.

In the display apparatus of one embodiment of the present invention, a subpixel exhibiting any color includes a light-emitting and light-receiving element instead of a light-emitting element, and subpixels exhibiting the other colors each include a light-emitting element. The light-emitting and light-receiving element has both a function of emitting light (a light-emitting function) and a function of receiving light (a light-receiving function). For example, in the case where a pixel includes three subpixels of a red subpixel, a green subpixel, and a blue subpixel, at least one of the subpixels includes a light-emitting and light-receiving element, and the other subpixels each include a light-emitting element. Thus, the display portion of the display apparatus of one embodiment of the present invention has a function of displaying an image using both a light-emitting and light-receiving element and a light-emitting element.

The light-emitting and light-receiving element functions as both a light-emitting element and a light-receiving element, whereby the pixel can have a light-receiving function without an increase in the number of subpixels included in the pixel. Thus, the display portion of the display apparatus can be provided with one or both of an image capturing function and a sensing function while keeping the aperture ratio of the pixel (aperture ratio of each subpixel) and the resolution of the display apparatus. Accordingly, in the display apparatus of one embodiment of the present invention, the aperture ratio of the pixel can be more increased and the resolution can be increased more easily than in a display apparatus provided with a subpixel including a light-receiving element separately from a subpixel including a light-emitting element In in the display portion in the display apparatus of one embodiment of the present invention, the light-emitting and light-receiving elements and the light-emitting elements are arranged in a matrix, and an image can be displayed on the display portion. The display portion can be used as an image sensor or a touch sensor. Furthermore, in the display apparatus of one embodiment of the present invention, the light-emitting elements can be used as a light source of the sensor. Accordingly, a light-receiving portion and a light source do not need to be provided separately from the display apparatus; hence, the number of components of an electronic device can be reduced.

In the display apparatus of one embodiment of the present invention, when an object reflects (or scatters) light emitted by the light-emitting element included in the display portion, the light-emitting and light-receiving element can detect the reflected light (or the scattered light); thus, image capturing and touch operation (touch or approach) detection are possible even in a dark place.

The light-emitting and light-receiving element can be manufactured by combining an organic EL element and an organic photodiode. For example, by adding an active layer of an organic photodiode to a layered structure of an organic EL element, the light-emitting and light-receiving element can be manufactured. Furthermore, in the light-emitting and light-receiving element formed of a combination of an organic EL element and an organic photodiode, concurrently depositing layers that can be shared with the organic EL element can inhibit an increase in the number of deposition steps.

For example, one of a pair of electrodes (a common electrode) can be a layer shared by the light-emitting and light-receiving element and the light-emitting element. For example, at least one of a hole-injection layer, a hole-transport layer, an electron-transport layer, and an electron-injection layer is preferably a layer shared by the light-emitting and light-receiving element and the light-emitting element. As another example, the light-emitting and light-receiving element and the light-emitting element can have the same structure except for the presence or absence of an active layer of the light-receiving element. In other words, the light-emitting and light-receiving element can be manufactured by only adding the active layer of the light-receiving element to the light-emitting element. When the light-emitting and light-receiving element and the light-emitting element include common layers in such a manner, the number of deposition steps and the number of masks can be reduced, thereby reducing the number of manufacturing steps and the manufacturing cost of the display apparatus. Furthermore, the display apparatus including the light-emitting and light-receiving element can be manufactured using an existing manufacturing apparatus and an existing manufacturing method for the display apparatus.

Note that a layer included in the light-emitting and light-receiving element might have a different function between the case where the light-emitting and light-receiving element function as the light-receiving element and the case where the light-emitting and light-receiving element function as the light-emitting element. In this specification, the name of a component is based on its function in the case where the light-emitting and light-receiving element functions as a light-emitting element. For example, a hole-injection layer functions as a hole-injection layer in the case where the light-emitting and light-receiving element functions as the light-emitting element, and functions as a hole-transport layer in the case where the light-emitting and light-receiving element functions as the light-receiving element. Similarly, an electron-injection layer functions as an electron-injection layer in the case where the light-emitting and light-receiving element functions as the light-emitting element, and functions as an electron-transport layer in the case where the light-emitting and light-receiving element function as the light-receiving element. A layer included in the light-emitting and light-receiving element may have the same function in both the case where the light-emitting and light-receiving element functions as the light-receiving element and the case where the light-emitting and light-receiving element functions as the light-emitting element. The hole-transport layer functions as a hole-transport layer in the case where the light-emitting and light-receiving element functions as either a light-emitting element or a light-receiving element, and the electron-transport layer functions as an electron-transport layer in the case where the light-emitting and light-receiving element functions as either a light-emitting element or a light-receiving element.

The display apparatus of this embodiment has a function of displaying an image with the use of a light-emitting element and a light-emitting and light-receiving element. That is, the light-emitting element and the light-emitting and light-receiving element function as a display element.

The display apparatus of this embodiment has a function of detecting light with the use of a light-emitting and light-receiving element. The light-emitting and light-receiving element can detect light having a shorter wavelength than light emitted by the light-emitting and light-receiving element itself.

When the light-emitting and light-receiving element is used as an image sensor, the display apparatus of this embodiment can capture an image using the light-emitting and light-receiving element. For example, the display apparatus of this embodiment can be used as a scanner.

When the light-emitting and light-receiving element is used as the touch sensor, the display apparatus of this embodiment can detect the approach or contact of an object with the use of the light-emitting and light-receiving element.

The light-emitting and light-receiving element functions as a photoelectric conversion element that detects light entering the light-emitting and light-receiving element and generates charge. The amount of charge generated from the light-emitting and light-receiving element depends on the amount of light entering the light-emitting and light-receiving element.

The light-emitting and light-receiving element can be manufactured by adding an active layer of the light-receiving element to the above-described structure of the light-emitting element.

For the light-emitting and light-receiving element, an active layer of a pn photodiode or a pin photodiode can be used, for example.

It is particularly preferable to use, for the light-emitting and light-receiving element, an active layer of an organic photodiode including a layer containing an organic compound. An organic photodiode, which is easily made thin, lightweight, and large in area and has a high degree of freedom for shape and design, can be used in a variety of display apparatuses.

The display apparatus of one embodiment of the present invention is specifically described below with reference to drawings.

[Display Apparatus]

FIG. 8A to FIG. 8D and FIG. 8F show cross-sectional views of display apparatuses of embodiments of the present invention.

Figure 8A:
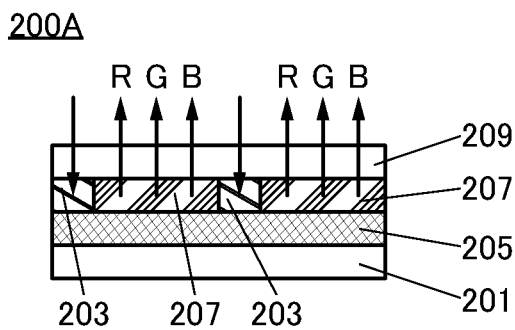
FIG. 8A to FIG. 8D and FIG. 8F are cross-sectional views showing examples of a display apparatus.

A display apparatus 200A shown in FIG. 8A includes a layer 203 including a light-receiving element, a functional layer 205, and a layer 207 including a light-emitting element between a substrate 201 and a substrate 209.

In the display apparatus 200A, red (R) light, green (G) light, and blue (B) light are emitted from the layer 207 including a light-emitting element.

The light-receiving element included in the layer 203 including a light-receiving element can detect light that enters from the outside of the display apparatus 200A.

Figure 8B:
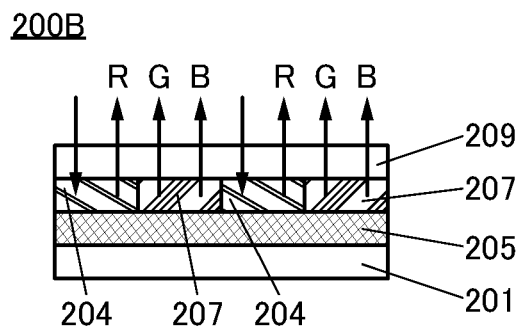

A display apparatus 200B shown in FIG. 8B includes a layer 204 including a light-emitting and light-receiving element, the functional layer 205, and the layer 207 including a light-emitting element between the substrate 201 and the substrate 209.

In the display apparatus 200B, green (G) light and blue (B) light are emitted from the layer 207 including a light-emitting element, and red (R) light is emitted from the layer 204 including a light-emitting and light-receiving element. In the display apparatus of one embodiment of the present invention, the color of light emitted from the layer 204 including a light-emitting and light-receiving element is not limited to red. Furthermore, the color of light emitted from the layer 207 including a light-emitting element is not limited to the combination of green and blue.

The light-emitting and light-receiving element included in the layer 204 including a light-emitting and light-receiving element can detect light that enters from the outside of the display apparatus 200B. The light-emitting and light-receiving element can detect one or both of green (G) light and blue (B) light, for example.

The functional layer 205 includes a circuit for driving the light-receiving element or the light-emitting and light-receiving element and a circuit for driving the light-emitting element. A switch, a transistor, a capacitor, a resistor, a wiring, a terminal, and the like can be provided in the functional layer 205. Note that in the case where the light-emitting element the light-receiving element are driven by a passive-matrix method, a structure not provided with a switch or a transistor may be employed.

Figure 8C:
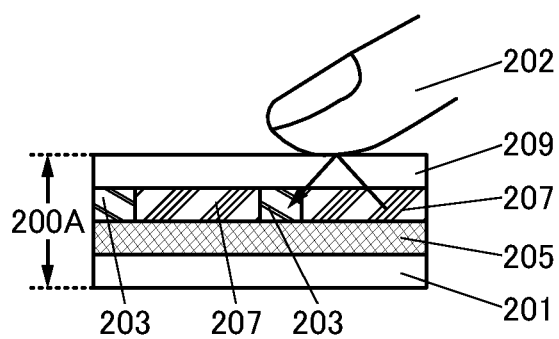

The display apparatus of one embodiment of the present invention may have a function of detecting an object such as a finger that is touching the display apparatus (a function of a touch panel). For example, after light emitted by the light-emitting element in the layer 207 including a light-emitting element is reflected by a finger 202 that is touching the display apparatus 200A as shown in FIG. 8C, the light-receiving element in the layer 203 including a light-receiving element detects the reflected light. Thus, the touch of the finger 202 on the display apparatus 200A can be detected. Furthermore, in the display apparatus 200B, after light emitted by the light-emitting element in the layer 207 including a light-emitting element is reflected by a finger that is touching the display apparatus 200B, the light-emitting and light-receiving element in the layer 204 including a light-emitting and light-receiving element can detect the reflected light. Although a case where light emitted by the light-emitting element is reflected by an object is described below as an example, light might be scattered by an object.

Figure 8D:
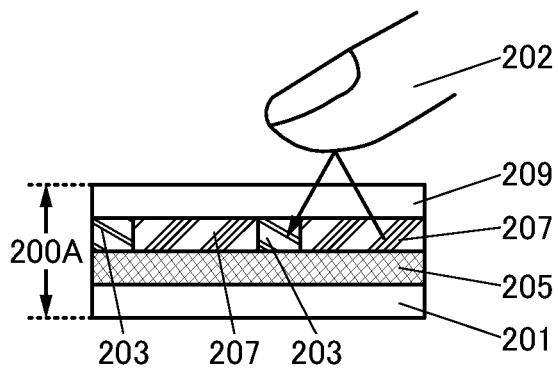

The display apparatus of one embodiment of the present invention may have a function of detecting an object that is close to (but is not touching) the display apparatus as shown in FIG. 8D or capturing an image of such an object.

Figure 8E:
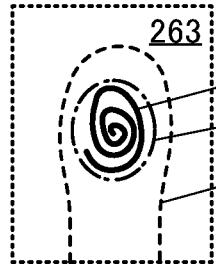
FIG. 8E and FIG. 8G are diagrams showing examples of an image captured by the display apparatus.

The display apparatus of one embodiment of the present invention may have a function of detecting a fingerprint of the finger 202. FIG. 8E shows a diagram of an image captured by the display apparatus of one embodiment of the present invention. In an image-capturing range 263 in FIG. 8E, the outline of the finger 202 is indicated by a dashed line and the outline of a contact portion 261 is indicated by a dashed-dotted line. In the contact portion 261, a high-contrast image of a fingerprint 262 can be captured owing to a difference in the amount of light entering the light-receiving element (or the light-emitting and light-receiving element).

Figure 8F:
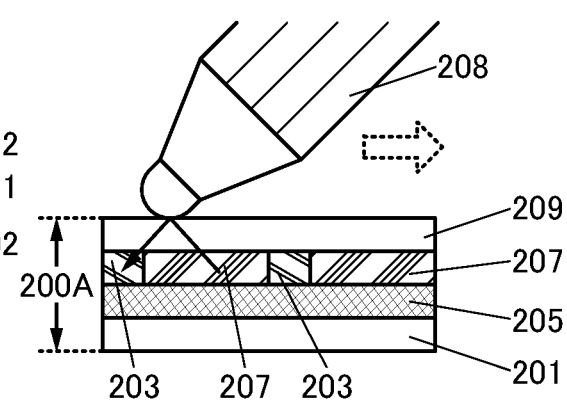

The display apparatus of one embodiment of the present invention can also function as a pen tablet. FIG. 8F shows a state in which a tip of a stylus 208 slides in a direction indicated by a dashed arrow while the tip of the stylus 208 touches the substrate 209.

As shown in FIG. 8F, when the scattered light scattered by the contact surface between the tip of the stylus 208 and the substrate 209 enters the light-receiving element (or the light-emitting and light-receiving element) that is positioned in a portion overlapping with the contact surface, the position of the tip of the stylus 208 can be detected with high accuracy.

Figure 8G:
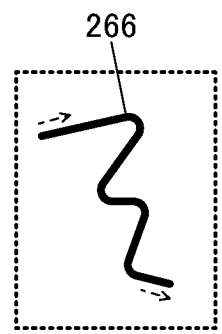

FIG. 8G shows an example of a path 266 of the stylus 208 that is detected by the display apparatus of one embodiment of the present invention. The display apparatus of one embodiment of the present invention can detect the position of an object to be detected, such as the stylus 208, with high position accuracy, so that high-definition drawing can be performed using a drawing application or the like. Unlike the case of using a capacitive touch sensor, an electromagnetic induction touch pen, or the like, the display apparatus can detect even the position of a highly insulating object to be detected, the material of a tip portion of the stylus 208 is not limited, and a variety of writing materials (e.g., a brush, a glass pen, a quill pen, and the like) can be used.

FIG. 9A to FIG. 9D show examples of a pixel which includes a plurality of subpixels each including a light-emitting element and includes one subpixel including a light-emitting and light-receiving element.

Figure 9A:
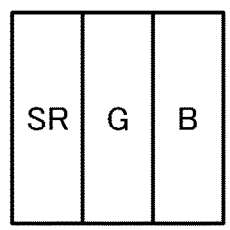
FIG. 9A to FIG. 9G are top views showing examples of a pixel.

A pixel shown in FIG. 9A employs stripe arrangement and includes a subpixel (SR) that exhibits red light and has a light-receiving function, a subpixel (G) that exhibits green light, and a subpixel (B) that exhibits blue light. In a display apparatus including a pixel composed of three subpixels of RGB, a light-emitting element used in the R subpixel can be replaced with a light-emitting and light-receiving element, so that the display apparatus can have a light-receiving function in the pixel.

Figure 9B:
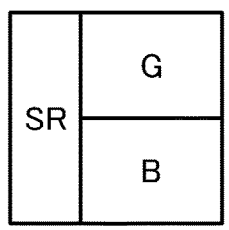

A pixel shown in FIG. 9B includes a subpixel (SR) that exhibits red light and has a light-receiving function, a subpixel (G) that exhibits green light, and a subpixel (B) that exhibits blue light. The subpixel (SR) is provided in a column different from a column where the subpixel (G) and the subpixel (B) are positioned. The subpixel (G) and the subpixel (B) are alternately arranged in the same column; one is provided in an odd-numbered row and the other is provided in an even-numbered row. The color of the subpixel positioned in a column different from the column where the subpixels of the other colors are positioned is not limited to red (R) and may be green (G) or blue (B).

Figure 9E:
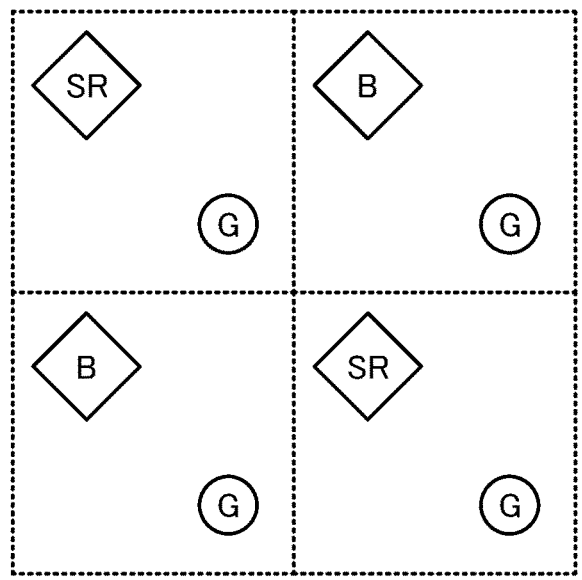
Figure 9C:
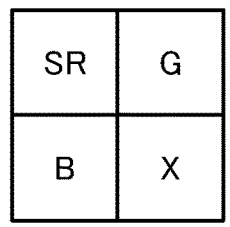

A pixel shown in FIG. 9C employs matrix arrangement and includes a subpixel (SR) that exhibits red light and has a light-receiving function, a subpixel (G) that exhibits green light, a subpixel (B) that exhibits blue light, and a subpixel (X) that exhibits light of a color other than RGB. Also in a display apparatus including a pixel composed of four subpixels of RGBX, a light-emitting element used in the R subpixel can be replaced with a light-emitting and light-receiving element, so that the display apparatus can have a light-receiving function in the pixel.

Figure 9D:
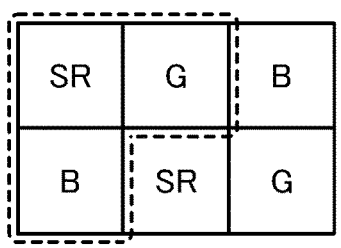

FIG. 9D shows two pixels, each of which is composed of three subpixels surrounded by dotted lines. The pixels shown in FIG. 9D each include a subpixel (SR) that exhibits red light and has a light-receiving function, a subpixel (G) that exhibits green light, and a subpixel (B) that exhibits blue light. In the pixel on the left in FIG. 9D, the subpixel (G) is positioned in the same row as the subpixel (SR), and the subpixel (B) is positioned in the same column as the subpixel (SR). In the pixel on the right in FIG. 9D, the subpixel (G) is positioned in the same row as the subpixel (SR), and the subpixel (B) is positioned in the same row as the subpixel (SR). In every odd-numbered row and every even-numbered row of the pixel layout shown in FIG. 9D, the subpixel (SR), the subpixel (G), and the subpixel (B) are repeatedly arranged. In addition, subpixels of different colors are arranged in the odd-numbered row and the even-numbered row in every column.

Figure 9F:
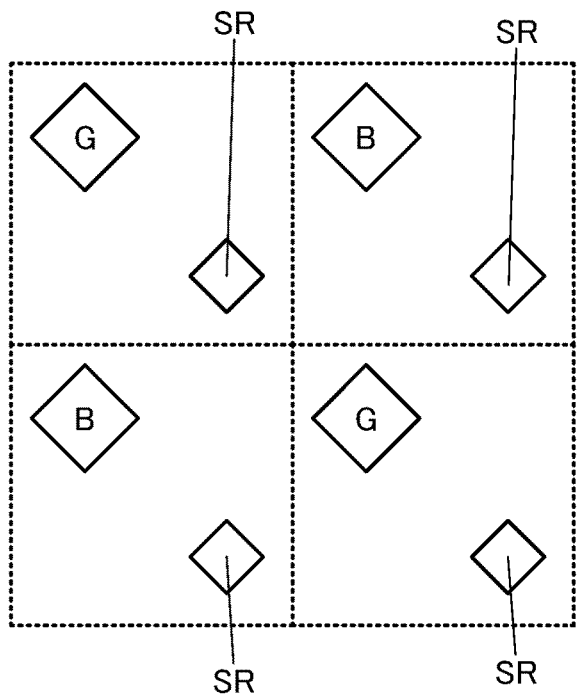

FIG. 9E shows four pixels which employ pentile arrangement; adjacent two pixels each have a different combination of two subpixels that emit light of different colors. Note that the shape of the subpixels shown in FIG. 9E indicates a top-surface shape of the light-emitting elements and the light-emitting and light-receiving elements included in the subpixels. FIG. 9F is a modification example of the pixel arrangement of FIG. 9E.

The upper-left pixel and the lower-right pixel in FIG. 9E each include a subpixel (SR) that exhibits red light and has a light-receiving function and a subpixel (G) that exhibits green light. The lower-left pixel and the upper-right pixel in FIG. 9E each include a subpixel (G) that exhibits green light and a subpixel (B) that exhibits blue light.

The upper-left pixel and the lower-right pixel in FIG. 9F each include a subpixel (SR) that exhibits red light and has a light-receiving function and a subpixel (G) that exhibits green light. The lower-left pixel and the upper-right pixel in FIG. 9F each include a subpixel (SR) that exhibits red light and has a light-receiving function and a subpixel (B) that exhibits blue light.

In FIG. 9E, the subpixel (G) that exhibits green light is provided in each pixel. In FIG. 9F, the subpixel (SR) that exhibits red light and has a light-receiving function is provided in each pixel. The structure shown in FIG. 9F achieves higher-resolution image capturing than the structure shown in FIG. 9E because of having a subpixel having a light-receiving function in each pixel. Thus, the accuracy of biometric authentication can be increased, for example.

The top-surface shape of the light-emitting elements and the light-emitting and light-receiving elements is not particularly limited and can be a circular shape, an elliptical shape, a polygonal shape, a polygonal shape with rounded corners, or the like. The top-surface shape of the light-emitting elements included in the subpixels (G) is a circular in the example in FIG. 9E and square in the example in FIG. 9F. The top surface shape of the light-emitting elements and the light-emitting and light-receiving elements may vary depending on the color thereof, or the light-emitting elements and the light-emitting and light-receiving elements of some colors or every color may have the same top-surface shape.

The aperture ratio of subpixels may vary depending on the color of the subpixels, or may be the same among the subpixels of some colors or every color. For example, the aperture ratio of a subpixel of a color provided in each pixel (the subpixel (G) in FIG. 9E, and the subpixel (SR) in FIG. 9F) may be made lower than those of subpixels of the other colors.

Figure 9G:
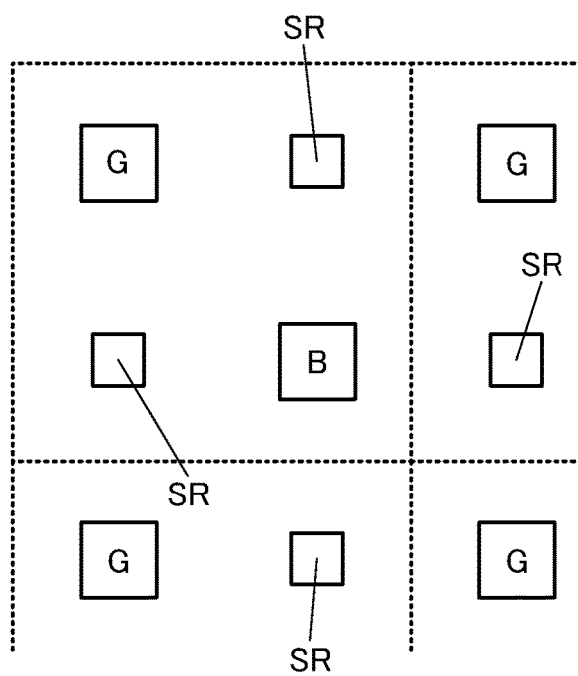

FIG. 9G is a modification example of the pixel arrangement of FIG. 9F. Specifically, the structure of FIG. 9G is obtained by rotating the structure of FIG. 9F by 45°. Although one pixel is regarded as being formed of two subpixels in FIG. 9F, one pixel can be regarded as being formed of four subpixels as shown in FIG. 9G.

In the description with reference to FIG. 9G, one pixel is regarded as being formed of four subpixels surrounded by dotted lines. A pixel includes two subpixels (SR), one subpixel (G), and one subpixel (B). The pixel including a plurality of subpixels having a light-receiving function allows high-resolution image capturing. Accordingly, the accuracy of biometric authentication can be increased. For example, the resolution of image capturing can be the square root of 2 times the resolution of display.

A display apparatus which employs the structure shown in FIG. 9F or FIG. 9G includes p (p is an integer greater than or equal to 2) first light-emitting elements, q (q is an integer greater than or equal to 2) second light-emitting elements, and r (r is an integer greater than p and q) light-emitting and light-receiving elements. As for p and r, r=2p is satisfied. As for p, q, and r, r=p+q is satisfied. Either the first light-emitting elements or the second light-emitting elements emits green light, and the other light-emitting elements emit blue light. The light-emitting and light-receiving elements emit red light and have a light-receiving function.

In the case where touch detection is performed with the light-emitting and light-receiving elements, for example, it is preferable that light emitted by a light source be hard for a user to recognize. Since blue light has low visibility than green light, light-emitting elements which emit blue light are preferably used as a light source. Accordingly, the light-emitting and light-receiving elements preferably have a function of receiving blue light.

As described above, the display apparatus of this embodiment can employ any of various types of pixel arrangements.

[Device Structure]

Next, detailed structures of the light-emitting element, the light-receiving element, and the light-emitting and light-receiving element which can be used in the display apparatus of one embodiment of the present invention are described.

The display apparatus of one embodiment of the present invention can have any of the following structures: a top-emission structure in which light is emitted in a direction opposite to the substrate where the light-emitting element is formed, a bottom-emission structure in which light is emitted toward the substrate where the light-emitting element is formed, and a dual-emission structure in which light is emitted toward both surfaces.

In this embodiment, a top-emission display apparatus is described as an example.

In this specification and the like, unless otherwise specified, in describing a structure including a plurality of components (e.g., light-emitting elements or light-emitting layers), alphabets are not added when a common part for the components is described. For example, when a common part of a light-emitting layer 283R, a light-emitting layer 283G, and the like is described, the light-emitting layers are simply referred to as the light-emitting layer 283, in some cases.

Figure 10A:
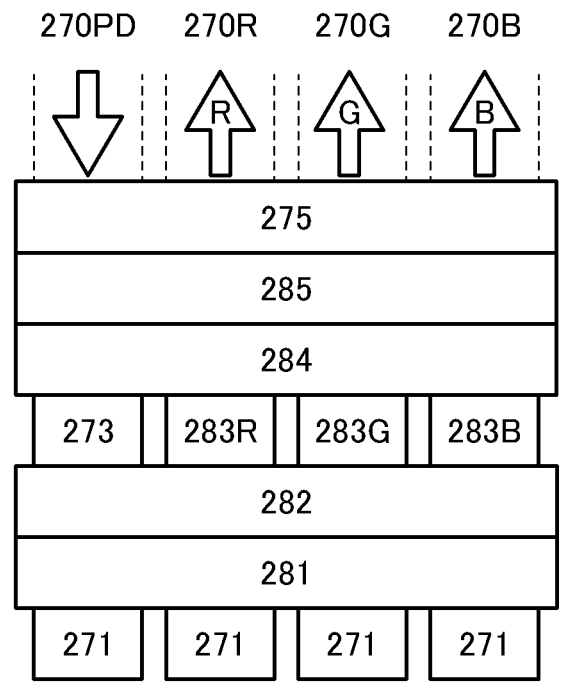
FIG. 10A and FIG. 10B are cross-sectional views showing examples of a display apparatus.

A display apparatus 280A shown in FIG. 10A includes a light-receiving element 270PD, a light-emitting element 270R which emits red (R) light, a light-emitting element 270G which emits green (G) light, and a light-emitting element 270B which emits blue (B) light.

Each of the light-emitting elements includes a pixel electrode 271, a hole-injection layer 281, a hole-transport layer 282, a light-emitting layer, an electron-transport layer 284, an electron-injection layer 285, and a common electrode 275 which are stacked in this order. The light-emitting element 270R includes a light-emitting layer 283R, the light-emitting element 270G includes a light-emitting layer 283G, and the light-emitting element 270B includes a light-emitting layer 283B. The light-emitting layer 283R includes a light-emitting substance which emits red light, the light-emitting layer 283G includes a light-emitting substance which emits green light, and the light-emitting layer 283B includes a light-emitting substance which emits blue light.

The light-emitting elements are electroluminescent elements which emit light to the common electrode 275 side by voltage application between the pixel electrodes 271 and the common electrode 275.

The light-receiving element 270PD includes the pixel electrode 271, the hole-injection layer 281, the hole-transport layer 282, an active layer 273, the electron-transport layer 284, the electron-injection layer 285, and the common electrode 275 which are stacked in this order.

The light-receiving element 270PD is a photoelectric conversion element that receives light entering from the outside of the display apparatus 280A and converts it into an electric signal.

In the description made in this embodiment, the pixel electrode 271 functions as an anode and the common electrode 275 functions as a cathode in both of the light-emitting element and the light-receiving element. In other words, when the light-receiving element is driven by application of reverse bias between the pixel electrode 271 and the common electrode 275, light entering the light-receiving element can be detected and charge can be generated and extracted as current.

In the display apparatus of this embodiment, an organic compound is used for the active layer 273 of the light-receiving element 270PD. In the light-receiving element 270PD, the layers other than the active layer 273 can be common to the layers in the light-emitting elements. Therefore, the light-receiving element 270PD can be formed concurrently with the formation of the light-emitting elements only by adding a step of depositing the active layer 273 in the manufacturing process of the light-emitting elements. The light-emitting elements and the light-receiving element 270PD can be formed over one substrate. Accordingly, the light-receiving element 270PD can be incorporated into the display apparatus without a significant increase in the number of manufacturing steps.

The display apparatus 280A is an example in which the light-receiving element 270PD and the light-emitting elements have a common structure except that the active layer 273 of the light-receiving element 270PD and the light-emitting layers 283 of the light-emitting elements are separately formed. Note that the structures of the light-receiving element 270PD and the light-emitting elements are not limited thereto. The light-receiving element 270PD and the light-emitting elements may include separately formed layers other than the active layer 273 and the light-emitting layers 283. The light-receiving element 270PD and the light-emitting elements preferably include at least one layer used in common (common layer). Thus, the light-receiving element 270PD can be incorporated into the display apparatus without a significant increase in the number of manufacturing steps.

A conductive film that transmits visible light is used as the electrode through which light is extracted, which is either the pixel electrode 271 or the common electrode 275. A conductive film that reflects visible light is preferably used as the electrode through which light is not extracted.

The light-emitting elements included in the display apparatus of this embodiment preferably employ a micro optical resonator (microcavity) structure. Thus, one of the pair of electrodes of the light-emitting elements is preferably an electrode having properties of transmitting and reflecting visible light (a semi-transmissive and semi-reflective electrode), and the other is preferably an electrode having a property of reflecting visible light (a reflective electrode). When the light-emitting elements have a microcavity structure, light obtained from the light-emitting layers can be resonated between both of the electrodes, whereby light emitted from the light-emitting elements can be intensified.

Note that the semi-transmissive and semi-reflective electrode can have a stacked-layer structure of a reflective electrode and an electrode having a property of transmitting visible light (also referred to as a transparent electrode).

The light transmittance of the transparent electrode is greater than or equal to 40%. For example, an electrode having a visible light (light at wavelengths greater than or equal to 400 nm and less than 750 nm) transmittance higher than or equal to 40% is preferably used in the light-emitting elements. The semi-transmissive and semi-reflective electrode has a visible light reflectance of higher than or equal to 10% and lower than or equal to 95%, preferably higher than or equal to 30% and lower than or equal to 80%. The reflective electrode has a visible light reflectance of higher than or equal to 40% and lower than or equal to 100%, preferably higher than or equal to 70% and lower than or equal to 100%. These electrodes preferably have a resistivity less than or equal to $1\times10^{-2}$ Ωcm. Note that in the case where any of the light-emitting elements emits near-infrared light (light with a wavelength greater than or equal to 750 nm and less than or equal to 1300 nm), the near-infrared light transmittance and reflectance of these electrodes preferably satisfy the above-described numerical ranges of the visible light transmittance and reflectance.

The light-emitting element includes at least the light-emitting layer 283. The light-emitting element may further include, as a layer other than the light-emitting layer 283, a layer containing a substance with a high hole-injection property, a substance with a high hole-transport property, a hole-blocking material, a substance with a high electron-transport property, a substance with a high electron-injection property, an electron-blocking material, a substance with a bipolar property (a substance with a high electron- and hole-transport property), or the like.

For example, the light-emitting elements and the light-receiving element can share at least one of the hole-injection layer, the hole-transport layer, the electron-transport layer, and the electron-injection layer. Furthermore, at least one of the hole-injection layer, the hole-transport layer, the electron-transport layer, and the electron-injection layer can be separately formed for the light-emitting elements and the light-receiving element.

The hole-injection layer is a layer injecting holes from an anode to the hole-transport layer, and a layer containing a material with a high hole-injection property. As the material with a high hole-injection property, an aromatic amine compound and a composite material containing a hole-transport material and an acceptor material (electron-accepting material) can be used.

In the light-emitting element, the hole-transport layer is a layer transporting holes, which are injected from the anode by the hole-injection layer, to the light-emitting layer. In the light-receiving element, the hole-transport layer is a layer transporting holes, which are generated in the active layer on the basis of incident light, to the anode. The hole-transport layer is a layer including a hole-transport material. As the hole-transport material, a substance having a hole mobility of greater than or equal to $1\times10^{-6}$ cm$^2$/Vs is preferable. Note that other substances can also be used as long as they have a property of transporting more holes than electrons. As the hole-transport material, materials having a high hole-transport property, such as a π-electron-rich heteroaromatic compound (e.g., a carbazole derivative, a thiophene derivative, and a furan derivative) and an aromatic amine (a compound having an aromatic amine skeleton), are preferable.

In the light-emitting element, the electron-transport layer is a layer transporting electrons, which are injected from the cathode by the electron-injection layer, to the light-emitting layer. In the light-receiving element, the electron-transport layer is a layer transporting electrons, which are generated in the active layer on the basis of incident light, to the cathode. The electron-transport layer is a layer including an electron-transport material. As the electron-transport material, a substance having an electron mobility of greater than or equal to $1\times10^{-6}$ cm$^2$/Vs is preferable. Note that other substances can also be used as long as they have a property of transporting more electrons than holes. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

The electron-injection layer is a layer injecting electrons from a cathode to the electron-transport layer, and a layer containing a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The light-emitting layer 283 is a layer containing a light-emitting substance. The light-emitting layer 283 can contain one or more kinds of light-emitting substances. As the light-emitting substance, a substance that exhibits an emission color of blue, purple, bluish purple, green, yellowish green, yellow, orange, red, or the like is appropriately used. As the light-emitting substance, a substance that emits near-infrared light can also be used.

Examples of the light-emitting substance include a fluorescent material, a phosphorescent material, a TADF material, and a quantum dot material.

Examples of the fluorescent material are a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer 283 may contain one or more kinds of organic compounds (e.g., a host material and an assist material) in addition to the light-emitting substance (a guest material). As the one or more kinds of organic compounds, one or both of the hole-transport material and the electron-transport material can be used. As the one or more kinds of organic compounds, a bipolar material or a TADF material may be used.

The light-emitting layer 283 preferably includes a phosphorescent material and a combination of a hole-transport material and an electron-transport material that easily forms an exciplex. With such a structure, light emission can be efficiently obtained by ExTET (Exciplex-Triplet Energy Transfer), which is energy transfer from an exciplex to a light-emitting substance (a phosphorescent material). When a combination of materials is selected so as to form an exciplex that exhibits light emission whose wavelength overlaps with the wavelength of a lowest-energy-side absorption band of the light-emitting substance, energy can be transferred smoothly and light emission can be obtained efficiently. With this structure, high efficiency, low-voltage driving, and a long lifetime of the light-emitting element can be achieved at the same time.

In the combination of materials for forming an exciplex, the HOMO level (the highest occupied molecular orbital level) of the hole-transport material is preferably higher than or equal to the HOMO level of the electron-transport material. In addition, the LUMO level (the lowest unoccupied molecular orbital level) of the hole-transport material is preferably higher than or equal to that of the electron-transport material. Note that the LUMO levels and the HOMO levels of the materials can be derived from the electrochemical characteristics (the reduction potentials and the oxidation potentials) of the materials that are measured by cyclic voltammetry (CV).

Note that the formation of an exciplex can be confirmed by a phenomenon in which the emission spectrum of a mixed film in which the hole-transport material and the electron-transport material are mixed is shifted to the longer wavelength side than the emission spectrum of each of the materials (or has another peak on the longer wavelength side), observed by comparison of the emission spectra of the hole-transport material, the electron-transport material, and the mixed film of these materials, for example. Alternatively, the formation of an exciplex can be confirmed by a difference in transient response, such as a phenomenon in which the transient photoluminescence (PL) lifetime of the mixed film has longer lifetime components or has a larger proportion of delayed components than that of each of the materials, observed by comparison of the transient PL of the hole-transport material, the transient PL of the electron-transport material, and the transient PL of the mixed film of these materials. The transient PL can be rephrased as transient electroluminescence (EL). That is, the formation of an exciplex can also be confirmed by a difference in transient response observed by comparison of the transient EL of the hole-transport material, the transient EL of the electron-transport material, and the transient EL of the mixed film of these materials.

The active layer 273 includes a semiconductor. Examples of the semiconductor include an inorganic semiconductor such as silicon and an organic semiconductor including an organic compound. This embodiment shows an example in which an organic semiconductor is used as the semiconductor included in the active layer 273. The use of an organic semiconductor is preferable because the light-emitting layer 283 and the active layer 273 can be formed by the same method (e.g., a vacuum evaporation method) and thus the same manufacturing apparatus can be used.

Examples of an n-type semiconductor material included in the active layer 273 are electron-accepting organic semiconductor materials such as fullerene (e.g., $C_{60}$ and $C_{70}$) and a fullerene derivative. Fullerene has a soccer ball-like shape, which is energetically stable. Both the HOMO level and the LUMO level of fullerene are deep (low). Having a deep LUMO level, fullerene has an extremely high electron-accepting property (acceptor property). When π-electron conjugation (resonance) spreads in a plane as in benzene, the electron-donating property (donor property) usually increases. Although π-electrons widely spread in fullerene having a spherical shape, its electron-accepting property is high. The high electron-accepting property efficiently causes rapid charge separation and is useful for a light-receiving element. Both $C_{60}$ and $C_{70}$ have a wide absorption band in the visible light region, and $C_{70}$ is especially preferable because of having a larger π-electron conjugation system and a wider absorption band in the long wavelength region than $C_{60}$.

Examples of the n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer 273 include electron-donating organic semiconductor materials such as copper(II) phthalocyanine (CuPc), tetraphenyldibenzoperiflanthene (DBP), or zinc phthalocyanine (ZnPc), tin phthalocyanine (SnPc), and quinacridone.

Examples of a p-type semiconductor material include a carbazole derivative, a thiophene derivative, a furan derivative, and a compound having an aromatic amine skeleton. Other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For example, the active layer 273 is preferably formed by co-evaporation of an n-type semiconductor and a p-type semiconductor.

Either a low molecular compound or a high molecular compound can be used for the light-emitting element and the light-receiving element, and an inorganic compound may also be contained. Each of the layers included in the light-emitting element and the light-receiving element can be formed by an evaporation method (including a vacuum evaporation method), a transfer method, a printing method, an inkjet method, a coating method, or the like.

Figure 10B:
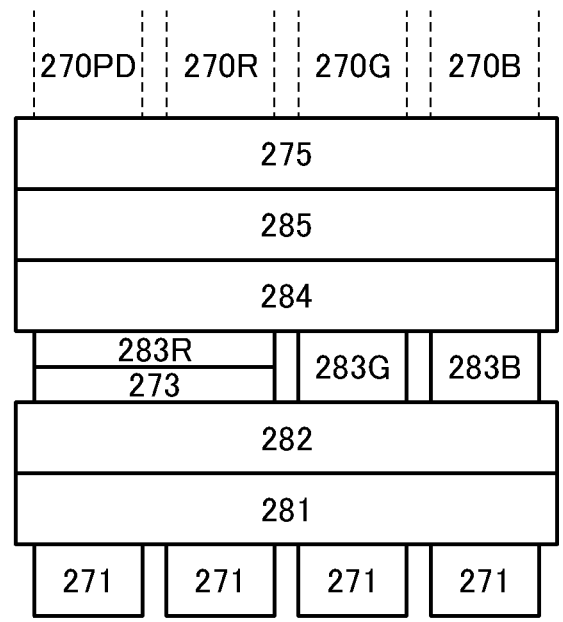

A display apparatus 280B shown in FIG. 10B is different from the display apparatus 280A in that the light-receiving element 270PD and the light-emitting element 270R have the same structure.

The light-receiving element 270PD and the light-emitting element 270R share the active layer 273 and the light-emitting layer 283R.

Here, it is preferable that the light-receiving element 270PD have a structure in common with the light-emitting element which emits light with a wavelength longer than that of the light desired to be detected. For example, the light-receiving element 270PD having a structure in which blue light is detected can have a structure which is similar to that of one or both of the light-emitting element 270R and the light-emitting element 270G. For example, the light-receiving element 270PD having a structure in which green light is detected can have a structure similar to that of the light-emitting element 270R.

When the light-receiving element 270PD and the light-emitting element 270R have a common structure, the number of deposition steps and the number of masks can be smaller than those for the structure in which the light-receiving element 270PD and the light-emitting element 270R include separately formed layers. As a result, the number of manufacturing steps and the manufacturing cost of the display apparatus can be reduced.

When the light-receiving element 270PD and the light-emitting element 270R have a common structure, a margin for misalignment can be narrower than that for the structure in which the light-receiving element 270PD and the light-emitting element 270R include separately formed layers. Accordingly, the aperture ratio of a pixel can be increased, so that the light extraction efficiency of the display apparatus can be increased. This can extend the life of the light-emitting element. Furthermore, the display apparatus can exhibit a high luminance. Moreover, the definition of the display apparatus can also be increased.

The light-emitting layer 283R includes a light-emitting material that emits red light. The active layer 273 contains an organic compound that absorbs light with a wavelength shorter than that of red light (e.g., one or both of green light and blue light). The active layer 273 preferably contains an organic compound that does not easily absorb red light and that absorbs light with a wavelength shorter than that of red light. In this way, red light can be efficiently extracted from the light-emitting element 270R, and the light-receiving element 270PD can detect light with a wavelength shorter than that of red light at high accuracy.

Although the light-emitting element 270R and the light-receiving element 270PD have the same structure in an example of the display apparatus 280B, the light-emitting element 270R and the light-receiving element 270PD may include optical adjustment layers with different thicknesses.

A display apparatus 280C shown in FIG. 11A and FIG. 11B includes a light-emitting and light-receiving element 270SR that emits red (R) light and has a light-receiving function, the light-emitting element 270G that emits green (G) light, and the light-emitting element 270B that emits blue (B) light.

Each of the light-emitting elements includes the pixel electrode 271, the hole-injection layer 281, the hole-transport layer 282, a light-emitting layer, the electron-transport layer 284, the electron-injection layer 285, and the common electrode 275 which are stacked in this order. The light-emitting element 270G includes the light-emitting layer 283G, and the light-emitting element 270B includes the light-emitting layer 283B. The light-emitting layer 283G includes a light-emitting substance which emits green light, and the light-emitting layer 283B includes a light-emitting substance which emits blue light.

The light-emitting and light-receiving element 270SR includes the pixel electrode 271, the hole-injection layer 281, the hole-transport layer 282, the active layer 273, the light-emitting layer 283R, the electron-transport layer 284, the electron-injection layer 285, and the common electrode 275 which are stacked in this order.

Note that the light-emitting and light-receiving element 270SR included in the display apparatus 280C has the same structure as the light-emitting element 270R and the light-receiving element 270PD included in the display apparatus 280B. Furthermore, the light-emitting elements 270G and 270B included in the display apparatus 280C also have the same structures as the light-emitting elements 270G and 270B, which are included in the display apparatus 280B.

FIG. 11A shows a case where the light-emitting and light-receiving element 270SR functions as a light-emitting element. In the example of FIG. 11A, the light-emitting element 270B emits blue light, the light-emitting element 270G emits green light, and the light-emitting and light-receiving element 270SR emits red light.

FIG. 11B shows a case where the light-emitting and light-receiving element 270SR functions as a light-receiving element. In the example of FIG. 11B, the light-emitting and light-receiving element 270SR detects blue light emitted by the light-emitting element 270B and green light emitted by the light-emitting element 270G.

The light-emitting element 270B, the light-emitting element 270G, and the light-emitting and light-receiving element 270SR each include the pixel electrode 271 and the common electrode 275. In this embodiment, the case where the pixel electrode 271 functions as an anode and the common electrode 275 functions as a cathode is described as an example.

In the description made in this embodiment, also in the light-emitting and light-receiving element 270SR, the pixel electrode 271 functions as an anode and the common electrode 275 functions as a cathode as in the light-emitting element. In other words, when the light-emitting and light-receiving element 270SR is driven by application of reverse bias between the pixel electrode 271 and the common electrode 275, light entering the light-emitting and light-receiving element 270SR can be detected and charge can be generated and extracted as current.

Note that it can be said that the light-emitting and light-receiving element 270SR shown in FIG. 11A and FIG. 11B has a structure in which the active layer 273 is added to the light-emitting element. That is, the light-emitting and light-receiving element 270SR can be formed concurrently with the formation of the light-emitting element only by adding a step of depositing the active layer 273 in the manufacturing process of the light-emitting element. The light-emitting element and the light-emitting and light-receiving element can be formed over one substrate. Thus, one or both of an image capturing function and a sensing function can be provided to the display portion without a significant increase in the number of manufacturing steps.

The stacking order of the light-emitting layer 283R and the active layer 273 is not limited. FIG. 11A and FIG. 11B each show an example in which the active layer 273 is provided over the hole-transport layer 282, and the light-emitting layer 283R is provided over the active layer 273. The light-emitting layer 283R may be provided over the hole-transport layer 282, and the active layer 273 may be provided over the light-emitting layer 283R.

As shown in FIG. 11A and FIG. 11B, the active layer 273 and the light-emitting layer 283R may be in contact with each other. Furthermore, a buffer layer may be interposed between the active layer 273 and the light-emitting layer 283R. As the buffer layer, at least one layer of a hole-injection layer, a hole-transport layer, an electron-transport layer, an electron-injection layer, a hole-blocking layer, an electron-blocking layer, and the like can be used.

The buffer layer provided between the active layer 273 and the light-emitting layer 283R can inhibit transfer of excitation energy from the light-emitting layer 283R to the active layer 273. Furthermore, the buffer layer can also be used to adjust the optical path length (cavity length) of the microcavity structure. Thus, high emission efficiency can be obtained from a light-emitting and light-receiving element including the buffer layer between the active layer 273 and the light-emitting layer 283R.

The light-emitting and light-receiving element may exclude at least one layer of the hole-injection layer 281, the hole-transport layer 282, the electron-transport layer 284, and the electron-injection layer 285. Furthermore, the light-emitting and light-receiving element may include another functional layer such as a hole-blocking layer or an electron-blocking layer.

The light-emitting and light-receiving element may include a layer that serves as both a light-emitting layer and an active layer without including the active layer 273 and the light-emitting layer 283R. As the layer serving as both a light-emitting layer and an active layer, a layer containing three materials which are an n-type semiconductor that can be used for the active layer 273, a p-type semiconductor that can be used for the active layer 273, and a light-emitting substance that can be used for the light-emitting layer 283R can be used, for example.

Note that an absorption band on the lowest energy side of an absorption spectrum of a mixed material of the n-type semiconductor and the p-type semiconductor and a maximum peak of an emission spectrum (PL spectrum) of the light-emitting substance preferably do not overlap with each other and are further preferably positioned fully apart from each other.

In the light-emitting and light-receiving element, a conductive film that transmits visible light is used as the electrode through which light is extracted. A conductive film that reflects visible light is preferably used as the electrode through which light is not extracted.

The functions and materials of the layers constituting the light-emitting and light-receiving element are similar to those of the layers constituting the light-emitting elements and the light-receiving element and not described in detail.

A detailed structure of the display apparatus of one embodiment of the present invention is described below with reference to FIG. 12 to FIG. 13.

[Display Apparatus 100A]

Figure 12A:
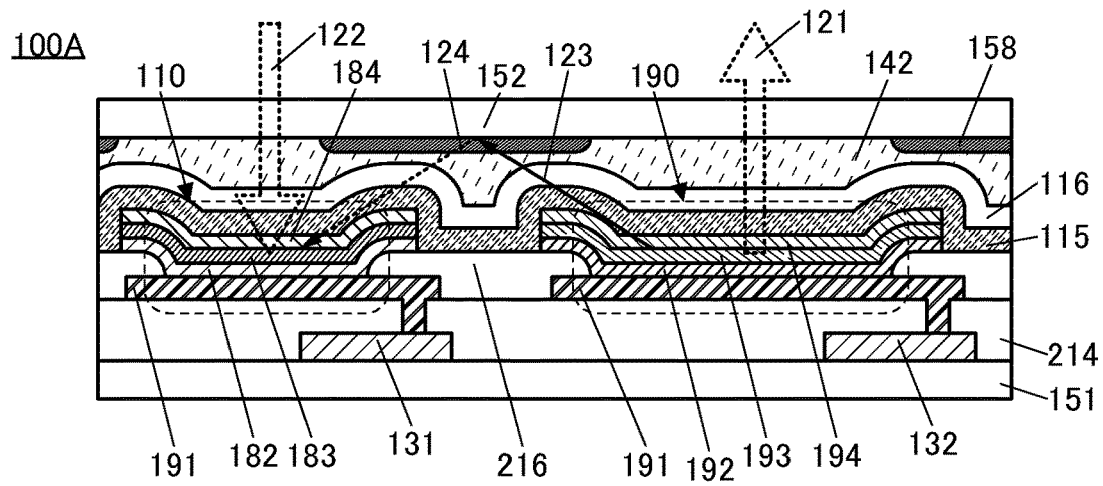
FIG. 12A to FIG. 12C are cross-sectional views showing examples of a display apparatus.

FIG. 12A is a cross-sectional view of a display apparatus 100A.

The display apparatus 100A includes a light-receiving element 110 and a light-emitting element 190.

The light-emitting element 190 includes a pixel electrode 191, a buffer layer 192, a light-emitting layer 193, a buffer layer 194, and a common electrode 115 which are stacked in this order. The buffer layer 192 can include one or both of a hole-injection layer and a hole-transport layer. The light-emitting layer 193 contains an organic compound. The buffer layer 194 can include one or both of an electron-injection layer and an electron-transport layer. The light-emitting element 190 has a function of emitting visible light.

Note that the display apparatus 100A may also include a light-emitting element having a function of emitting infrared light.

The light-receiving element 110 includes the pixel electrode 191, a buffer layer 182, an active layer 183, a buffer layer 184, and the common electrode 115 which are stacked in this order. The buffer layer 182 can include a hole-transport layer. The active layer 183 contains an organic compound. The buffer layer 184 can include an electron-transport layer. The light-receiving element 110 has a function of detecting visible light. Note that the light-receiving element 110 may also have a function of detecting infrared light.

This embodiment is described assuming that the pixel electrode 191 functions as an anode and the common electrode 115 functions as a cathode in both of the light-emitting element 190 and the light-receiving element 110. In other words, the light-receiving element 110 is driven by application of reverse bias between the pixel electrode 191 and the common electrode 115, so that light entering the light-receiving element 110 can be detected and charge can be generated and extracted as current in the display apparatus 100A.

The pixel electrode 191, the buffer layer 182, the buffer layer 192, the active layer 183, the light-emitting layer 193, the buffer layer 184, the buffer layer 194, and the common electrode 115 may each have a single-layer structure or a stacked-layer structure.

The pixel electrodes 191 are positioned over an insulating layer 214. The pixel electrodes 191 can be formed using the same material in the same step. End portions of the pixel electrodes 191 are covered with a partition 216. The two pixel electrodes 191 adjacent to each other are electrically insulated (electrically isolated) from each other by the partition 216.

An organic insulating film is suitable for the partition 216. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins. The partition 216 is a layer that transmits visible light. A partition that blocks visible light may be provided instead of the partition 216.

The common electrode 115 is a layer shared by the light-receiving element 110 and the light-emitting element 190.

The material, thickness, and the like of the pair of electrodes can be the same between the light-receiving element 110 and the light-emitting element 190. Accordingly, the manufacturing cost of the display apparatus can be reduced and the manufacturing process of the display apparatus can be simplified.

The display apparatus 100A includes the light-receiving element 110, the light-emitting element 190, a transistor 131, a transistor 132, and the like between a pair of substrates (a substrate 151 and a substrate 152).

In the light-receiving element 110, the buffer layer 182, the active layer 183, and the buffer layer 184, which are positioned between the pixel electrode 191 and the common electrode 115, can each be referred to as an organic layer (a layer containing an organic compound). The pixel electrode 191 preferably has a function of reflecting visible light. The common electrode 115 has a function of transmitting visible light. Note that in the case where the light-receiving element 110 is configured to detect infrared light, the common electrode 115 has a function of transmitting infrared light.

Furthermore, the pixel electrode 191 preferably has a function of reflecting infrared light.

The light-receiving element 110 has a function of detecting light. Specifically, the light-receiving element 110 is a photoelectric conversion element that receives light 122 entering from the outside of the display apparatus 100A and converts it into an electric signal. The light 122 can also be expressed as light that is emitted from the light-emitting element 190 and then reflected by an object. The light 122 may enter the light-receiving element 110 through a lens or the like provided in the display apparatus 100A.

In the light-emitting element 190, the buffer layer 192, the light-emitting layer 193, and the buffer layer 194, which are positioned between the pixel electrode 191 and the common electrode 115, can be collectively referred to as an EL layer. The EL layer includes at least the light-emitting layer 193. As described above, the pixel electrode 191 preferably has a function of reflecting visible light. The common electrode 115 has a function of transmitting visible light. Note that in the case where the display apparatus 100A includes a light-emitting element that emits infrared light, the common electrode 115 has a function of transmitting infrared light. Furthermore, the pixel electrode 191 preferably has a function of reflecting infrared light.

The light-emitting element included in the display apparatus of this embodiment preferably employ a micro optical resonator (microcavity) structure.

The buffer layer 192 or the buffer layer 194 may have a function as an optical adjustment layer. By changing the thickness of the buffer layer 192 or the buffer layer 194, light of a particular color can be intensified and taken out from each light-emitting element.

The light-emitting element 190 has a function of emitting visible light. Specifically, the light-emitting element 190 is an electroluminescent element that emits light to the substrate 152 side by applying voltage between the pixel electrode 191 and the common electrode 115 (see light emission 121).

The pixel electrode 191 included in the light-receiving element 110 is electrically connected to a source or a drain of the transistor 131 through an opening provided in the insulating layer 214.

The pixel electrode 191 included in the light-emitting element 190 is electrically connected to a source or a drain of the transistor 132 through an opening provided in the insulating layer 214.

The transistor 131 and the transistor 132 are on and in contact with the same layer (the substrate 151 in FIG. 12A).

At least part of a circuit electrically connected to the light-receiving element 110 and a circuit electrically connected to the light-emitting element 190 are preferably formed using the same material in the same step. In that case, the thickness of the display apparatus can be reduced compared with the case where the two circuits are separately formed, resulting in simplification of the manufacturing steps.

The light-receiving element 110 and the light-emitting element 190 are preferably covered with a protective layer 116. In FIG. 12A, the protective layer 116 is provided on and in contact with the common electrode 115. Providing the protective layer 116 can inhibit entry of impurities such as water into the light-receiving element 110 and the light-emitting element 190, so that the reliability of the light-receiving element 110 and the light-emitting element 190 can be increased. The protective layer 116 and the substrate 152 are bonded to each other with an adhesive layer 142.

A light shielding layer 158 is provided on a surface of the substrate 152 on the substrate 151 side. The light shielding layer 158 has openings in a position overlapping with the light-emitting element 190 and in a position overlapping with the light-receiving element 110.

Here, the light-receiving element 110 detects light that is emitted from the light-emitting element 190 and then reflected by an object. However, in some cases, light emitted from the light-emitting element 190 is reflected inside the display apparatus 100A and enters the light-receiving element 110 without through an object. The light shielding layer 158 can reduce the influence of such stray light. For example, in the case where the light shielding layer 158 is not provided, light 123 emitted from the light-emitting element 190 is reflected by the substrate 152 and reflected light 124 enters the light-receiving element 110 in some cases. Providing the light shielding layer 158 can inhibit entry of the reflected light 124 into the light-receiving element 110. Consequently, noise can be reduced, and the sensitivity of a sensor using the light-receiving element 110 can be increased.

For the light shielding layer 158, a material that blocks light emitted from the light-emitting element can be used. The light shielding layer 158 preferably absorbs visible light. As the light shielding layer 158, a black matrix can be formed using a metal material or a resin material containing pigment (e.g., carbon black) or dye, for example. The light shielding layer 158 may have a stacked-layer structure of a red color filter, a green color filter, and a blue color filter.

[Display Apparatus 100B]

Figure 12B:
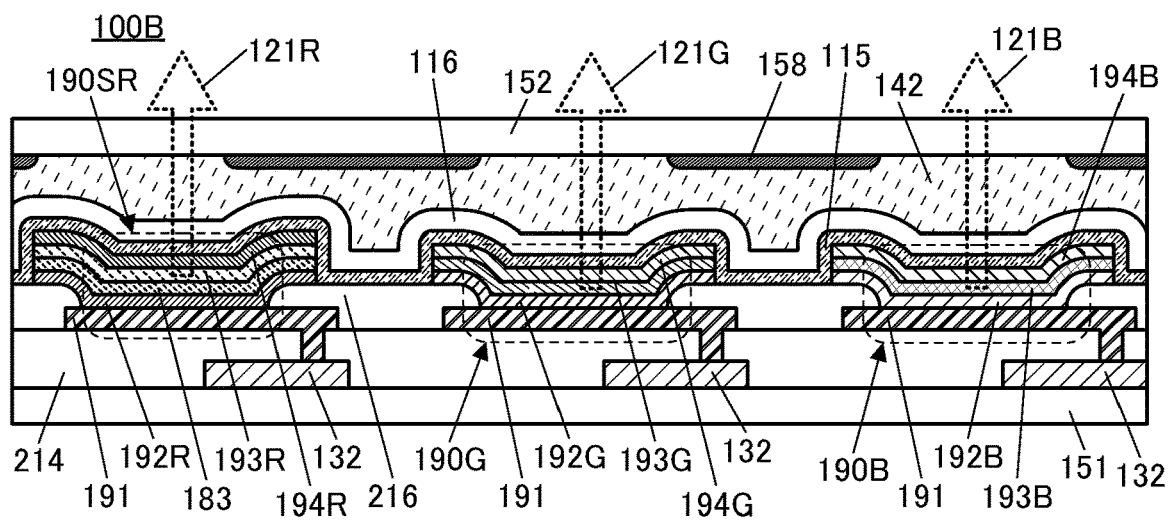
Figure 12C:
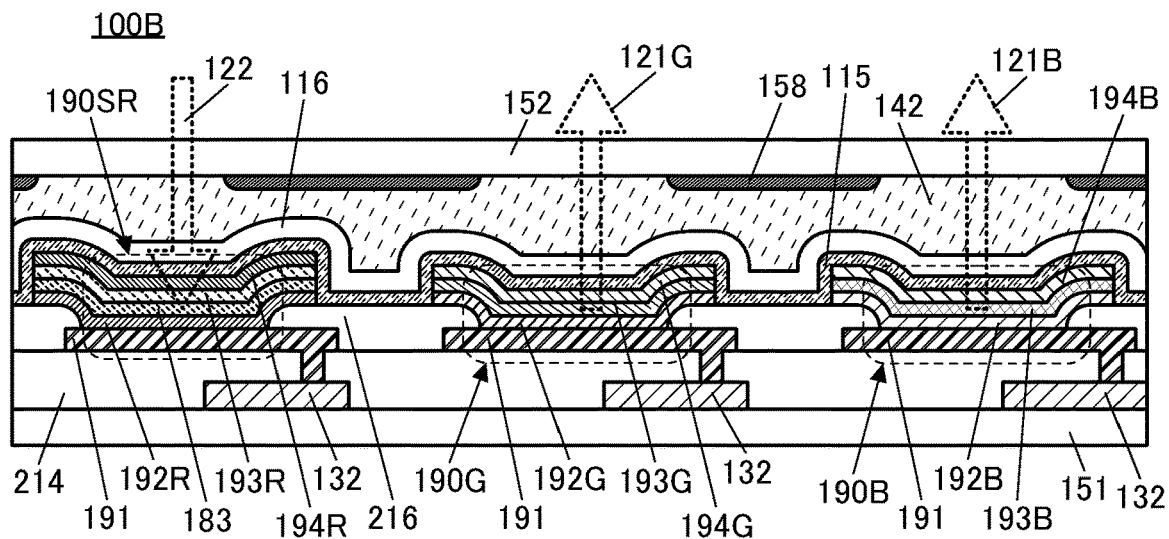

FIG. 12B and FIG. 12C show cross-sectional views of a display apparatus 100B. Note that in the description of the display apparatus below, components similar to those of the above-mentioned display apparatus are not described in some cases.

The display apparatus 100B includes a light-emitting element 190B, a light-emitting element 190G, and a light-emitting and light-receiving element 190SR.

The light-emitting element 190B includes the pixel electrode 191, a buffer layer 192B, a light-emitting layer 193B, and a buffer layer 194B, and the common electrode 115 which are stacked in this order. The light-emitting element 190B has a function of emitting blue light 121B.

The light-emitting element 190G includes the pixel electrode 191, a buffer layer 192G, a light-emitting layer 193G, a buffer layer 194G, and the common electrode 115 which are stacked in this order. The light-emitting element 190G has a function of emitting green light 121G.

The light-emitting and light-receiving element 190SR includes the pixel electrode 191, a buffer layer 192R, the active layer 183, a light-emitting layer 193R, a buffer layer 194R, and the common electrode 115 which are stacked in this order. The light-emitting and light-receiving element 190SR has a function of emitting red light 121R and a function of detecting the light 122.

FIG. 12B shows a case where the light-emitting and light-receiving element 190SR functions as a light-emitting element. FIG. 12B shows an example in which the light-emitting element 190B emits blue light, the light-emitting element 190G emits green light, and the light-emitting and light-receiving element 190SR emits red light.

FIG. 12C shows a case where the light-emitting and light-receiving element 190SR functions as a light receiving element. FIG. 12C shows an example in which the light-emitting and light-receiving element 190SR detects blue light emitted by the light-emitting element 190B and green light emitted by the light-emitting element 190G.

The display apparatus 100B includes the light-emitting and light-receiving element 190SR, the light-emitting element 190G, the light-emitting element 190B, the transistor 132, and the like between a pair of substrates (the substrate 151 and a substrate 152).

The pixel electrode 191 is positioned over the insulating layer 214. The two pixel electrodes 191 adjacent to each other are electrically insulated from each other by the partition 216. The pixel electrode 191 is electrically connected to the source or the drain of the transistor 132 through the opening provided in the insulating layer 214.

The light-emitting and light-receiving element and the light-emitting elements are preferably covered with the protective layer 116. The protective layer 116 and the substrate 152 are bonded to each other with the adhesive layer 142. The light shielding layer 158 is provided on the surface of the substrate 152 on the substrate 151 side.

[Display Apparatus 100C]

Figure 13A:
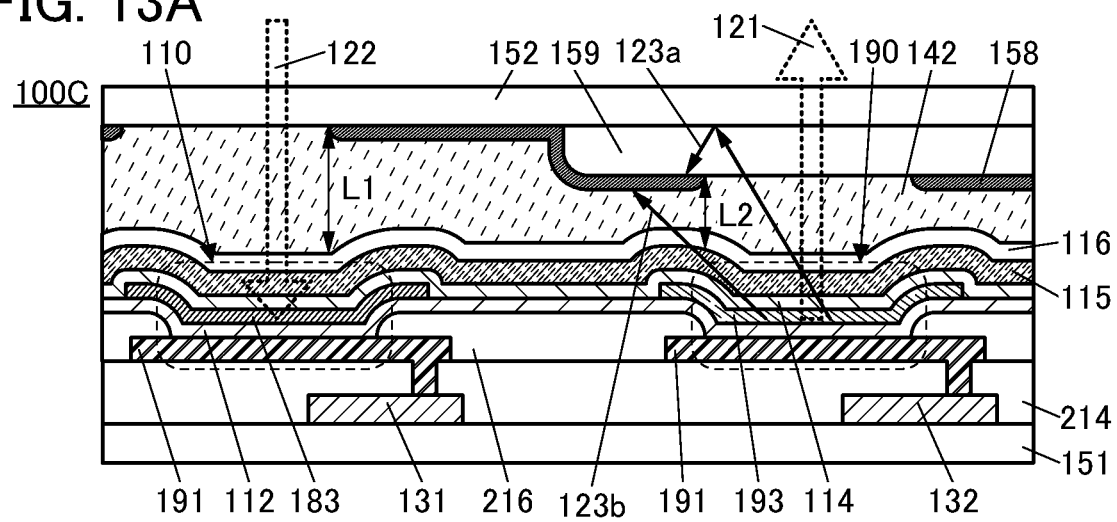
FIG. 13A is a cross-sectional view showing an example of a display apparatus.

FIG. 13A shows a cross-sectional view of a display apparatus 100C.

The display apparatus 100C includes the light-receiving element 110 and the light-emitting element 190.

The light-emitting element 190 includes the pixel electrode 191, a common layer 112, the light-emitting layer 193, a common layer 114, and the common electrode 115 in this order. The common layer 112 can include one or both of a hole-injection layer and a hole-transport layer. The light-emitting layer 193 contains an organic compound. The common layer 114 can include one or both of an electron-injection layer and an electron-transport layer. The light-emitting element 190 has a function of emitting visible light. Note that the display apparatus 100C may also include a light-emitting element having a function of emitting infrared light.

The light-receiving element 110 includes the pixel electrode 191, the common layer 112, the active layer 183, the common layer 114, and the common electrode 115 which are stacked in this order. The active layer 183 contains an organic compound. The light-receiving element 110 has a function of detecting visible light. Note that the light-receiving element 110 may also have a function of detecting infrared light.

The pixel electrode 191, the common layer 112, the active layer 183, the light-emitting layer 193, the common layer 114, and the common electrode 115 may each have a single-layer structure or a stacked-layer structure.

The pixel electrode 191 is positioned over the insulating layer 214. The two pixel electrodes 191 adjacent to each other are electrically insulated from each other by the partition 216. The pixel electrode 191 is electrically connected to the source or the drain of the transistor 132 through the opening provided in the insulating layer 214.

The common layer 112, the common layer 114, and the common electrode 115 are layers shared by the light-receiving element 110 and the light-emitting element 190. At least some of the layers constituting the light-receiving element 110 and the light-emitting element 190 preferably have common structures, in which case the number of manufacturing steps of the display apparatus can be reduced.

The display apparatus 100C includes the light-receiving element 110, the light-emitting element 190, the transistor 131, the transistor 132, and the like between the pair of substrates (the substrate 151 and the substrate 152).

The light-receiving element 110 and the light-emitting element 190 are preferably covered with the protective layer 116. The protective layer 116 and the substrate 152 are bonded to each other with the adhesive layer 142.

A resin layer 159 is provided on the surface of the substrate 152 on the substrate 151 side. The resin layer 159 is provided in a position overlapping with the light-emitting element 190 and is not provided in a position overlapping with the light-receiving element 110.

Figure 13B:
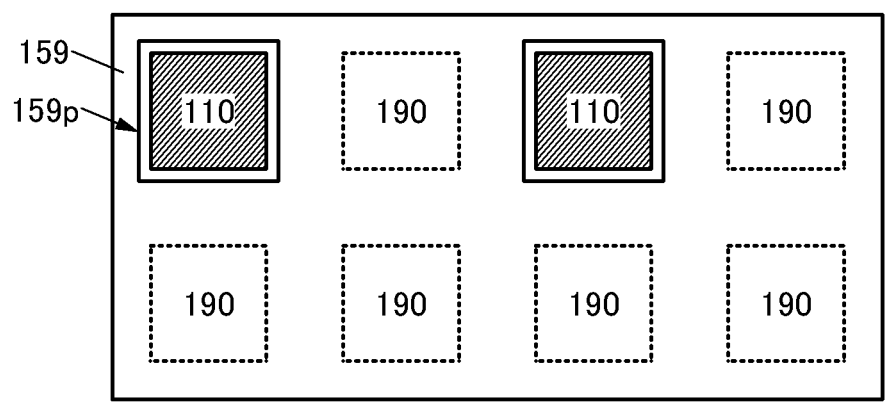
FIG. 13B and FIG. 13C are diagrams showing examples of a top surface layout of a resin layer.
Figure 13C:
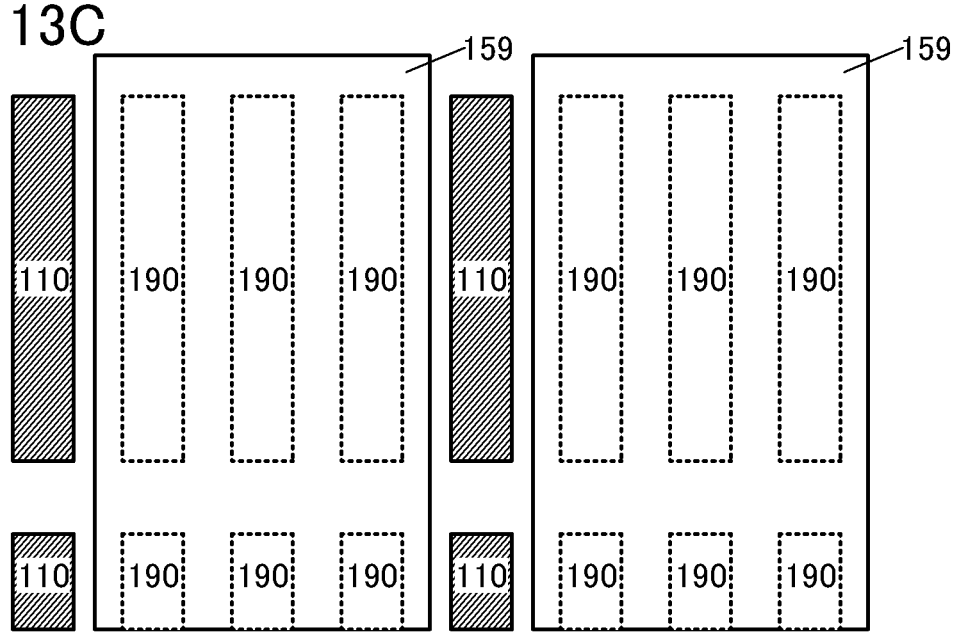

The resin layer 159 can be provided in the position overlapping with the light-emitting element 190 and have an opening 159p in the position overlapping with the light-receiving element 110, as shown in FIG. 13B, for example. Alternatively, as shown in FIG. 13C, the resin layer 159 can be provided to have an island shape in a position overlapping with the light-emitting element 190 but not in a position overlapping with the light-receiving element 110.

The light shielding layer 158 is provided on the surface of the substrate 152 on the substrate 151 side and on a surface of the resin layer 159 on the substrate 151 side. The light shielding layer 158 has openings in a position overlapping with the light-emitting element 190 and in a position overlapping with the light-receiving element 110.

Here, the light-receiving element 110 detects light that is emitted from the light-emitting element 190 and then reflected by an object. However, in some cases, light emitted from the light-emitting element 190 is reflected inside the display apparatus 100C and enters the light-receiving element 110 without through an object. The light shielding layer 158 can absorb such stray light and thereby reduce entry of stray light into the light-receiving element 110. For example, the light shielding layer 158 can absorb stray light 123a that has passed through the resin layer 159 and has been reflected by the surface of the substrate 152 on the substrate 151 side. Moreover, the light shielding layer 158 can absorb stray light 123b before the stray light 123b reaches the resin layer 159. This can inhibit stray light from entering the light-receiving element 110. Consequently, noise can be reduced, and the sensitivity of a sensor using the light-receiving element 110 can be increased. It is particularly preferable that the light shielding layer 158 be positioned close to the light-emitting element 190, in which case stray light can be further reduced. This is preferable also in terms of improving display quality, because the light shielding layer 158 positioned close to the light-emitting element 190 can inhibit viewing angle dependence of display.

Providing the light shielding layer 158 can control the range where the light-receiving element 110 detects light. When the light shielding layer 158 is positioned apart from the light-receiving element 110, the image-capturing range is narrowed, and the image-capturing resolution can be increased.

In the case where the resin layer 159 has an opening, the light shielding layer 158 preferably covers at least part of the opening and at least part of a side surface of the resin layer 159 exposed in the opening.

In the case where the resin layer 159 is provided in an island shape, the light shielding layer 158 preferably covers at least part of a side surface of the resin layer 159.

Since the light shielding layer 158 is provided along the shape of the resin layer 159 in such a manner, the distance from the light shielding layer 158 to the light-emitting element 190 (specifically, the light-emitting region of the light-emitting element 190) is shorter than the distance from the light shielding layer 158 to the light-receiving element 110 (specifically, the light-receiving region of the light-receiving element 110). Accordingly, noise of the sensor can be reduced, the imaging resolution can be increased, and viewing angle dependence of display can be inhibited. Thus, both the display quality and imaging quality of the display apparatus can be increased.

The resin layer 159 is a layer that transmits light emitted from the light-emitting element 190. Examples of materials for the resin layer 159 include an acrylic resin, a polyimide resin, an epoxy resin, a polyamide resin, a polyimide-amide resin, a siloxane resin, a benzocyclobutene-based resin, a phenol resin, and precursors of these resins. Note that a component provided between the substrate 152 and the light shielding layer 158 is not limited to the resin layer and may be an inorganic insulating film or the like. As the component becomes thicker, a larger difference occurs between the distance from the light shielding layer to the light-receiving element and the distance from the light shielding layer to the light-emitting element. An organic insulating film such as a resin or the like is suitable for the component because it is easily formed to have a large thickness.

In order to compare the distance from the light shielding layer 158 to the light-receiving element 110 and the distance from the light shielding layer 158 to the light-emitting element 190, it is possible to use, for example, the shortest distance L1 from an end portion of the light shielding layer 158 on the light-receiving element 110 side to the common electrode 115 and the shortest distance L2 from an end portion of the light shielding layer 158 on the light-emitting element 190 side to the common electrode 115. With the shortest distance L2 smaller than the shortest distance L1, stray light from the light-emitting element 190 can be inhibited, and the sensitivity of the sensor using the light-receiving element 110 can be increased. Furthermore, viewing angle dependence of display can be inhibited. With the shortest distance L1 larger than the shortest distance L2, the image-capturing range of the light-receiving element 110 can be narrowed, and the image-capturing resolution can be increased.

In addition, when the adhesive layer 142 is provided such that a portion overlapping with the light-receiving element 110 is made thicker than a portion overlapping with the light-emitting element 190, a difference also can be made between the distance from the light shielding layer 158 to the light-receiving element 110 and the distance from the light shielding layer 158 to the light-emitting element 190.

A more detailed structure of the display apparatus of one embodiment of the present invention is described below with reference to FIG. 14 to FIG. 17.

[Display Apparatus 100D]

Figure 14:
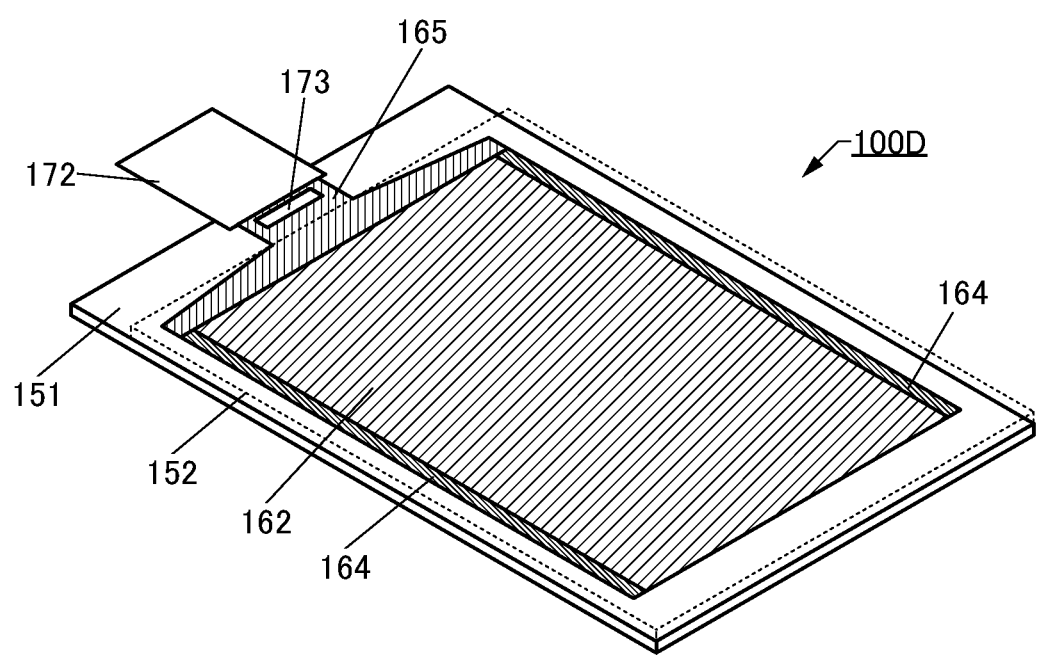
FIG. 14 is a perspective view showing an example of a display apparatus.
Figure 15:
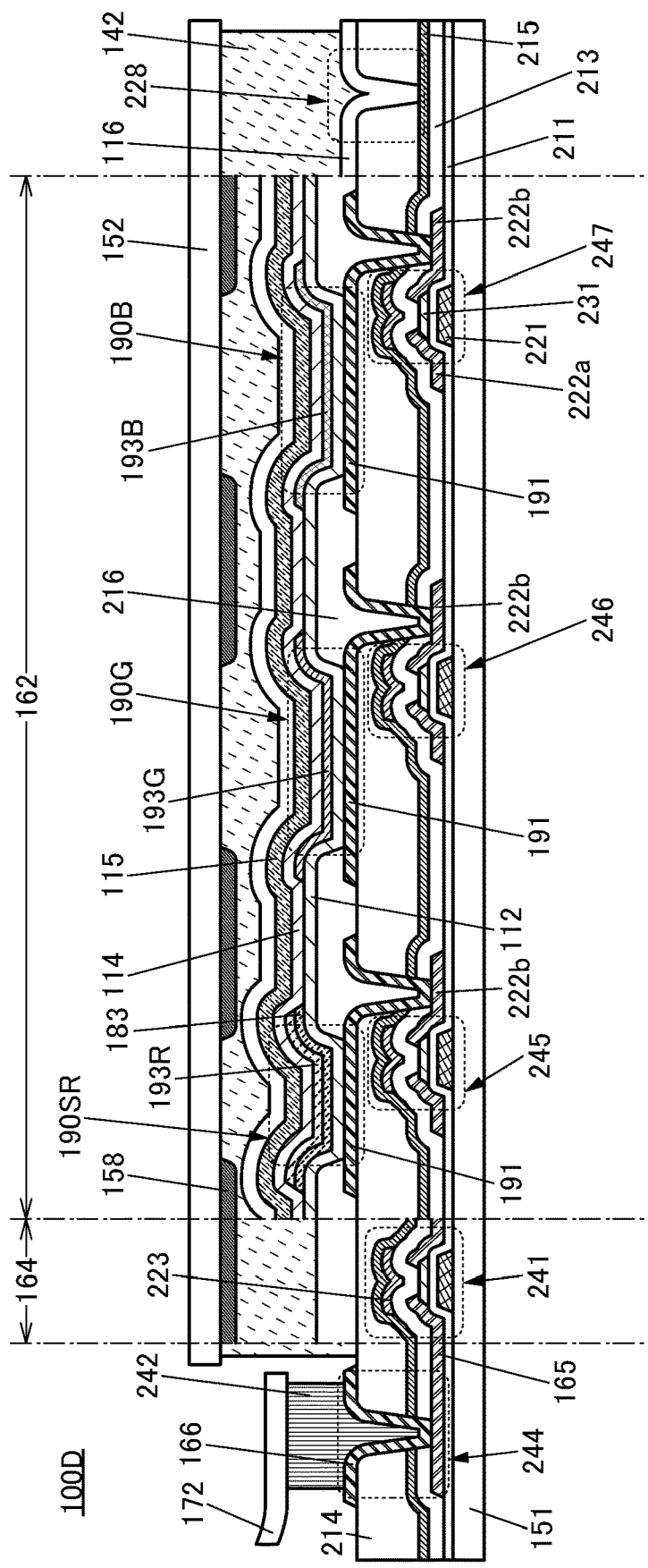
FIG. 15 is a cross-sectional view showing an example of a display apparatus.

FIG. 14 shows a perspective view of a display apparatus 100D, and FIG. 15 shows a cross-sectional view of the display apparatus 100D.

The display apparatus 100D has a structure in which the substrate 152 and the substrate 151 are bonded to each other. In FIG. 14, the substrate 152 is denoted by a dashed line.

The display apparatus 100D includes a display portion 162, a circuit 164, a wiring 165, and the like. FIG. 14 shows an example in which the display apparatus 100D is provided with an IC (integrated circuit) 173 and an FPC 172. Thus, the structure shown in FIG. 14 can be regarded as a display module including the display apparatus 100D, the IC, and the FPC.

As the circuit 164, for example, a scan line driver circuit can be used.

The wiring 165 has a function of supplying a signal and power to the display portion 162 and the circuit 164. The signal and power are input to the wiring 165 from the outside through the FPC 172 or input to the wiring 165 from the IC 173.

FIG. 14 shows an example in which the IC 173 is provided over the substrate 151 by a COG (Chip On Glass) method, a COF (Chip on Film) method, or the like. An IC including a scan line driver circuit, a signal line driver circuit, or the like can be used as the IC 173, for example. Note that the display apparatus 100D and the display module may have a structure that is not provided with an IC. The IC may be provided over the FPC by a COF method or the like.

FIG. 15 shows an example of cross sections of part of a region including the FPC 172, part of a region including the circuit 164, part of a region including the display portion 162, and part of a region including an end portion of the display apparatus 100D shown in FIG. 14.

The display apparatus 100D shown in FIG. 15 includes a transistor 241, a transistor 245, a transistor 246, a transistor 247, the light-emitting element 190B, the light-emitting element 190G, the light-emitting and light-receiving element 190SR, and the like between the substrate 151 and the substrate 152.

The substrate 152 and the protective layer 116 are bonded to each other with the adhesive layer 142. A solid sealing structure, a hollow sealing structure, or the like can be employed to seal the light-emitting element 190B, the light-emitting element 190G, the light-emitting and light-receiving element 190SR. In FIG. 15, a space surrounded by the substrate 152, the adhesive layer 142, and the insulating layer 214 is sealed with the adhesive layer 142, and the solid sealing structure is employed.

The light-emitting element 190B has a stacked-layer structure in which the pixel electrode 191, the common layer 112, the light-emitting layer 193B, the common layer 114, and the common electrode 115 are stacked in this order from the insulating layer 214 side. The pixel electrode 191 is connected to a conductive layer 222b included in the transistor 247 through an opening provided in the insulating layer 214. The transistor 247 has a function of controlling the driving of the light-emitting element 190B. The end portion of the pixel electrode 191 is covered with the partition 216. The pixel electrode 191 contains a material that reflects visible light, and the common electrode 115 contains a material that transmits visible light.

The light-emitting element 190G has a stacked-layer structure in which the pixel electrode 191, the common layer 112, the light-emitting layer 193G, the common layer 114, and the common electrode 115 are stacked in this order from the insulating layer 214 side. The pixel electrode 191 is connected to the conductive layer 222b included in the transistor 246 through an opening provided in the insulating layer 214. The transistor 246 has a function of controlling the driving of the light-emitting element 190G.

The light-emitting and light-receiving element 190SR has a stacked-layer structure in which the pixel electrode 191, the common layer 112, the active layer 183, the light-emitting layer 193R, the common layer 114, and the common electrode 115 are stacked in this order from the insulating layer 214 side. The pixel electrode 191 is electrically connected to the conductive layer 222b included in the transistor 245 through an opening provided in the insulating layer 214. The transistor 245 has a function of controlling the driving of the light-emitting and light-receiving element 190SR.

Light emitted from the light-emitting element 190B, the light-emitting element 190G, and the light-emitting and light-receiving element 190SR is emitted toward the substrate 152 side. Light enters the light-emitting and light-receiving element 190SR through the substrate 152 and the adhesive layer 142. For the substrate 152 and the adhesive layer 142, a material having a high visible-light-transmitting property is preferably used.

The pixel electrodes 191 included in the light-emitting element 190B, the light-emitting element 190G, and the light-emitting and light-receiving element 190SR can be formed using the same material through the same step. The common layer 112, the common layer 114, and the common electrode 115 are used in common in the light-emitting element 190B, the light-emitting element 190G, and the light-emitting and light-receiving element 190SR. The light-emitting and light-receiving element 190SR has the structure of the red-light-emitting element to which the active layer 183 is added. The light-emitting element 190B, the light-emitting element 190G, and the light-emitting and light-receiving element 190SR can have a common structure except for the active layer 183 and the light-emitting layer 193 of each color. Thus, the display portion 162 of the display apparatus 100D can have a light-receiving function without a significant increase in the number of manufacturing steps.

The light shielding layer 158 is provided on the surface of the substrate 152 on the substrate 151 side. The light shielding layer 158 includes openings in positions overlapping with the light-emitting element 190B, the light-emitting element 190G, and the light-emitting and light-receiving element 190SR. Providing the light shielding layer 158 can control the range where the light-emitting and light-receiving element 190SR detects light. As described above, it is preferable to control light entering the light-emitting and light-receiving element by adjusting the position of the opening of the light shielding layer provided in a position overlapping with the light-emitting and light-receiving element 190SR. Furthermore, with the light shielding layer 158, light can be inhibited from directly entering the light-emitting and light-receiving element 190SR from the light-emitting element 190 without through an object. Hence, a sensor with less noise and high sensitivity can be obtained.

The transistor 241, the transistor 245, the transistor 246, and the transistor 247 are formed over the substrate 151. These transistors can be formed using the same materials in the same steps.

An insulating layer 211, an insulating layer 213, an insulating layer 215, and the insulating layer 214 are provided in this order over the substrate 151. Parts of the insulating layer 211 function as gate insulating layers of the transistors. Parts of the insulating layer 213 function as gate insulating layers of the transistors. The insulating layer 215 is provided to cover the transistors. The insulating layer 214 is provided to cover the transistors and has a function of a planarization layer. Note that there is no limitation on the number of gate insulating layers and the number of insulating layers covering the transistors, and each insulating layer may have either a single layer or two or more layers.

A material into which impurities such as water and hydrogen do not easily diffuse is preferably used for at least one of the insulating layers that cover the transistors. This allows the insulating layer to serve as a barrier layer. Such a structure can effectively inhibit diffusion of impurities into the transistors from the outside and increase the reliability of the display apparatus.

An inorganic insulating film is preferably used as each of the insulating layer 211, the insulating layer 213, and the insulating layer 215. As the inorganic insulating film, an inorganic insulating film such as a silicon nitride film, a silicon oxynitride film, a silicon oxide film, a silicon nitride oxide film, an aluminum oxide film, or an aluminum nitride film can be used, for example. A hafnium oxide film, a hafnium oxynitride film, a hafnium nitride oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used. Note that a base film may be provided between the substrate 151 and the transistors. Any of the above-described inorganic insulating films can be used as the base film.

Here, an organic insulating film often has a lower barrier property than an inorganic insulating film. Therefore, the organic insulating film preferably has an opening in the vicinity of an end portion of the display apparatus 100D. This can inhibit entry of impurities from the end portion of the display apparatus 100D through the organic insulating film. Alternatively, the organic insulating film may be formed so that an end portion of the organic insulating film is positioned on the inner side compared to the end portion of the display apparatus 100D, to prevent the organic insulating film from being exposed at the end portion of the display apparatus 100D.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

By provision of the protective layer 116 that covers the light-emitting element 190B, the light-emitting element 190G, and the light-emitting and light-receiving element 190SR, impurities such as water can be inhibited from entering the light-emitting element 190B, the light-emitting element 190G, and the light-emitting and light-receiving element 190SR, leading to an increase in the reliability of the light-emitting element 190B, the light-emitting element 190G, and the light-emitting and light-receiving element 190SR.

In a region 228 shown in FIG. 15, an opening is formed in the insulating layer 214. This can inhibit entry of impurities into the display portion 162 from the outside through the insulating layer 214 even when an organic insulating film is used as the insulating layer 214. Thus, the reliability of the display apparatus 100D can be increased.

In the region 228 in the vicinity of an end portion of the display apparatus 100D, the insulating layer 215 and the protective layer 116 are preferably in contact with each other through the opening in the insulating layer 214. In particular, the inorganic insulating film included in the insulating layer 215 and the inorganic insulating film included in the protective layer 116 are preferably in contact with each other. Thus, entry of impurities from the outside into the display portion 162 through the organic insulating film can be inhibited. Thus, the reliability of the display apparatus 100D can be increased.

The protective layer 116 may have a single-layer structure or a stacked-layer structure. For example, the protective layer 116 may have a stacked-layer structure of an organic insulating film and an inorganic insulating film. In that case, an end portion of the inorganic insulating film preferably extends beyond an end portion of the organic insulating film.

Each of the transistor 241, the transistor 245, the transistor 246, and the transistor 247 includes a conductive layer 221 functioning as a gate, the insulating layer 211 functioning as the gate insulating layer, a conductive layer 222a and the conductive layer 222b functioning as a source and a drain, a semiconductor layer 231, the insulating layer 213 functioning as the gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display apparatus of this embodiment. For example, a planar transistor, a staggered transistor, or an inverted staggered transistor can be used. A top-gate or a bottom-gate transistor structure may be employed. Alternatively, gates may be provided above and below a semiconductor layer in which a channel is formed.

The structure in which the semiconductor layer where a channel is formed is provided between two gates is used for the transistor 241, the transistor 245, the transistor 246, and the transistor 247. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. A single crystal semiconductor or a semiconductor having crystallinity is preferably used, in which case deterioration of the transistor characteristics can be inhibited.

A semiconductor layer of a transistor preferably includes a metal oxide (also referred to as an oxide semiconductor). Alternatively, the semiconductor layer of the transistor may include silicon. Examples of silicon include amorphous silicon and crystalline silicon (e.g., low-temperature polysilicon or single crystal silicon).

The semiconductor layer preferably includes indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

The transistor included in the circuit 164 and the transistor included in the display portion 162 may have the same structure or different structures. A plurality of transistors included in the circuit 164 may have the same structure or two or more kinds of structures. Similarly, a plurality of transistors included in the display portion 162 may have the same structure or two or more kinds of structures.

A connection portion 244 is provided in a region of the substrate 151 that does not overlap with the substrate 152. In the connection portion 244, the wiring 165 is electrically connected to the FPC 172 via a conductive layer 166 and a connection layer 242. On the top surface of the connection portion 244, the conductive layer 166 obtained by processing the same conductive film as the pixel electrode 191 is exposed. Thus, the connection portion 244 and the FPC 172 can be electrically connected to each other through the connection layer 242.

A variety of optical members can be arranged on an outer surface of the substrate 152. Examples of the optical members include a polarizing plate, a retardation plate, a light diffusion layer (a diffusion film or the like), an anti-reflective layer, and a light-condensing film. Furthermore, an antistatic film inhibiting the attachment of dust, a water repellent film suppressing the attachment of stain, a hard coat film inhibiting generation of a scratch caused by the use, a shock absorbing layer, or the like may be provided on the outer surface of the substrate 152.

For each of the substrate 151 and the substrate 152, glass, quartz, ceramic, sapphire, resin, or the like can be used. When a flexible material is used for the substrate 151 and the substrate 152, the flexibility of the display apparatus can be increased.

For the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

As the connection layer, an anisotropic conductive film (ACF), an anisotropic conductive paste (ACP), or the like can be used.

For the structures, materials, and the like of the light-emitting elements 190G and 190B and the light-emitting and light-receiving element 190SR, the above description can be referred to.

As materials that can be used for a gate, a source, and a drain of a transistor and conductive layers such as a variety of wirings and electrodes included in a display apparatus, metals such as aluminum, titanium, chromium, nickel, copper, yttrium, zirconium, molybdenum, silver, tantalum, or tungsten, an alloy containing any of these metals as its main component, and the like can be given. A film containing any of these materials can be used in a single layer or as a stacked-layer structure.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), the thickness is preferably set small enough to be able to transmit light. A stacked-layer film of any of the above materials can be used as a conductive layer. For example, a stacked-layer film of indium tin oxide and an alloy of silver and magnesium, or the like is preferably used for increased conductivity. These materials can also be used for conductive layers such as a variety of wirings and electrodes that constitute a display apparatus, and conductive layers (conductive layers functioning as a pixel electrode or a common electrode) included in a light-emitting element and a light-receiving element (or a light-emitting and light-receiving element).

As an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given.

[Display Apparatus 100E]

Figure 16:
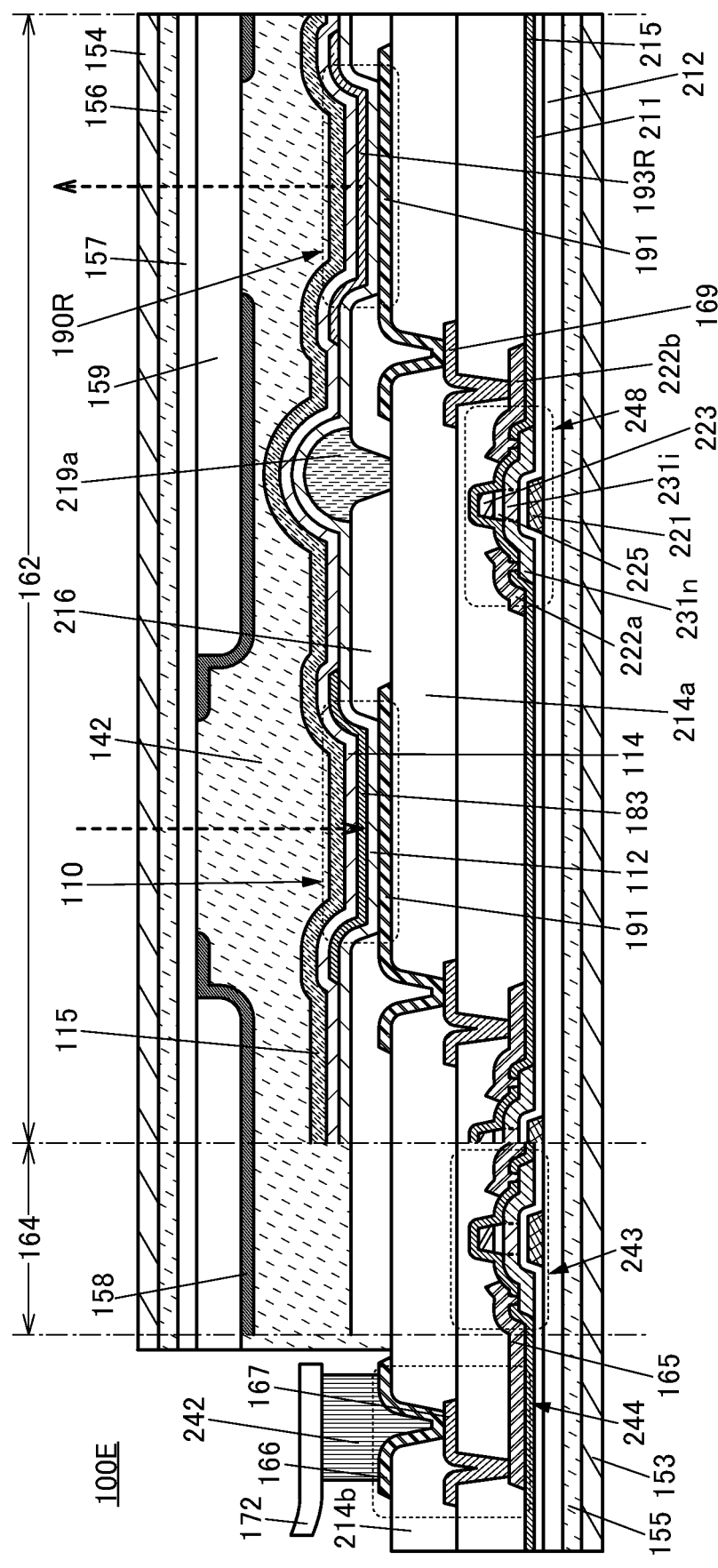
FIG. 16 is a cross-sectional view showing an example of a display apparatus.

FIG. 16 and FIG. 17A show cross-sectional views of a display apparatus 100E. A perspective view of the display apparatus 100E is similar to that of the display apparatus 100D (FIG. 14). FIG. 16 shows an example of cross sections of part of a region including the FPC 172, part of the circuit 164, and part of the display portion 162 in the display apparatus 100E. FIG. 17A shows an example of a cross section of part of the display portion 162 in the display apparatus 100E. FIG. 16 specifically shows an example of a cross section of a region including the light-receiving element 110 and the light-emitting element 190R that emits red light in the display portion 162. FIG. 17A specifically shows an example of a cross section of a region including the light-emitting element 190G that emits green light and the light-emitting element 190B that emits blue light in the display portion 162.

The display apparatus 100E shown in FIG. 16 and FIG. 17A includes a transistor 243, a transistor 248, a transistor 249, a transistor 240, the light-emitting element 190R, the light-emitting element 190G, the light-emitting element 190B, the light-receiving element 110, and the like between a substrate 153 and a substrate 154.

The resin layer 159 and the common electrode 115 are bonded to each other with the adhesive layer 142, and the display apparatus 100E employs a solid sealing structure.

The substrate 153 and the insulating layer 212 are bonded to each other with an adhesive layer 155. The substrate 154 and an insulating layer 157 are bonded to each other with an adhesive layer 156.

To fabricate the display apparatus 100E, first, a first formation substrate provided with the insulating layer 212, the transistors, the light-receiving element 110, the light-emitting elements, and the like and a second formation substrate provided with the insulating layer 157, the resin layer 159, the light shielding layer 158, and the like are bonded to each other with the adhesive layer 142. Then, the substrate 153 is bonded to a surface exposed by separation of the first formation substrate, and the substrate 154 is bonded to a surface exposed by separation of the second formation substrate, whereby the components formed over the first formation substrate and the second formation substrate are transferred to the substrate 153 and the substrate 154. The substrate 153 and the substrate 154 preferably have flexibility. Accordingly, the flexibility of the display apparatus 100E can be increased.

The inorganic insulating film that can be used as the insulating layer 211, the insulating layer 213, and the insulating layer 215 can be used as the insulating layer 212 and the insulating layer 157.

The light-emitting element 190R has a stacked-layer structure in which the pixel electrode 191, the common layer 112, the light-emitting layer 193R, the common layer 114, and the common electrode 115 are stacked in this order from an insulating layer 214b side. The pixel electrode 191 is connected to a conductive layer 169 through an opening provided in the insulating layer 214b. The conductive layer 169 is connected to the conductive layer 222b included in the transistor 248 through an opening provided in an insulating layer 214a. The conductive layer 222b is connected to a low-resistance region 231n through an opening provided in the insulating layer 215. That is, the pixel electrode 191 is electrically connected to the transistor 248. The transistor 248 has a function of controlling the driving of the light-emitting element 190R.

Similarly, the light-emitting element 190G has a stacked-layer structure in which the pixel electrode 191, the common layer 112, the light-emitting layer 193G, the common layer 114, and the common electrode 115 are stacked in this order from the insulating layer 214b side. The pixel electrode 191 is electrically connected to the low-resistance region 231n of the transistor 249 through the conductive layer 169 and the conductive layer 222b of the transistor 249. That is, the pixel electrode 191 is electrically connected to the transistor 249. The transistor 249 has a function of controlling the driving of the light-emitting element 190G.

In addition, the light-emitting element 190B has a stacked-layer structure in which the pixel electrode 191, the common layer 112, the light-emitting layer 193B, the common layer 114, and the common electrode 115 are stacked in this order from the insulating layer 214b side. The pixel electrode 191 is electrically connected to the low-resistance region 231n of the transistor 240 through the conductive layer 169 and the conductive layer 222b of the transistor 240. That is, the pixel electrode 191 is electrically connected to the transistor 240. The transistor 240 has a function of controlling the driving of the light-emitting element 190B.

The light-receiving element 110 has a stacked-layer structure in which the pixel electrode 191, the common layer 112, the active layer 183, the common layer 114, and the common electrode 115 are stacked in this order from the insulating layer 214b side.

The end portion of the pixel electrode 191 is covered with the partition 216. The pixel electrode 191 contains a material that reflects visible light, and the common electrode 115 contains a material that transmits visible light.

Light emitted from the light-emitting elements 190R, 190G, and 190B is emitted toward the substrate 154 side. Light enters the light-receiving element 110 through the substrate 154 and the adhesive layer 142. For the substrate 154, a material having a high visible-light-transmitting property is preferably used.

The pixel electrodes 191 can be formed using the same material in the same step. The common layer 112, the common layer 114, and the common electrode 115 are used in common in the light-receiving element 110 and the light-emitting elements 190R, 190G, and 190B. The light-receiving element 110 and the light-emitting element of each color can have a common structure except for the active layer 183 and the light-emitting layer. Thus, the light-receiving element 110 can be incorporated into the display apparatus 100E without a significant increase in the number of manufacturing steps.

The resin layer 159 and the light shielding layer 158 are provided on a surface of the insulating layer 157 on the substrate 153 side. The resin layer 159 is provided in positions overlapping with the light-emitting elements 190R, 190G, and 190B and is not provided in a position overlapping with the light-receiving element 110. The light shielding layer 158 is provided to cover the surface of the insulating layer 157 on the substrate 153 side, a side surface of the resin layer 159, and a surface of the resin layer 159 on the substrate 153 side. The light shielding layer 158 has openings in a position overlapping with the light-receiving element 110 and in positions overlapping with the light-emitting elements 190R, 190G, and 190B. Providing the light shielding layer 158 can control the range where the light-receiving element 110 detects light. Furthermore, with the light shielding layer 158, light can be inhibited from directly entering the light-receiving element 110 from the light-emitting elements 190R, 190G, and 190B without through an object. Hence, a sensor with less noise and high sensitivity can be obtained. Providing the resin layer 159 allows the distance from the light shielding layer 158 to the light-emitting element of each color to be shorter than the distance from the light shielding layer 158 to the light-receiving element 110. Accordingly, viewing angle dependence of display can be inhibited while noise of the sensor is reduced. Thus, both the display quality and imaging quality can be increased.

As shown in FIG. 16, the partition 216 has an opening between the light-receiving element 110 and the light-emitting element 190R. A light shielding layer 219a is provided to fill the opening. The light shielding layer 219a is positioned between the light-receiving element 110 and the light-emitting element 190R. The light shielding layer 219a absorbs light emitted from the light-emitting element 190R. This can inhibit stray light from entering the light-receiving element 110.

A spacer 219b is provided over the partition 216 and positioned between the light-emitting element 190G and the light-emitting element 190B. A top surface of the spacer 219b is preferably closer to the light shielding layer 158 than a top surface of the light shielding layer 219a is. For example, the sum of the height (thickness) of the partition 216 and the height (thickness) of the spacer 219b is preferably larger than the height (thickness) of the light shielding layer 219a. Thus, filling with the adhesive layer 142 can be facilitated. As shown in FIG. 17A, the light shielding layer 158 may be in contact with the common electrode 115 (or the protective layer) in a portion where the spacer 219b and the light shielding layer 158 overlap with each other.

The connection portion 244 is provided in a region of the substrate 153 that does not overlap with the substrate 154. In the connection portion 244, the wiring 165 is electrically connected to the FPC 172 through a conductive layer 167, the conductive layer 166, and the connection layer 242. The conductive layer 167 can be obtained by processing the same conductive film as the conductive layer 169. On the top surface of the connection portion 244, the conductive layer 166 obtained by processing the same conductive film as the pixel electrode 191 is exposed. Thus, the connection portion 244 and the FPC 172 can be electrically connected to each other through the connection layer 242.

Each of the transistor 243, the transistor 248, the transistor 249, and the transistor 240 includes the conductive layer 221 functioning as a gate, the insulating layer 211 functioning as a gate insulating layer, a semiconductor layer including a channel formation region 231i and a pair of low-resistance regions 231n, the conductive layer 222a connected to one of the pair of low-resistance regions 231n, the conductive layer 222b connected to the other of the pair of low-resistance regions 231n, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231i. The insulating layer 225 is positioned between the conductive layer 223 and the channel formation region 231i.

The conductive layer 222a and the conductive layer 222b are connected to the corresponding low-resistance regions 231n through openings provided in the insulating layer 215. One of the conductive layer 222a and the conductive layer 222b functions as a source, and the other functions as a drain.

In FIG. 16 and FIG. 17A, the insulating layer 225 overlaps with the channel formation region 231i of the semiconductor layer 231 and does not overlap with the low-resistance regions 231n. The structure shown in FIG. 16 and FIG. 17A can be obtained by processing the insulating layer 225 with the conductive layer 223 as a mask, for example. In FIG. 16 and FIG. 17A, the insulating layer 215 is provided to cover the insulating layer 225 and the conductive layer 223, and the conductive layer 222a and the conductive layer 222b are connected to the low-resistance regions 231n through the openings in the insulating layer 215. Furthermore, an insulating layer covering the transistor may be provided.

Meanwhile, FIG. 17B shows an example in which the insulating layer 225 covers a top surface and a side surface of the semiconductor layer. The conductive layer 222a and the conductive layer 222b are connected to the corresponding low-resistance regions 231n through openings provided in the insulating layer 225 and the insulating layer 215.

As described above, in the display apparatus of one embodiment of the present invention, the distances between the two light-emitting elements and the light-receiving element (or the light-emitting and light-receiving element) differ from each other, and the distances from the two light-emitting elements to the opening of the light shielding layer overlapping with the light-receiving element (or the light-emitting and light-receiving element) differ from each other. With this structure, the light-receiving element or the light-emitting and light-receiving element can receive light coming from one of the two light-emitting elements more than light coming from the other. Accordingly, much light coming from the light-emitting element used as a light source can be made to enter the light-receiving element or the light-emitting and light-receiving element in the display apparatus of one embodiment of the present invention, for example.

This embodiment can be combined with the other embodiments as appropriate.

Embodiment 3

In this embodiment, a metal oxide that can be used in the OS transistor described in the above embodiment is described.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a chemical vapor deposition (CVD) method such as a metal organic chemical vapor deposition (MOCVD) method, an atomic layer deposition (ALD) method, or the like.

<Classification of Crystal Structure>

Amorphous (including a completely amorphous structure), CAAC (c-axis-aligned crystalline), nc (nanocrystalline), CAC (cloud-aligned composite), single-crystal, and polycrystalline (poly crystal) structures can be given as examples of a crystal structure of an oxide semiconductor.

Note that a crystal structure of a film or a substrate can be evaluated with an X-ray diffraction (XRD) spectrum. For example, evaluation is possible using an XRD spectrum which is obtained by GIXD (Grazing-Incidence XRD) measurement. Note that a GIXD method is also referred to as a thin film method or a Seemann-Bohlin method.

For example, the XRD spectrum of the quartz glass substrate shows a peak with a substantially bilaterally symmetrical shape. On the other hand, the peak of the XRD spectrum of the IGZO film having a crystal structure has a bilaterally asymmetrical shape. The asymmetrical peak of the XRD spectrum clearly shows the existence of crystal in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film deposited at room temperature. Thus, it is suggested that the IGZO film deposited at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from the above-described one when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a stacked-layer structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution transmission electron microscope (TEM) image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using $\theta/2\theta$ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-like OS]

The a-like OS is an oxide semiconductor having a structure between those of the nc-OS and the amorphous oxide semiconductor. The a-like OS contains a void or a low-density region. That is, the a-like OS has low crystallinity as compared with the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly dispersed to form a mosaic pattern. Thus, it is suggested that the CAC-OS has a structure in which metal elements are unevenly distributed.

The CAC-OS can be formed by a sputtering method under a condition where a substrate is not heated, for example. Moreover, in the case of forming the CAC-OS by a sputtering method, any one or more selected from an inert gas (typically, argon), an oxygen gas, and a nitrogen gas are used as a deposition gas. The flow rate of the oxygen gas to the total flow rate of the deposition gas in deposition is preferably as low as possible, for example, the flow rate of the oxygen gas to the total flow rate of the deposition gas in deposition is higher than or equal to 0% and lower than 30%, preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide as a cloud, high field-effect mobility ($\mu$) can be achieved.

The second region has a higher insulating property than the first region. In other words, when the second regions are distributed in a metal oxide, leakage current can be inhibited.

Thus, in the case where a CAC-OS is used for a transistor, by the complementary function of the conducting function due to the first region and the insulating function due to the second region, the CAC-OS can have a switching function (on/off function). A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility (4 and excellent switching operation can be achieved.

A transistor using a CAC-OS has high reliability. Thus, the CAC-OS is most suitable for a variety of semiconductor devices such as display apparatuses.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

This embodiment can be combined with the other embodiments as appropriate.

Embodiment 4

In this embodiment, electronic devices of embodiments of the present invention will be described with reference to FIG. 18 to FIG. 20.

An electronic device of one embodiment of the present invention can perform image capturing or detect touch operation (touch or approach) in a display portion. Thus, the electronic device can have improved functionality and convenience, for example.

Examples of the electronic devices of one embodiment of the present invention include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device of one embodiment of the present invention may include a sensor (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 18A:
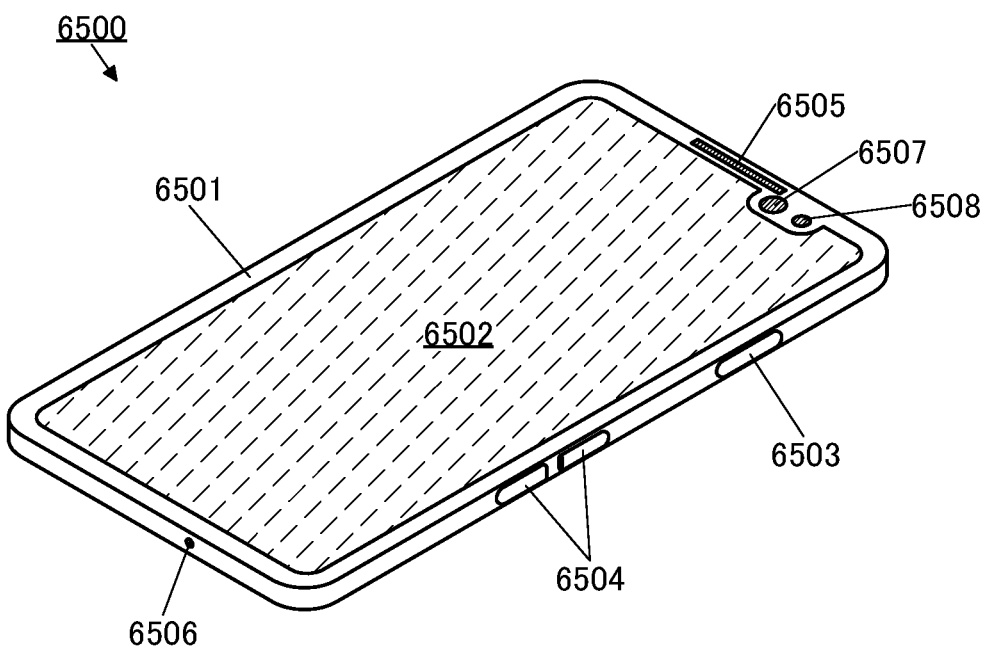
FIG. 18A and FIG. 18B are diagrams showing an example of an electronic device.

An electronic device 6500 shown in FIG. 18A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus described in Embodiment 2 can be used in the display portion 6502.

Figure 18B:
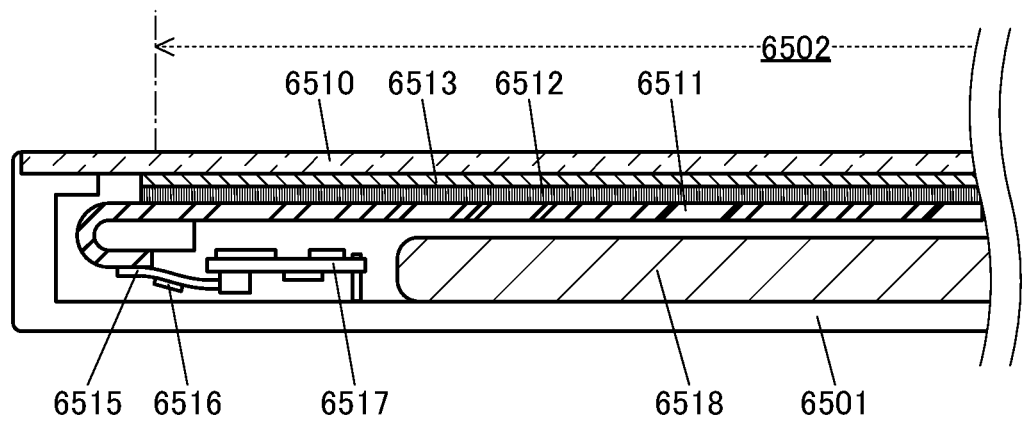

FIG. 18B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not shown).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be provided. Since the display panel 6511 is extremely thin, the battery 6518 with high capacity can be mounted with the thickness of the electronic device controlled. An electronic device with a narrow frame can be obtained when part of the display panel 6511 is folded back so that the portion connected to the FPC 6515 is positioned on the rear side of a pixel portion.

Using the display apparatus described in Embodiment 2 as the display panel 6511 allows image capturing on the display portion 6502. For example, an image of a fingerprint is captured by the display panel 6511; thus, fingerprint identification can be performed.

By further including the touch sensor panel 6513, the display portion 6502 can have a touch panel function. A variety of types such as a capacitive type, a resistive type, a surface acoustic wave type, an infrared type, an optical type, and a pressure-sensitive type can be used for the touch sensor panel 6513. Alternatively, the display panel 6511 may function as a touch sensor; in such a case, the touch sensor panel 6513 is not necessarily provided.

Figure 19A:
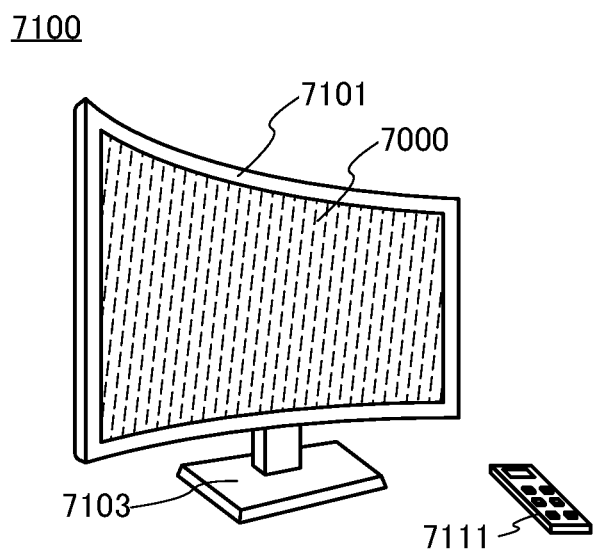
FIG. 19A to FIG. 19D are diagrams showing examples of an electronic device.

FIG. 19A shows an example of a television device. In a television device 7100, a display portion 7000 is incorporated in a housing 7101. Here, a structure in which the housing 7101 is supported by a stand 7103 is shown.

The display apparatus described in Embodiment 2 can be used in the display portion 7000.

Operation of the television device 7100 shown in FIG. 19A can be performed with an operation switch provided in the housing 7101 or a separate remote controller 7111. Alternatively, the display portion 7000 may include a touch sensor, and the television device 7100 may be operated by touch on the display portion 7000 with a finger or the like. The remote controller 7111 may be provided with a display portion for displaying data output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 19B:
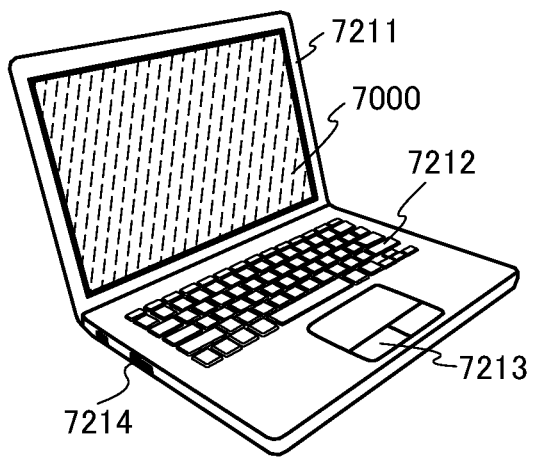

FIG. 19B shows an example of a laptop personal computer. A laptop personal computer 7200 includes a housing 7211, a keyboard 7212, a pointing device 7213, an external connection port 7214, and the like. In the housing 7211, the display portion 7000 is incorporated.

The display apparatus described in Embodiment 2 can be used in the display portion 7000.

Figure 19C:
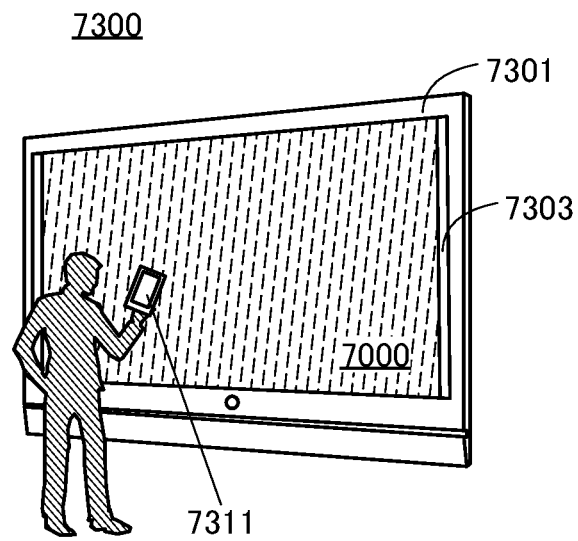
Figure 19D:
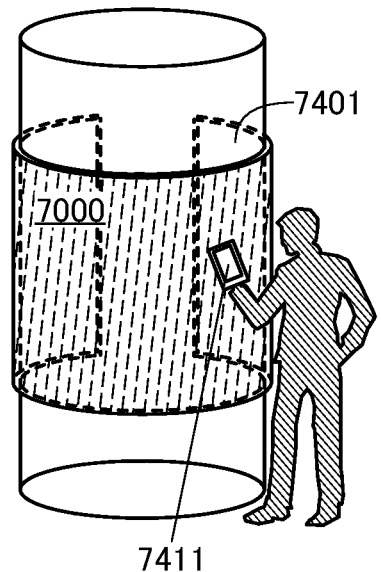

FIG. 19C and FIG. 19D show examples of digital signage.

Digital signage 7300 shown in FIG. 19C includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 19D is digital signage 7400 attached to a cylindrical pillar 7401. The digital signage 7400 includes the display portion 7000 provided along a curved surface of the pillar 7401.

The display apparatus described in Embodiment 2 can be used for the display portion 7000 in FIG. 19C and FIG. 19D.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As shown in FIG. 19C and FIG. 19D, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices shown in FIG. 20A to FIG. 20F include a housing 9000, a display portion 9001, a speaker 9003, an operation key 9005 (including a power switch or an operation switch), a connection terminal 9006, a sensor 9007 (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices shown in FIG. 20A to FIG. 20F have a variety of functions. For example, the electronic devices can have a function of displaying a variety of data (a still image, a moving image, a text image, and the like) on the display portion, a touch panel function, a function of displaying a calendar, date, time, and the like, a function of controlling processing with use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each include a camera or the like and have a function of taking a still image or a moving image and storing the taken image in a recording medium (an external recording medium or a recording medium incorporated in the camera), a function of displaying the taken image on the display portion, or the like.

The details of the electronic devices shown in FIG. 20A to FIG. 20F are described below.

Figure 20A:
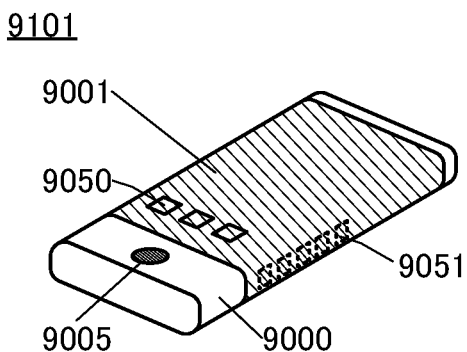
FIG. 20A to FIG. 20F are diagrams showing examples of an electronic device.

FIG. 20A is a perspective view showing a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display characters and image information on its plurality of surfaces. FIG. 20A shows an example where three icons 9050 are displayed. Information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in the position where the information 9051 is displayed.

Figure 20B:
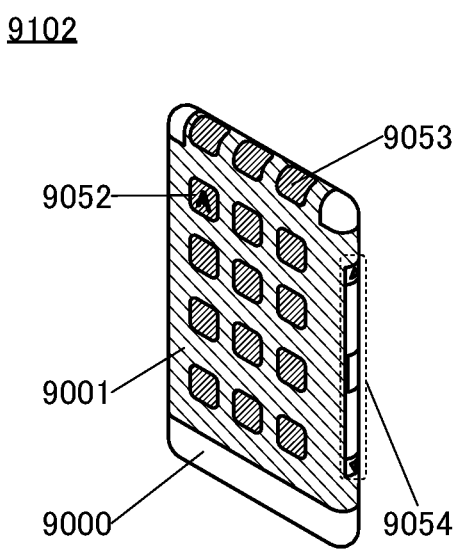

FIG. 20B is a perspective view showing a portable information terminal 9102. The portable information terminal 9102 has a function of displaying information on three or more surfaces of the display portion 9001. Here, an example in which information 9052, information 9053, and information 9054 are displayed on different surfaces is shown. For example, a user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call, for example.

Figure 20C:
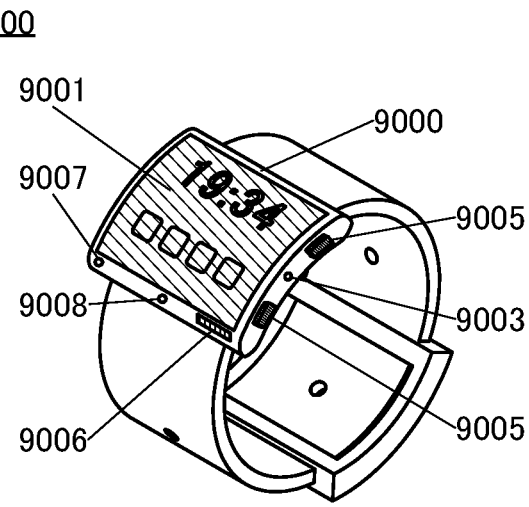

FIG. 20C is a perspective view showing a watch-type portable information terminal 9200. The display surface of the display portion 9001 is curved and provided, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 20D:
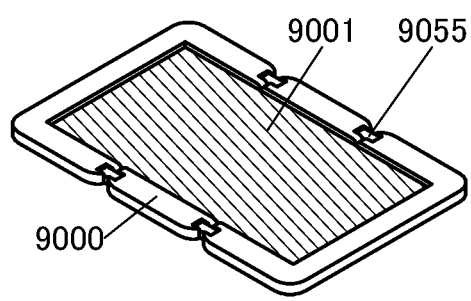
Figure 20E:
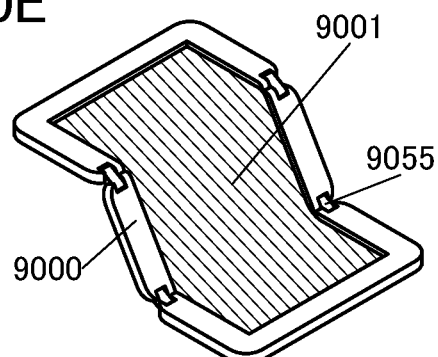
Figure 20F:
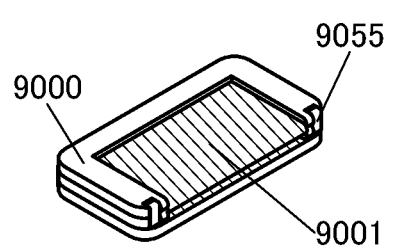

FIG. 20D to FIG. 20F are perspective views showing a foldable portable information terminal 9201. FIG. 20D is a perspective view of an opened state of the portable information terminal 9201, FIG. 20F is a perspective view of a folded state thereof, and FIG. 20E is a perspective view of a state in the middle of change from one of FIG. 20D and FIG. 20F to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature greater than or equal to 0.1 mm and less than or equal to 150 mm.

This embodiment can be combined with the other embodiments as appropriate.

REFERENCE NUMERALS

AZFB1: wiring, AZFB2: wiring, AZIN1: wiring, AZIN1B: wiring, AZIN2: wiring, AZIN2B: wiring, AZINB1: wiring, AZINB2: wiring, C1: capacitor, C2: capacitor, C3: capacitor, C4: capacitor, Cin1: capacitor, Cin2: capacitor, Cin3: capacitor, COM1: wiring, COM2: wiring, COM3: wiring, IM1: input terminal, IM2: input terminal, IP1: input terminal, IP2: input terminal, L1: shortest distance, L2: shortest distance, M1 to M11: transistor, ND1: node, ND1a: node, ND2: node, ND2a: node, ND3: node, OUT1: wiring, OUT2: wiring, SP1: signal, SP2: signal, SW1 to SW5: switch, T10 to T16: time, TB1: period, TB2: period, V1 to V5: wiring, Vb1: wiring, Vb2: wiring, VBN1: wiring, VBN2: wiring, VBP1: wiring, VBP2: wiring, VCOM1 to VCOM3: potential, VDD1: wiring, VDD2: wiring, 1: input/output terminal, 2: input/output terminal, 3: input terminal, 3a: input/output terminal, 4a: input/output terminal, 5a: control terminal, 5A: OS transistor, 6a: control terminal, 10: display module, 11: source driver, 12: gate driver, 13: gate driver, 20: pixel region, 30: pixel, 30a: pixel, 30b: pixel, 31: subpixel, 31B: subpixel, 31G: subpixel, 31R: subpixel, 31W: subpixel, 31X: subpixel, 32: subpixel, 40: circuit, 41: CDS circuit, 42: noise removal circuit, 43: counter circuit, 44: latch circuit, 51 to 55: transistor, 56: comparison circuit, 57: buffer circuit, 58: analog switch, 59: inverter circuit, 70: amplifier circuit, 71 to 7k: transistor, 80: level shifter circuit, 81 to 8a: transistor, 100: display apparatus, 100A to 100E: display apparatus, 110: light-receiving element, 112: common layer, 114: common layer, 115: common electrode, 116: protective layer, 121: light emission, 121B: light, 121G: light, 121R: light, 122: light, 123: light, 123a: stray light, 123b: stray light, 124: reflected light, 131: transistor, 132: transistor, 142: adhesive layer, 151: substrate, 152: substrate, 153: substrate, 154: substrate, 155: adhesive layer, 156: adhesive layer, 157: insulating layer, 158: light shielding layer, 159: resin layer, 159p: opening, 162: display portion, 164: circuit, 165: wiring, 166: conductive layer, 167: conductive layer, 169: conductive layer, 172: FPC, 173: IC, 182: buffer layer, 183: active layer, 184: buffer layer, 190: light-emitting element, 190B: light-emitting element, 190G: light-emitting element, 190R: light-emitting and light-receiving element, 190R: light-emitting element, 191: pixel electrode, 192: buffer layer, 192B: buffer layer, 192G: buffer layer, 192R: buffer layer, 193: light-emitting layer, 193B: light-emitting layer, 193G: light-emitting layer, 193R: light-emitting layer, 194: buffer layer, 194B: buffer layer, 194G: buffer layer, 194R: buffer layer, 200A: display apparatus, 200B: display apparatus, 201: substrate, 202: finger, 203: layer, 204: layer, 205: functional layer, 207: layer, 208: stylus, 209: substrate, 211: insulating layer, 212: insulating layer, 213: insulating layer, 214: insulating layer, 214a: insulating layer, 214b: insulating layer, 215: insulating layer, 216: partition, 219a: light shielding layer, 219b: spacer, 221: conductive layer, 222a: conductive layer, 222b: conductive layer, 223: conductive layer, 225: insulating layer, 228: region, 231: semiconductor layer, 231i: channel formation region, 231n: low-resistance region, 240: transistor, 241: transistor, 242: connection layer, 243: transistor, 244: connection portion, 245: transistor, 246: transistor, 247: transistor, 248: transistor, 249: transistor, 261: contact portion, 262: fingerprint, 263: image-capturing range, 266: path, 270B: light-emitting element, 270G: light-emitting element, 270PD: light-receiving element, 270R: light-emitting and light-receiving element, 270R: light-emitting element, 271: pixel electrode, 273: active layer, 275: common electrode, 280A: display apparatus, 280B: display apparatus, 280C: display apparatus, 281: hole-injection layer, 282: hole-transport layer, 283: light-emitting layer, 283B: light-emitting layer, 283G: light-emitting layer, 283R: light-emitting layer, 284: electron-transport layer, 285: electron-injection layer

The invention claimed is:

1. A display module comprising a display apparatus and a reading circuit,
    wherein the display apparatus comprises a first pixel and a second pixel adjacent to each other,
    wherein each of the first pixel and the second pixel comprises a light-receiving element,
    wherein the reading circuit comprises a differential input circuit,
    wherein a ramp signal and a first potential are supplied to the reading circuit,
    wherein the differential input circuit is controlled so that a first current and a second current have the same current value,
    wherein the first current is generated using a first light-receiving signal and the ramp signal, and
    wherein the second current is generated using a second light-receiving signal and the first potential.

2. The display module according to claim 1,
    wherein the display apparatus comprises a transistor, and
    wherein the transistor comprises a metal oxide in a semiconductor layer.

3. The display module according to claim 2,
    wherein the transistor comprises a back gate.

4. The display module according to claim 1,
    wherein the display apparatus has flexibility.

5. An electronic device comprising the display module according to claim 1 and at least one of an antenna, a battery, a housing, a camera, a speaker, a microphone, and an operation button.

6. A display module comprising a display apparatus and a reading circuit,
    wherein the display apparatus comprises a first pixel and a second pixel adjacent to each other,
    wherein the first pixel comprises a first subpixel and a second subpixel,
    wherein the second pixel comprises a third subpixel and a fourth subpixel,
    wherein each of the first subpixel and the third subpixel comprises a light-receiving element,
    wherein each of the second subpixel and the fourth subpixel comprises a light-emitting element,
    wherein the reading circuit comprises a differential input circuit,
    wherein a ramp signal and a first potential are supplied to the reading circuit,
    wherein the differential input circuit is controlled so that a first current and a second current have the same current value,
    wherein the first current is generated using a first light-receiving signal and the ramp signal, and
    wherein the second current is generated using a second light-receiving signal and the first potential.

7. The display module according to claim 6,
    wherein the light-emitting element comprises a first pixel electrode, a first active layer, and a common electrode,
    wherein the first active layer comprises a first organic compound,
    wherein the light-receiving element comprises a second pixel electrode, a second active layer, and the common electrode, and
    wherein the second active layer comprises a second organic compound.

8. The display module according to claim 6,
    wherein the display apparatus comprises a transistor, and
    wherein the transistor comprises a metal oxide in a semiconductor layer.

9. The display module according to claim 8, wherein the transistor comprises a back gate.

10. The display module according to claim 6, wherein the display apparatus has flexibility.

11. An electronic device comprising the display module according to claim 6 and at least one of an antenna, a battery, a housing, a camera, a speaker, a microphone, and an operation button.

* * * * *